US010664562B2

(12) United States Patent
Balasingam et al.

(10) Patent No.: US 10,664,562 B2
(45) Date of Patent: May 26, 2020

(54) BATTERY STATE OF CHARGE TRACKING, EQUIVALENT CIRCUIT SELECTION AND BENCHMARKING

(71) Applicants: Fairchild Semiconductor Corporation, San Jose, CA (US); The University of Connecticut, Farmington, CT (US)

(72) Inventors: Balakumar Balasingam, Storrs, CT (US); Brian French, Portsmouth, NH (US); Yaakov Bar-Shalom, Mansfield, CT (US); Bharath Pattipati, Willimantic, CT (US); Krishna Pattipati, Storrs, CT (US); James Meacham, Gorham, ME (US); Travis Williams, Scarborough, ME (US); Gopi Vinod Avvari, Willimantic, CT (US); Tai-Sik Hwang, Portland, ME (US)

(73) Assignee: Fairchild Semiconductor Corporation and University of Connecticut, Pheonix, AZ (US)

( * ) Notice: Subject to any disclaimer, the term of this patent is extended or adjusted under 35 U.S.C. 154(b) by 951 days.

(21) Appl. No.: 14/185,835

(22) Filed: Feb. 20, 2014

(65) Prior Publication Data

US 2014/0244225 A1    Aug. 28, 2014

Related U.S. Application Data

(60) Provisional application No. 61/768,472, filed on Feb. 24, 2013.

(51) Int. Cl.
*G06F 7/60*    (2006.01)
*G06F 17/50*    (2006.01)
(Continued)

(52) U.S. Cl.
CPC ....... *G06F 17/5036* (2013.01); *G01R 31/367* (2019.01); *G01R 31/3835* (2019.01); *G01R 31/3842* (2019.01)

(58) Field of Classification Search
CPC ............ G06F 17/5036; G01R 31/3624; G01R 31/362; G01R 31/3651
(Continued)

(56) References Cited

U.S. PATENT DOCUMENTS 3,500,167 A * 3/1970 Dufendach ........... H01M 10/48
320/132
6,356,083 B1 * 3/2002 Ying .................. G01R 31/3828
324/426
(Continued)

FOREIGN PATENT DOCUMENTS

CN        1601295 A     3/2005
CN      101098029 A     1/2008
(Continued)

OTHER PUBLICATIONS

Yuan et al. ("State of Charge Estimation Using the Extended Kalman Filter for Battery Management Systems Based on the ARX Battery Model", Energies 2013, 6, pp. 444-470).*
(Continued)

*Primary Examiner* — Brian S Cook
*Assistant Examiner* — Iftekhar Khan
(74) *Attorney, Agent, or Firm* — Brake Hughes Bellerman LLP

(57) ABSTRACT

A method includes calculating a first estimated state of charge (SOC) of a battery at a first time, receiving a voltage value representing a measured voltage across the battery at a second time, calculating a filter gain at the second time, and calculating a second estimated SOC of the battery at the second time based on the first estimated SOC, the voltage
(Continued)

value, and the filter gain. Another method includes storing, in a memory, a library of equivalent circuit models representing a battery, determining an operational mode of a battery based on a load associated with the battery, selecting one of the equivalent circuit models based on the determined operational mode, and calculating a state of charge of charge (SOC) of the battery using the selected equivalent circuit model.

22 Claims, 19 Drawing Sheets

(51) Int. Cl.
    *G01R 31/367* (2019.01)
    *G01R 31/3835* (2019.01)
    *G01R 31/3842* (2019.01)

(58) Field of Classification Search
    USPC .................................................. 703/1
    See application file for complete search history.

(56) References Cited

U.S. PATENT DOCUMENTS

| | | | | |
|---|---|---|---|---|
| 6,388,447 B1* | 5/2002 | Hall | H02J 7/0047 | 324/426 |
| 6,441,586 B1* | 8/2002 | Tate, Jr. | G01R 31/3648 | 320/132 |
| 6,534,954 B1* | 3/2003 | Plett | G01R 31/367 | 320/132 |
| 6,646,419 B1* | 11/2003 | Ying | B60W 10/26 | 320/132 |
| 6,661,201 B2* | 12/2003 | Ueda | B60L 15/2045 | 320/132 |
| 6,943,528 B2* | 9/2005 | Schoch | G01R 31/3648 | 320/132 |
| 6,967,466 B2* | 11/2005 | Koch | G01R 31/3842 | 320/132 |
| 7,109,685 B2* | 9/2006 | Tate, Jr. | H01M 10/48 | 320/132 |
| 7,197,487 B2* | 3/2007 | Hansen | G01R 31/367 | 706/25 |
| 7,518,339 B2* | 4/2009 | Schoch | G01R 31/367 | 320/132 |
| 8,103,485 B2* | 1/2012 | Plett | H01M 10/48 | 703/2 |
| 8,321,137 B2* | 11/2012 | Tran | G06F 19/325 | 702/19 |
| 8,624,560 B2* | 1/2014 | Ungar | H01M 4/5815 | 320/132 |
| 8,855,954 B1* | 10/2014 | Bickford | G07C 3/08 | 702/63 |
| 8,909,490 B2* | 12/2014 | Umeki | G01R 31/3842 | 702/63 |
| 2002/0113593 A1 | 8/2002 | Meissner et al. | | |
| 2002/0120906 A1* | 8/2002 | Xia | G06F 17/50 | 716/111 |
| 2002/0130637 A1* | 9/2002 | Schoch | G01R 31/367 | 320/132 |
| 2002/0196026 A1* | 12/2002 | Kimura | G01R 31/3828 | 324/426 |
| 2004/0032264 A1* | 2/2004 | Schoch | G01R 31/3828 | 324/426 |
| 2004/0257045 A1* | 12/2004 | Sada | G01R 31/379 | 320/132 |
| 2005/0035742 A1* | 2/2005 | Koo | H02J 7/0047 | 320/149 |
| 2005/0046388 A1* | 3/2005 | Tate, Jr. | G01R 31/367 | 320/132 |
| 2005/0057255 A1* | 3/2005 | Tate, Jr. | H01M 10/48 | 324/426 |
| 2005/0154544 A1* | 7/2005 | Ono | G01R 31/3828 | 702/63 |
| 2005/0194936 A1* | 9/2005 | Cho, II | H01M 10/48 | 320/132 |
| 2006/0083955 A1* | 4/2006 | Kanouda | G06F 1/26 | 429/9 |
| 2006/0100833 A1* | 5/2006 | Plett | H01M 10/48 | 703/2 |
| 2006/0111854 A1* | 5/2006 | Plett | G01R 31/3842 | 702/63 |
| 2006/0111870 A1* | 5/2006 | Plett | H01M 10/42 | 702/181 |
| 2007/0299620 A1* | 12/2007 | Yun | G01R 31/3842 | 702/63 |
| 2008/0252262 A1* | 10/2008 | Buhler | H02J 7/0072 | 320/149 |
| 2009/0091299 A1* | 4/2009 | Lin | H01M 10/441 | 320/137 |
| 2009/0132186 A1* | 5/2009 | Esnard | G01R 31/3648 | 702/63 |
| 2009/0146664 A1* | 6/2009 | Zhang | G01R 31/392 | 324/433 |
| 2009/0295397 A1* | 12/2009 | Barsukov | G01R 31/367 | 324/429 |
| 2009/0322283 A1* | 12/2009 | Zhang | G01R 31/392 | 320/134 |
| 2010/0036626 A1* | 2/2010 | Kang | G01R 31/3648 | 702/63 |
| 2010/0052615 A1* | 3/2010 | Loncarevic | H02J 7/0016 | 320/118 |
| 2010/0090650 A1* | 4/2010 | Yazami | H01M 10/443 | 320/132 |
| 2010/0244846 A1* | 9/2010 | Desprez | G01R 31/392 | 324/427 |
| 2010/0280777 A1* | 11/2010 | Jin | B60L 3/0046 | 702/63 |
| 2011/0060538 A1* | 3/2011 | Fahimi | G01R 31/392 | 702/63 |
| 2011/0095765 A1* | 4/2011 | Tae | H02J 7/0026 | 324/434 |
| 2011/0115440 A1* | 5/2011 | Sabi | H01M 10/44 | 320/145 |
| 2011/0231124 A1* | 9/2011 | Itabashi | G01R 31/389 | 702/63 |
| 2011/0274952 A1* | 11/2011 | Itagaki | G01R 31/3835 | 429/93 |
| 2011/0309838 A1* | 12/2011 | Lin | H01M 10/48 | 324/427 |
| 2012/0105069 A1* | 5/2012 | Wang | G01R 31/392 | 324/427 |
| 2012/0109617 A1* | 5/2012 | Minarcin | B60L 58/16 | 703/14 |
| 2012/0130690 A1* | 5/2012 | Srivastava | G16C 20/30 | 703/2 |
| 2012/0274331 A1* | 11/2012 | Liu | G01R 31/3835 | 324/426 |
| 2013/0006455 A1* | 1/2013 | Li | B60L 58/12 | 701/22 |
| 2013/0066573 A1* | 3/2013 | Bond | G01R 31/392 | 702/63 |
| 2013/0110429 A1* | 5/2013 | Mitsuyama | H01M 10/48 | 702/63 |
| 2013/0179012 A1* | 7/2013 | Hermann | B60L 58/14 | 701/22 |
| 2013/0185008 A1* | 7/2013 | Itabashi | H01M 10/486 | 702/63 |
| 2013/0311117 A1* | 11/2013 | Chaturvedi | G06F 17/11 | 702/63 |
| 2014/0049226 A1* | 2/2014 | Mao | H01M 10/42 | 320/162 |
| 2014/0052396 A1* | 2/2014 | Jin | B60L 58/16 | 702/63 |
| 2014/0079969 A1* | 3/2014 | Greening | H01M 10/48 | 429/91 |
| 2014/0088897 A1* | 3/2014 | Sharma | G06F 17/5018 | 702/63 |

(56) References Cited

U.S. PATENT DOCUMENTS

| | | | | |
|---|---|---|---|---|
| 2014/0115858 | A1* | 5/2014 | Pisu | H01M 10/42<br>29/407.05 |
| 2014/0144719 | A1* | 5/2014 | Morgan | B60K 1/00<br>180/65.31 |
| 2014/0152261 | A1* | 6/2014 | Yamauchi | G01R 31/3835<br>320/118 |
| 2014/0218040 | A1* | 8/2014 | Kim | G01R 31/3835<br>324/426 |
| 2014/0225622 | A1* | 8/2014 | Kudo | B60L 3/0046<br>324/433 |
| 2014/0244193 | A1* | 8/2014 | Balasingam | G06F 17/5036<br>702/63 |
| 2014/0244225 | A1* | 8/2014 | Balasingam | G06F 17/5036<br>703/2 |
| 2014/0257726 | A1* | 9/2014 | Baba | G01R 31/3648<br>702/63 |
| 2014/0266059 | A1* | 9/2014 | Li | B60L 15/2009<br>320/132 |
| 2014/0278167 | A1* | 9/2014 | Frost | B60L 58/16<br>702/63 |
| 2014/0333317 | A1* | 11/2014 | Frost | H01M 10/44<br>324/430 |
| 2014/0340045 | A1* | 11/2014 | Itabashi | H01M 10/48<br>320/134 |
| 2014/0350877 | A1* | 11/2014 | Chow | G06F 17/5036<br>702/63 |
| 2015/0106044 | A1* | 4/2015 | Driemeyer-Franco | G01R 31/3648<br>702/63 |
| 2015/0127425 | A1* | 5/2015 | Greene | G06Q 30/0202<br>705/7.31 |
| 2015/0260800 | A1* | 9/2015 | Baba | H01M 10/48<br>702/63 |
| 2016/0069961 | A1* | 3/2016 | Min | G01R 31/026<br>324/426 |

FOREIGN PATENT DOCUMENTS

| | | |
|---|---|---|
| CN | 101379409 A | 3/2009 |
| CN | 101971043 A | 2/2011 |
| CN | 102088118 A | 6/2011 |
| CN | 102368091 A | 3/2012 |
| CN | 102645637 A | 8/2012 |
| CN | 204269785 U | 4/2016 |
| CN | 104007390 B | 3/2018 |
| DE | 102011104320 A1 | 12/2011 |

OTHER PUBLICATIONS

Gregory L. Plett ("Extended Kalman filtering for battery management systems of LiPB-based HEV battery packs Part 2. Modeling and identification", Elsevier B.V., 2004, pp. 262-276).*

Kim et al. ("Complementary Cooperation Algorithm Based on DEKF Combined With Pattern Recognition for SOC/Capacity Estimation and SOH Prediction", IEEE, 2012, pp. 436-451).*

V.H. Johnson ("Battery performance models in Advisor",Journal of Power Sources 110 (2002) 321-329).*

Markel et al. ("Advisor: a systems analysis tool for advanced vehicle modeling", Journal of Power Sources 110 (2002) 255-266).*

He et al. ("Evaluation of Lithium-Ion Battery Equivalent Circuit Models for State of Charge Estimation by an Experimental Approach", Energies 2011, 4, 582-598).*

Chen et al. (Battery State of Charge Estimation Based on a Combined Model of Extended Kalman Filter and Neural Networks, IEE, 2011, pp. 2156-2163).*

Xuyun et al. ("A battery model including hysteresis for State-of-Charge estimation in Ni-MH battery", IEEE, 2008, pp. 1-5).*

Rahmoun et al. ("SOC Estimation for Li-Ion Batteries Based on Equivalent Circuit Diagrams and the Application of a Kalman Filter", IEEE, 2012, pp. 1-4).*

He et al. hereafter He ("Evaluation of Lithium-Ion Battery Equivalent Circuit Models for State of Charge Estimation by an Experimental Approach", Energies 2011, pp. 582-598).*

Mohammed Sayed Mohammed Farag ("Lithium-Ion Batteries: Modelling and State of Charge Estimation", Thesis submission, McMaster University, 2013, pp. 1-189).*

Rahmoun et al. (SOC Estimation for Li-Ion Batteries Based on Equivalent Circuit Diagrams and the Application of a Kalman Filter, IEEE,2012, pp. 1-4) (Year: 2012).*

He et al. ("Evaluation of Lithium-Ion Battery Equivalent Circuit Models for State of Charge Estimation by an Experimental Approach" , Energies 2011,pp. 582-598) (Year: 2011).*

Chen et al. ("Battery State of Charge Estimation Based on a Combined Model of Extended Kalman Filter and Neural Networks", IEEE, 2011, pp. 2156-2163) (Year: 2011).*

Yuan et al . ("State of Charge Estimation Using the Extended Kalman Filter for Battery Management Systems Based on the ARX Battery Model", Energies 2013, 6, pp. 444-470) (Year: 2011).*

Shaemsedin Nursebo ("Model Based Approach to Supervision of Fast Charging", Chalmers University of Technology, 2010, pp. 1-97) (Year: 2010).*

Bar-Shalom et al., "Estimation with Applications to Tracking and Navigation: Theory Algorithms and Software", Johon Wiley sons Inc., 2004, 32 pages.

Bhangu et al., "Nonlinear Observers for Predicting State-of-Charge and State-of-Health of Lead-Acid Batteries for Hybrid-Electric Vehicles", IEEE Transactions on Vehicular Technology, vol. 54, No. 3, May 2005, pp. 783-794.

Charkhgard et al., "State-of-Charge Estimation for Lithium-Ion Batteries Using Neural Networks and EKF", IEEE Transactions on Industrial Electronics, vol. 57, No. 12, Dec. 2010, pp. 4178-4187.

Chen et al., "State of Charge Estimation of Lithium-Ion Batteries in Electric Drive Vehicles Using Extended Kalman Filtering", IEEE Transactions on Vehicular Technology, vol. 62, No. 3, Mar. 2013, pp. 1020-1030.

Dempster et al., "Maximum Likelihood from Incomplete Data via the EM Algorithm", Journal of the Royal Statistical Society. Series B (Methodological), vol. 39, No. 1, 1977, pp. 1-38.

Djuric P. M., "Asymptotic MAP Criteria for Model Selection", IEEE Transactions on Signal Processing vol. 46, No. 10, Oct. 1998, pp. 2726-2735.

Doucet et al., "Sequential Monte Carlo Methods in Practice", 2001, 12 pages of table of content only.

He, et al., "State-of-Charge Estimation of the Lithium-Ion Battery Using an Adaptive Extended Kalman Filter Based on an Improved Thevenin Model", IEEE Transactions on Vehicular Technology, vol. 60, No. 4, May 2011, pp. 1461-1469.

Hu et al., "A multiscale framework with extended Kalman filter for lithium-ion battery SOC and capacity estimation", Applied Energy, vol. 92, 2012, pp. 694-704.

Hu et al., "Estimation of State of Charge of a Lithium-Ion Battery Pack for Electric Vehicles Using an Adaptive Luenberger Observer", Energies vol. 3, 2010, pp. 1586-1603.

Julier et al., "A New Extension of the Kalman Filter to Nonlinear Systems", The Robotic Research Group, Dept. of Engg. Sc., The University of Oxford, 1997, 12 pages.

Kim Il-Song, "The novel state of charge estimation method for lithium battery using sliding mode observer", Journal of Power Sources, vol. 163, 2006, pp. 584-590.

Kim et al., "State-of-Charge Estimation and State-of-Health Prediction of a Li-Ion Degraded Battery Based on an EKF Combined With a Per-Unit System", IEEE Transactions on Vehicular Technology, vol. 60, No. 9, Nov. 2011, pp. 4249-4260.

Kim et al., "Discrimination of Li-ion batteries based on Hamming network using discharging—charging voltage pattern recognition for improved state-of-charge estimation", Journal of Power Sources vol. 196, 2011, pp. 2227-2240.

Lee et al., "Li-ion battery SOC estimation method based on the reduced order extended Kalman filtering", Journal of Power Sources, vol. 174, 2007, pp. 9-15.

Lee et al., "State-of-charge and capacity estimation of lithium-ion battery using a new open-circuit voltage versus state-of-charge", Journal of Power Sources, vol. 185, 2008, pp. 1367-1373.

(56) References Cited

OTHER PUBLICATIONS

Markovsky et al., "Overview of total least-squares methods", Signal Processing, vol. 87, 2007, pp. 2283-2302.
Masatali et al., "Battery state of the Charge Estimation using Kalman Filtering", Journal of Power Sources, vol. 239, 2013, pp. 294-307.
Plett, G. L., "Extended Kalman filtering for battery management systems of LiPB-based HEV battery packs Part 1. Background", Journal of Power Sources, vol. 134, 2004, pp. 252-261.
Plett, G. L., "Extended Kalman filtering for battery management systems of LiPB-based HEV battery packs Part 2. Modeling and identification", Journal of Power Sources, vol. 134, 2004, pp. 262-276.
Plett, G. L., "Extended Kalman filtering for battery management systems of LiPB-based HEV battery packs Part 3. State and parameter estimation", Journal of Power Sources, vol. 134, 2004, pp. 277-292.
Plett, G. L., "Sigma-point Kalman filtering for battery management systems of LiPB-based HEV battery packs Part 1: Introduction and state estimation", Journal of Power Sources, vol. 161, 2006, pp. 1356-1368.
Plett, G. L., "Sigma-point Kalman filtering for battery management systems of LiPB-based HEV battery packs Part 2: . Simultaneous state and parameter estimation", Journal of Power Sources, vol. 161, 2006, pp. 1369-1384.
Santhanagopalan et al., "Online estimation of the state of charge of a lithium ion cell", Journal of Power Sources, vol. 161, 2006, pp. 1346-1355.
Shumway et al., "Time Series Analysis and Its Applications", Springer, Third Edition, Sep. 2010, 202 pages.
Balasingam et al., "An EM Approach for Dynamic Battery Management Systems", 15th International Conference on Information Fusion (Fusion), Jul. 9-12, 2012, pp. 2110-2117.
Bar-Shalom et al., "Tracking and Data Fusion: A Handbook of Algorithms", Apr. 10, 2011, 2 pages.
Crassidis et al., "Error-Covariance Analysis of the Total Least Squares Problem", American Institute of Aero. & Astro., Aug. 8-11, 2011, pp. 1-25.
Einhorn et al., "A Method for Online Capacity Estimation of Lithium Ion Battery Cells Using the State of Charge and the Transferred Charge", IEEE Transactions on Industry Applications, vol. 48, No. 2, Mar./Apr. 2012, pp. 736-741.
Hamming, R. W., "Numerical Methods for Scientists and Engineers: Secon Edition", This Dover Edition published on 1986, Dover Publications Inc., 732 pages.
Plett, G. L., "Recursive approximate weighted total least squares estimation of battery cell total capacity", Journal of Power Sources, vol. 196, 2011, pp. 2319-2331.
Roscher et al., "OCV Hysteresis in Li-Ion Batteries including Two-Phase Transition Materials", International Journal of Electrochemistry vol. 2011, pp. 1-6.
Elandt-Johnson et al.,"Survival Models and Data Analysis", Wiley Classics Library, 1981, pp. 295-296.
Stuart et al.,"Kendall's advanced theory of statistics. Volume 2A: classical inference and the linear model", Statistics in Medicine vol. 19, No. 22, pp. 3139-3140.
Xuyun et al.; "A Battery Model Including Hysteresis for State-of Charge Estimation in Ni-MH Battery"; Sep. 3-5, 2008, IEEE Vehicle Power and Propulsion Conference (VPPC), Harbin, China; 5 pages.
Zhang et al., "Estimation of State of Charge of Lithium-Ion Batteries Used in HEV Using Robust Extended Kalman Filtering", Apr. 19, 2012, Energies 2012, vol. 5, pp. 1098-1115.

\* cited by examiner

TABLE I
OCV LOOKUP BASED METRIC

|  | Low Temp. regime $T_1 \leq -5°C$ | Mild Temp. regime $-5°C < T_2 \leq 15°C$ | Room Temp. regime $15°C < T_3 \leq 30°C$ | High Temp. regime $30°C < T_4 \leq 45°C$ |
|---|---|---|---|---|
| High SOC regime SOC > 50% | $\epsilon_{OCV}(s_H, T_1)$ | $\epsilon_{OCV}(s_H, T_2)$ | $\epsilon_{OCV}(s_H, T_3)$ | $\epsilon_{OCV}(s_H, T_4)$ |
| Low SOC regime SOC < 50% | $\epsilon_{OCV}(s_L, T_1)$ | $\epsilon_{OCV}(s_L, T_2)$ | $\epsilon_{OCV}(s_L, T_3)$ | $\epsilon_{OCV}(s_L, T_4)$ |

FIG. 22A

TABLE II
COULOMB COUNTING BASED METRIC

|  | Low Temp. regime $T_1 \leq -5°C$ | Mild Temp. regime $-5°C < T_2 \leq 15°C$ | Room Temp. regime $15°C < T_3 \leq 30°C$ | High Temp. regime $30°C < T_4 \leq 45°C$ |
|---|---|---|---|---|
| Complete SOC regime | $\epsilon_{CC}(T_1)$ | $\epsilon_{CC}(T_2)$ | $\epsilon_{CC}(T_3)$ | $\epsilon_{CC}(T_4)$ |

FIG. 22B

TABLE III
TTV BASED METRIC

|  | Low Temp. regime $T_1 \leq -5°C$ | Mild Temp. regime $-5°C < T_2 \leq 15°C$ | Room Temp. regime $15°C < T_3 \leq 30°C$ | High Temp. regime $30°C < T_4 \leq 45°C$ |
|---|---|---|---|---|
| High SOC regime SOC > 50% | $\epsilon_{TTV}(s_H, T_1)$ | $\epsilon_{TTV}(s_H, T_2)$ | $\epsilon_{TTV}(s_H, T_3)$ | $\epsilon_{TTV}(s_H, T_4)$ |
| Low SOC regime SOC < 50% | $\epsilon_{TTV}(s_L, T_1)$ | $\epsilon_{TTV}(s_L, T_2)$ | $\epsilon_{TTV}(s_L, T_3)$ | $\epsilon_{TTV}(s_L, T_4)$ |

FIG. 22C

BATTERY STATE OF CHARGE TRACKING, EQUIVALENT CIRCUIT SELECTION AND BENCHMARKING

This application claims the benefit of U.S. Provisional Patent Application 61/768,472 filed on Feb. 24, 2013 entitled, "BATTERY STATE OF CHARGE TRACKING, EQUIVALENT CIRCUIT SELECTION AND BENCHMARKING", the entire contents of which are incorporated herein by reference. This application is related to a co-pending application Ser. No. 14/185,790 entitled "BATTERY STATE OF CHARGE TRACKING, EQUIVALENT CIRCUIT SELECTION AND BENCHMARKING", the entire contents of which are incorporated herein by reference.

FIELD

Embodiments relate to calculating state of charge of a battery.

BACKGROUND

Electrochemical storage devices play an important part of future energy strategy. Indeed, batteries are a viable energy storage technology of today and in the near future. A wide range of devices, such as portable electronic equipment, mobile household appliances, aerospace equipment, etc., are increasingly being powered by batteries. Accurate estimation of, for example, the state of charge of a battery can be difficult using known systems and methods. Thus, a need exists for systems, methods, and apparatus to address the shortfalls of present technology and to provide other new and innovative features.

SUMMARY

One embodiment includes a method. The method includes storing, in a memory, a library of equivalent circuit models representing a battery, determining an operational mode of a battery based on a load associated with the battery, selecting one of the equivalent circuit models based on the determined operational mode, and calculating a state of charge of charge (SOC) of the battery using the selected equivalent circuit model.

Another embodiment includes a system. The system includes a data store configured to store a library of equivalent circuit models representing a battery, a model selection module configured to select an equivalent circuit model based on an operational mode of the battery, and a filter module configured to calculate an estimated state of charge (SOC) of the battery based on the selected equivalent circuit model.

Still another embodiment includes a computer readable medium including code segments. When executed by a processor, the code segments cause the processor to select an equivalent circuit model from a library of equivalent circuit models representing a battery based on an operational mode of the battery; and calculate a state of charge of charge (SOC) of the battery using the selected equivalent circuit model.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the example embodiments and wherein:

FIGS. 22A, 22B and 22C are tables representing fuel gauge readings.

Figure 1:
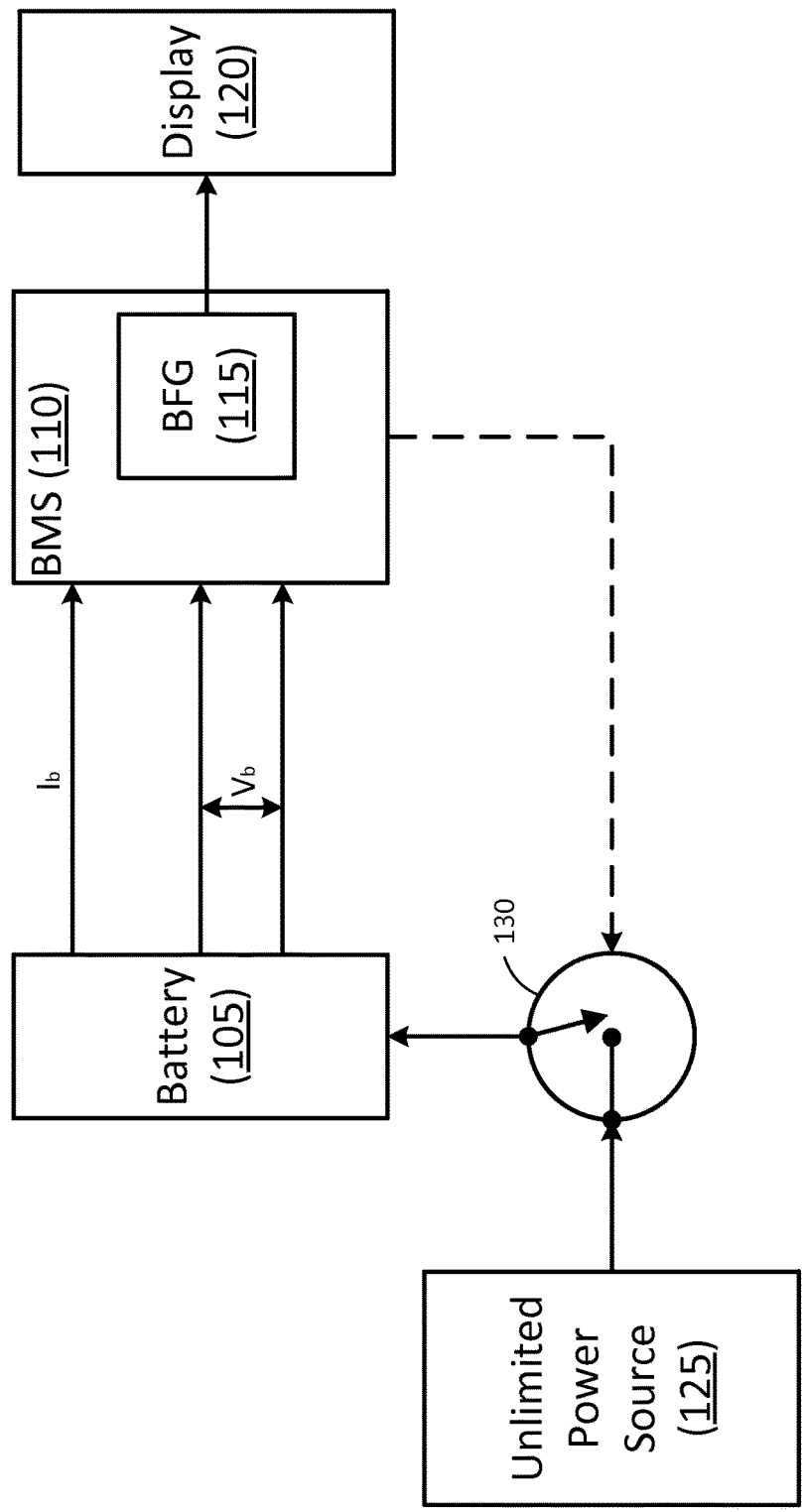
FIGS. 1 and 2 illustrate block diagrams of a battery management system (BMS) according to at least one example embodiment.

It should be noted that these Figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of structural elements may be reduced or exaggerated for clarity.

DETAILED DESCRIPTION OF THE EMBODIMENTS

While example embodiments may include various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

Accurate estimation of the state of batteries, such as the state of charge (SOC), state of health (SOH), and remaining useful life (RUL), is critical to reliable, safe and widespread use of the devices being powered by batteries. Estimating these quantities is known as battery fuel gauging (BFG). Unlike the hydrocarbon fuels in many of today's automobiles, the storage capacity of a battery is not a constant quantity. Typically, the battery capacity varies with the age of the battery, usage patterns and temperature, making BFG a challenging adaptive estimation problem, requiring modeling and on-line parameter identification of battery characteristics across temperature changes, SOC variations, and age.

Figure 2:
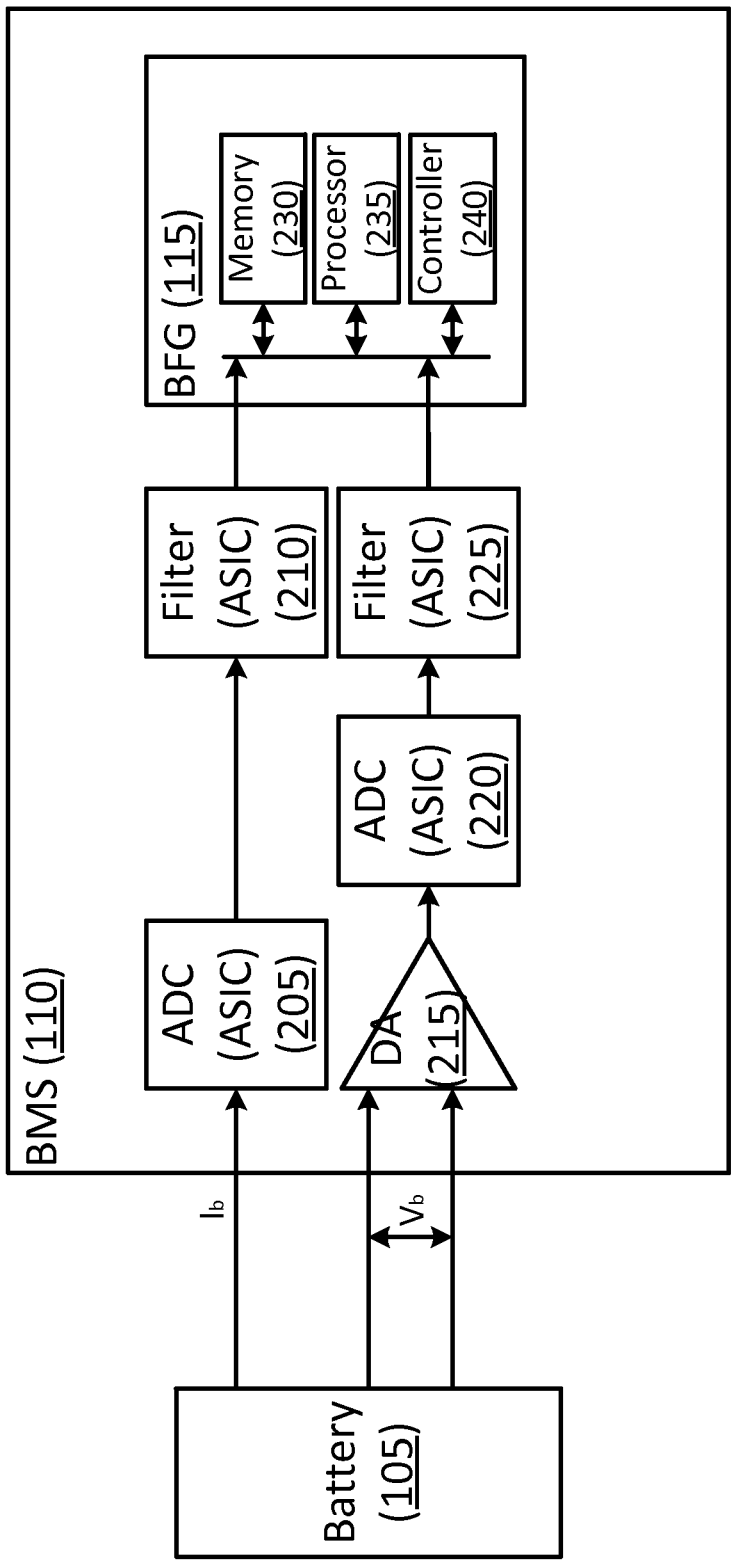

FIGS. 1 and 2 illustrate block diagrams of a system 100 according to at least one example embodiment. As shown in FIG. 1, the system 100 includes a battery 105, a battery management system (BMS) 110, a display 120, an unlimited power source 125 (e.g., a wall outlet, an automobile charging station, and the like), and a switch 130.

The BMS 110 may be configured to manage utilization and/or a condition of the battery 105. For example, the BMS 110 may be configured to connect or disconnect the unlimited power source 125 to the battery 105 using switch 130 to charge the battery 105. For example, the BMS 110 may be configured to connect or disconnect a load (not shown) to the battery 105. For example, the BFG 115 may be configured to calculate a state of charge (SOC) and/or state of health (SOH) of the battery 105. The SOC and/or SOH may be displayed (e.g., as a percentage, as a time remaining, etc.) on the display 120.

As shown in FIG. 2, the BMS 110 includes, at least, analog to digital converters (ADC) 205, 220, filters 210, 225, a digital amplifier 215, and a battery fuel gauge (BFG) 115. The BFG 115 includes a memory 230, a processor 235 and a controller 240. At least one of the ADC 205, 220, the filters 210, 225, the digital amplifier 215, and the BFG 115 may be, for example, an application specific integrated circuit (ASIC), a digital signal processor (DSP), a field programmable gate array (FPGA), a processor, and/or so forth. Alternatively, the BMS 110 may be an ASIC, a DSP, an FPGA, a processor, and/or so forth including the shown functional blocks. Alternatively, the system 100 may be implemented as software stored on a memory and executed by, for example, a processor.

The BMS 110 may be configured to convert an analog measurement (e.g., $I_b$ and $V_b$) to a digital value using a combination of the digital converters (ADC) 205, 220, the filters 210, 225, and the digital amplifier 215 (e.g., for use by the BFG 115 to calculate SOC and/or SOH). For example, the digital amplifier 215 may be a differential amplifier that generates (e.g., produces) an analog signal based on the voltage drop $V_b$ across the battery 105 (e.g., the difference in voltage values between the positive and negative terminal) which is then converted to a filtered digital value using ADC 220 and filter 225.

System 100 may be a subsystem of any system or electronic device that utilizes a battery to provide power. In some implementations, the electronic device can be, or can include, for example, a laptop-type device with a traditional laptop-type form factor. In some implementations, the electronic device can be, or can include, for example, a wired device and/or a wireless device (e.g., Wi-Fi enabled device), a computing entity (e.g., a personal computing device), a server device (e.g., a web server), a toy, a mobile phone, an audio device, a motor control device, a power supply (e.g., an off-line power supply), a personal digital assistant (PDA), a tablet device, e-reader, a television, an automobile, and/or so forth. In some implementations, the electronic device can be, or can include, for example, a display device (e.g., a liquid crystal display (LCD) monitor, for displaying information to the user), a keyboard, a pointing device (e.g., a mouse, a trackpad, by which the user can provide input to the computer).

Figure 3:
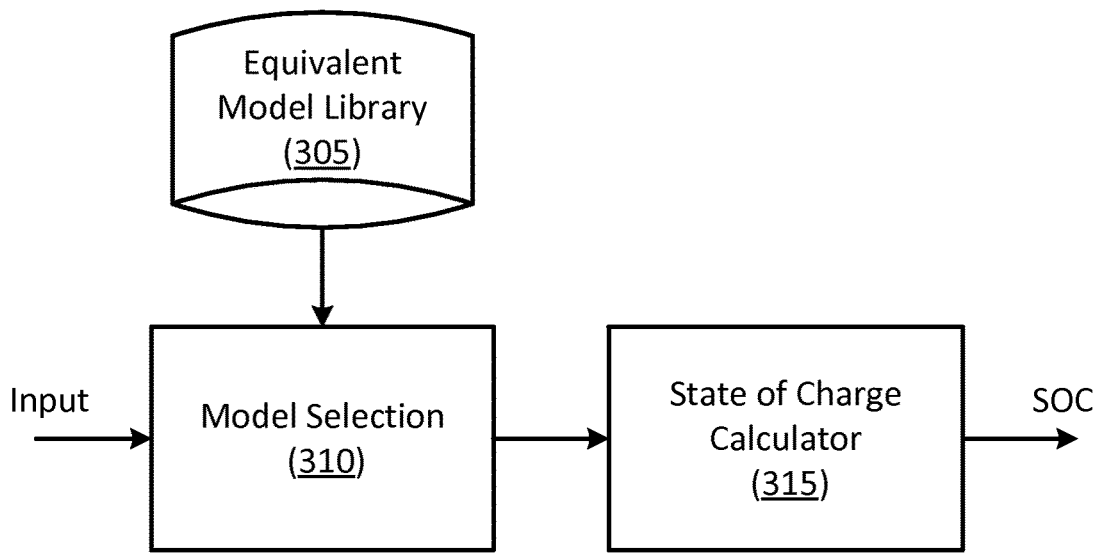
FIG. 3 illustrates a block diagram of a signal flow for selecting a battery equivalent model according to at least one example embodiment.

FIG. 3 illustrates a block diagram 300 of a signal flow for selecting a battery equivalent model according to at least one example embodiment. As shown in FIG. 3, a model selection block 310 receives an input (e.g., voltage and/or current signals from a battery and/or a load) and uses the input (or some variation thereof) to select an equivalent model representing (or corresponding to) a battery from an equivalent model library 305. The equivalent model is then used to calculate a state of charge (SOC) by the state of charge calculator block 315. The equivalent model library 305 may include at least one equivalent model representing a battery. Each equivalent model may be based on an operational mode of the battery (or an equivalent battery). The operational mode may be based on a load associated with the battery. For example, the operational mode may be based on the voltage drop across the load. For example, the operational mode may be based on whether or not the voltage drop across the load is relatively high or low, relatively constant or dynamic, and/or a combination thereof.

The equivalent model (see FIGS. 13A-13D below) may include any combination of resistors, voltages (e.g., voltage drops or voltage sources), resistance-current (RC) circuits, impedance circuits, and/or the like. Accordingly, a mathematical (e.g., formula) equivalent for the equivalent model of the battery may be developed. The equivalent model library 305 may store the mathematical equivalent in relation to the operational mode of the battery. The mathematical equivalent may be used in a calculation of SOC by the state of charge calculator block 315. For example, the mathematical equivalent may be used to determine variables as inputs to a formula used to calculate SOC (or an estimation of SOC). Accordingly a BFG system can select equivalent models based on operational modes to improve calculation efficiency and reduce processing times. Further details are provided below with regard to FIGS. 5-12.

Figure 4:
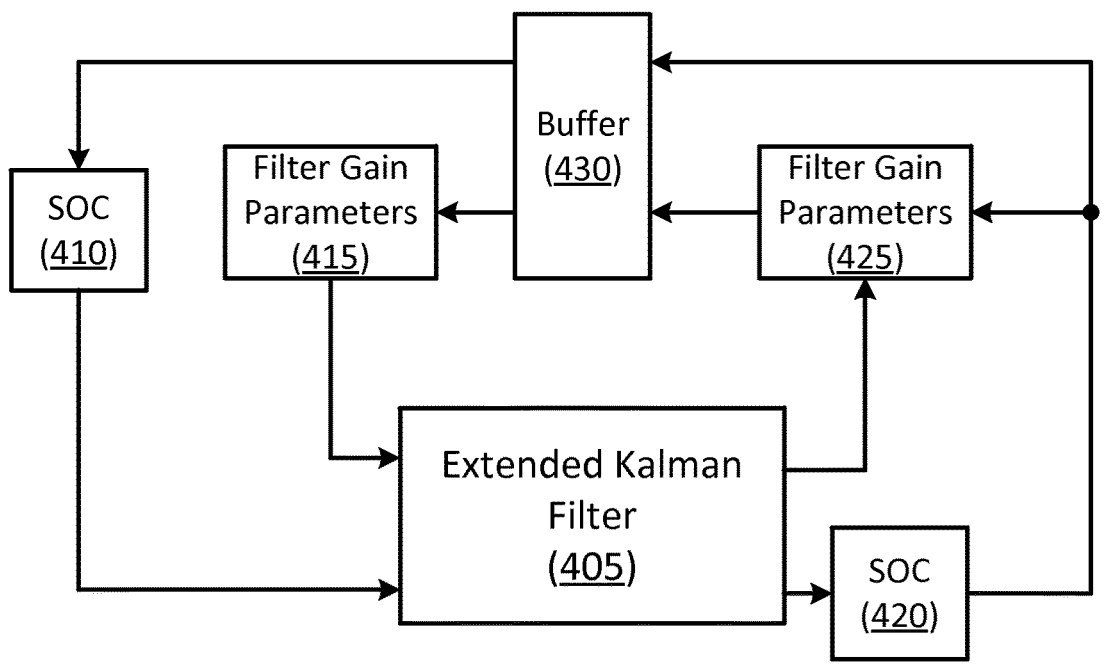
FIG. 4 illustrates a block diagram of a signal flow for calculating a battery state of charge (SOC) according to at least one example embodiment.

FIG. 4 illustrates a block diagram 400 of a signal flow for calculating a battery state of charge (SOC) according to at least one example embodiment. As shown in FIG. 4, the block diagram 400 includes an extended Kalman filter (EKF) block 405, state of charge (SOC) blocks 410, 420, filter gain parameter blocks 415, 425 and a buffer 430. The EKF block 505 may be configured to calculate a SOC 420 and determine filter gain parameters 425 (e.g., a read and/or calculated SOC variance, a measured voltage, a calculated capacity, variables associated with an equivalent circuit, and/or the like) based on previously calculated SOC(s) 410 and filter gain parameters 415. Accordingly, buffer 430 may be configured to store previously calculated SOC(s) and filter gain parameters in, for example, a processing loop. In other words, a current (or next) SOC may be calculated based on at least one previously calculated SOC. In other words, a SOC calculated at a first time may be used to calculate a SOC at a second (later) time.

In an example implementation, at least two SOC's 410 and/or sets of filter gain parameters 415 may be used. Therefore, a vector of at least two SOC's, an array of at least two SOC's, an average of at least two SOC's, and a mean of at least two SOC's and corresponding filter gain parameters may be used to calculate a next SOC 420 (or SOC at a second time) and determine/calculate corresponding filter gain parameters 425. Accordingly, buffer 430 may be configured to store a plurality of previously calculated SOC(s) 410 and calculated/determined filter gain parameters 415. Accordingly a BFG system can utilize a previously calculated SOC to improve calculation efficiency and reduce processing times. Further details are provided below with regard to FIGS. 5-12.

Figure 5:
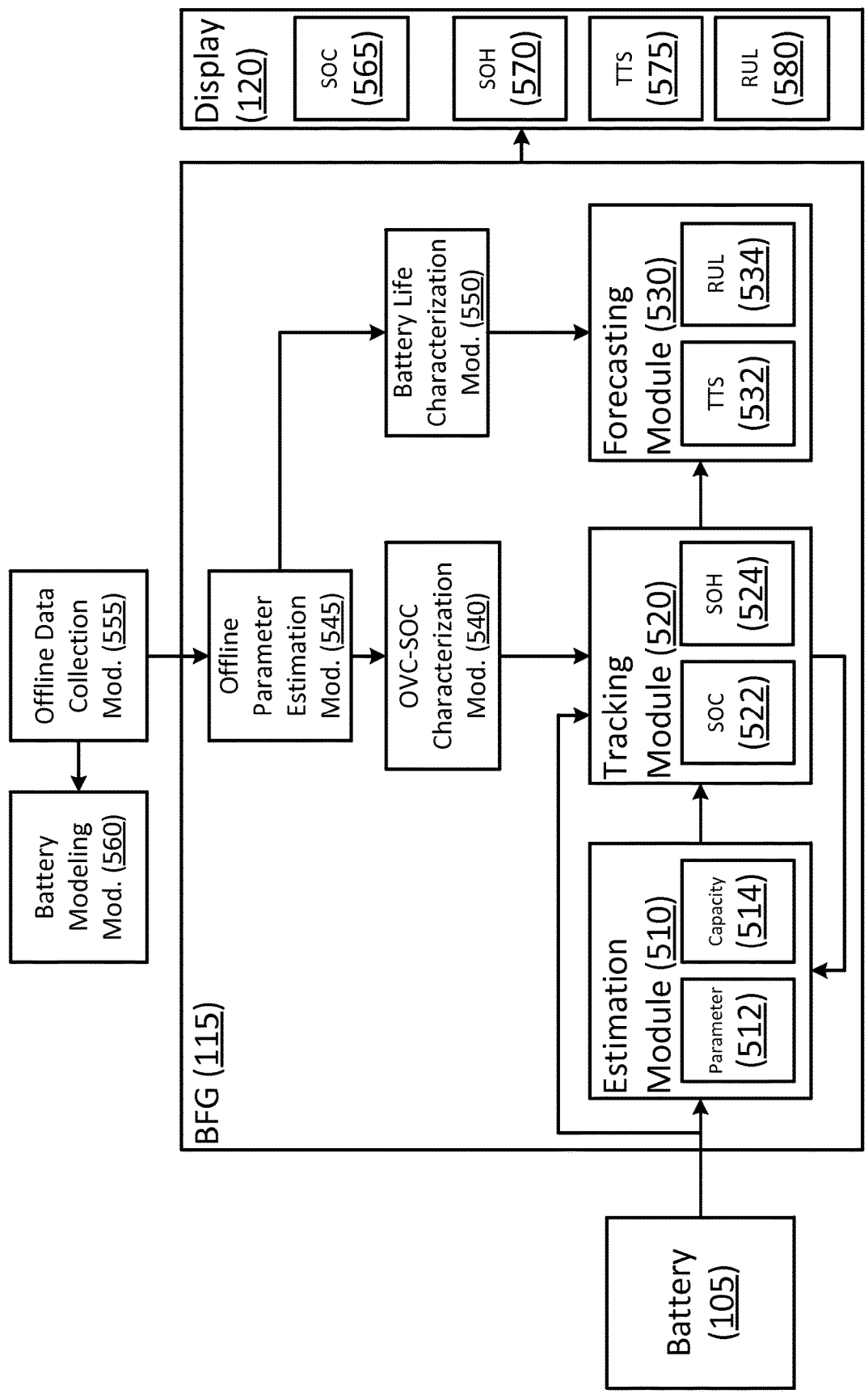
FIG. 5 illustrates a block diagram of a battery fuel gauge (BFG) system according to at least one example embodiment.

FIG. 5 illustrates a block diagram of a battery fuel gauge (BFG) 115 system according to at least one example embodiment. As shown in FIG. 5, the BFG 115 includes an estimation module 510, a tracking module 520, a forecasting module 530, an open voltage circuit-state of charge (OCV-SOC) characterization module 540, an offline parameter estimation module 545 and a battery life characterization module 550. In addition, the system includes an offline data collection module 555 and a battery modeling module 560.

The offline data collection module 555 may be configured to measure battery characteristics in a relatively controlled testing environment. For example, open circuit voltage (OCV) measurements and SOC measurements may be collected for the battery 105 (or an equivalent battery) in a test lab environment. For example, the battery 105 (or equivalent battery) may be initialized to a fully charged (e.g., nearly fully charged, substantially fully charged), rested state. OCV and SOC measurements may be made. Then the battery 105 (or equivalent battery) may be slowly discharged with OCV and SOC measurements made at intervals (e.g., regular, periodic, irregular, predetermined) until the battery 105 (or equivalent battery) is fully (or substantially) discharged. The OCV and SOC measurements may be used to determine, calculate or estimate battery parameters (e.g., OCV parameters $K_i \epsilon \{K_0;K_1;K_2;K_3;K_4;K_5;K_6;K_7\}$ described below).

Data from the offline data collection module 555 may be used in the battery modeling module 560 to determine, for example, equivalent models for the battery 105 (or equivalent battery) and/or mathematical equivalents for the equivalent models. Data from the offline data collection module 555 may be used in the offline parameter estimation module 545 to determine and/or calculate parameters (e.g., values for components associated with the aforementioned equivalent models) associated with the battery 105 (or equivalent battery). Data from the offline data collection module 555 may be used in the OVC-SOC characterization module 540 to determine and/or calculate OCV and SOC battery parameters (e.g., OCV parameters $K_i \epsilon \{K_0;K_1;K_2;K_3;K_4;K_5;K_6;K_7\}$ described below). Data from the offline parameter estimation module 545 may be used in the battery life characterization module 550. For example, data from the offline parameter estimation module 545 may be used to calculate an initial state of health (SOH) characteristic (e.g., maximum SOC) by the battery life characterization module 550.

The display 120 is shown as having a SOC display 565, a SOH display 570, a time to shutdown (TTS) display 575, and a remaining useful life (RUL) display 580. Each display may be, for example, a meter showing a percentage. Values for each of the displays may be calculated or determined by the BFG 115. For example, TTS may be displayed as a time value (e.g., hours and/or minutes) as calculated by the TTS module 532.

The estimation module 510 includes a parameter module 512 and a capacity module 510. The estimation module 510 may be configured to calculate and/or determine values (e.g., parameters and capacity values) that are specific to the battery 105 (or an equivalent battery). In a stable environment (e.g., a test lab) the parameter and capacity values may be fixed (e.g., do not vary). However, in a real world environment the parameter and capacity values may be dynamic or vary. For example, complete SOC tracking solution typically involves (1) estimation of the OCV parameters that form part of the state space model through offline OCV characterization. The OCV-SOC characterization is stable over temperature changes and aging of the battery. Once estimated, these parameters form part of state-space model with known parameters. (2) Estimation of the dynamic electrical equivalent circuit parameters. These parameters have been observed to vary with temperature, SOC and age of the battery and hence should be adaptively estimated while the BFG is operational. (3) Estimation of battery capacity: Even though the nominal capacity of the battery is specified by the manufacturer, the usable battery capacity is known to vary due to errors in the manufacturing process, temperature changes, usage patterns, and aging. And (4) model parameter-conditioned SOC tracking. Once the model parameters are known, the SOC tracking becomes a nonlinear filtering problem. However, it is observed that the resulting state-space model contains correlated process and measurement noise processes. Properly addressing the effect of these correlations will yield better SOC tracking accuracy. Therefore, in example implementations, in order to calculate parameters and capacity, the tracking module 520 may feed back data to the estimation module 510.

Further, typical methods of estimating battery capacity neglect hysteresis effects and assume that the rested battery voltage represents the true open circuit voltage (OCV) of the battery. However, according to example embodiments, the estimation module 510 models hysteresis as an error in the OCV of the battery 105 and employs a combination of real time, linear parameter estimation and SOC tracking technique to compensate for the error in the OCV.

The tracking module 520 includes a SOC module 522 and a SOH module 524. SOC indicates the amount of "fuel" in the battery 105. As described above, SOC is the available capacity expressed as a percentage of some reference (e.g., rated capacity or current capacity). According to example embodiments, SOC module 522 calculates SOC using tracking to compensate for error in the OCV (in combination with the parameter estimation) described in more detail below. SOH indicates the condition of a battery as compared with a new or ideal battery. SOH may be based on charge acceptance, internal resistance, voltage, self-discharge, and/or the like.

The forecasting module 530 includes a TTS module 532 and a RUL module 534. The TTS module 532 and the RUL module 534 may be configured to calculate TTS and RUL based on SOC.

Figure 6:
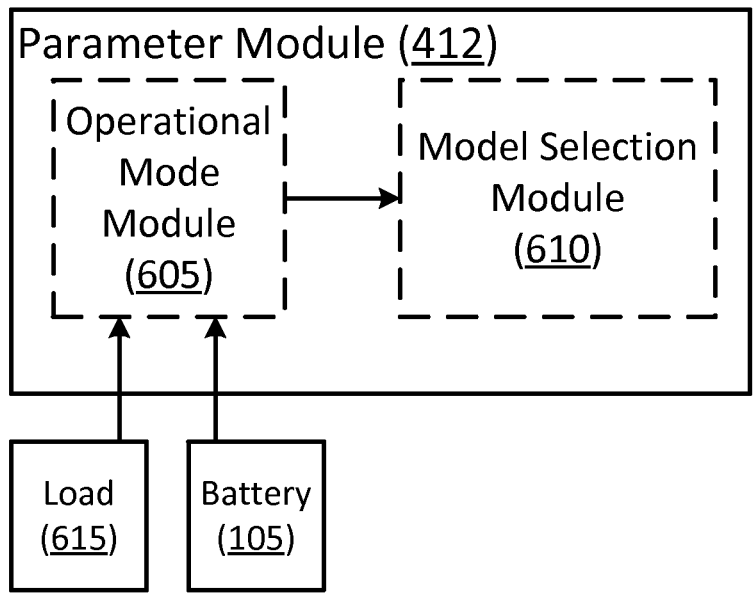
FIG. 6 illustrates a block diagram of a signal flow for a parameter module of the BFG system according to at least one example embodiment.

FIG. 6 illustrates a block diagram of a signal flow for a parameter module 412 of the BFG 115 according to at least one example embodiment. A BFG system can select equivalent models based on operational modes to improve calculation efficiency and reduce processing times. As shown in FIG. 6, the parameter module 412 includes an operational mode module 605 and a model selection module 610. The operational mode module 605 may be configured to determine an operational mode (of a battery) based on at least one input from the battery 105 and/or at least one input from the load 615. The at least one input may be based on at least one of a current and a voltage associated with at least one of the battery 105 and the load 615. For example, a voltage drop across the load 615. For example, the operational mode may be based on whether or not the voltage drop across the load 615 is relatively high or low, relatively constant or dynamic, and/or a combination thereof. The model selection module 610 may select an equivalent model (or mathematical equivalent thereof) based on the determined operational mode. For example, the model selection module 610 may generate a query term used to search equivalent model library 305.

In some implementations, several operational modes may be defined or characterized. In an example implementation, four operational modes associated with a battery and the system using the battery are described below.

In a first operational mode, the battery 105 may be attached to a heavy and varying load. In other words, the load 615 may be utilizing a relatively high voltage with a dynamic or varying current draw (or a high voltage load drawing variable current). For example, in a mobile phone, the first operational mode may include a usage environment where the mobile phone usage includes prolonged video play, multimedia and gaming applications, and the like. The equivalent circuit shown in FIG. 13A below may represent a battery attached to a heavy and varying load.

In a second operational mode, the battery 105 may be attached to a dynamic load and/or a variable voltage load. In other words, the load 615 may be utilizing a dynamic or varying voltage. For example, in a mobile phone, the second operational mode may include a usage environment where the mobile phone usage includes regular use for phone calls, web browsing and/or playing video clips. The equivalent circuit shown in FIG. 13B below may represent a battery attached to a dynamic load.

In a third operational mode, the battery 105 may be attached to or drawing a constant current. In other words, the load 615 may be drawing a constant (or substantially constant) load. Alternatively, the battery 105 may be being charged utilizing a constant current. For example, the battery 105 may be disconnected from load 615 for a charging cycle (e.g., the unlimited power source 125 may be connected to the battery 105 using switch 130 to charge the battery 105). The equivalent circuit shown in FIG. 13C below may represent a battery attached to a constant current.

In a fourth operational mode, the battery 105 may be attached to a relatively low voltage load. Alternatively, the battery 105 may be in a cyclical rest state where the battery 105 undergoes light loading followed by a charging and then resting, minimal, or no load. In other words, the load 615 may be utilizing a minimal voltage infrequently. For example, in a mobile phone, the fourth operational mode may include a usage environment where the mobile phone usage includes, after a full (or substantially full) charge, regular pinging of a tower with infrequent phone calls. The equivalent circuit shown in FIG. 13D below may represent a battery attached to a dynamic load.

Figure 7:
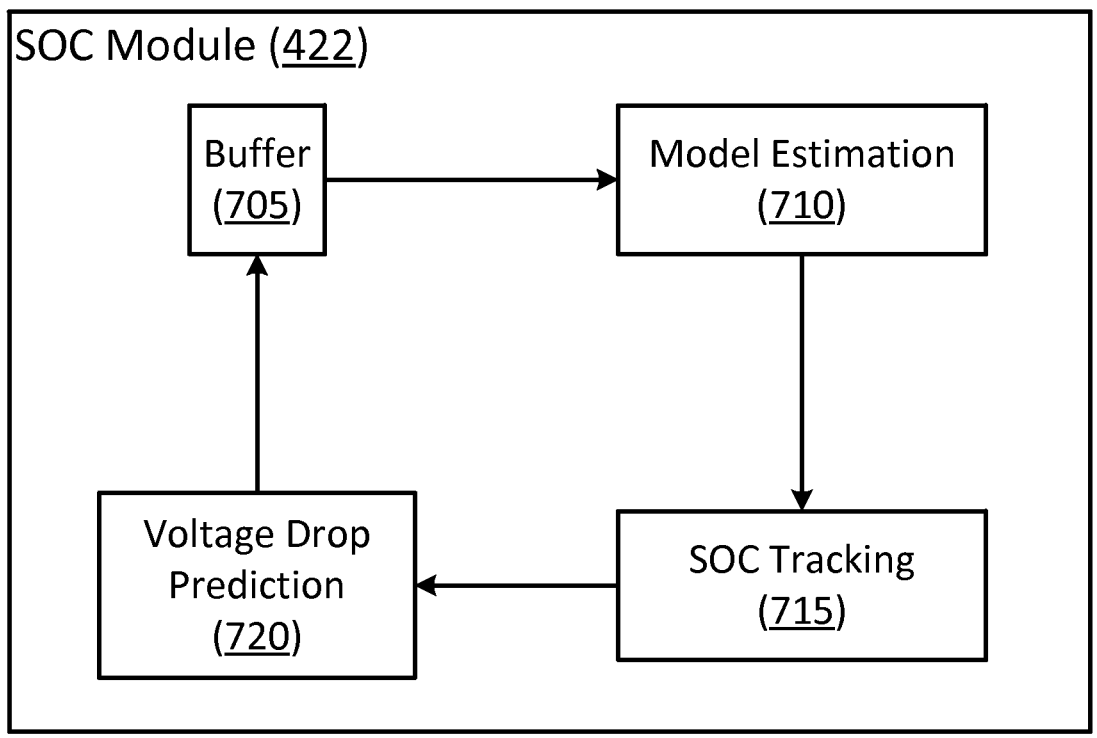
FIG. 7 illustrates a block diagram of a signal flow for a SOC module of the BFG system according to at least one example embodiment.

FIG. 7 illustrates a block diagram of a signal flow for a SOC module 422 of the BFG 115 system according to at least one example embodiment. As shown in FIG. 7, the SOC module 422 includes a buffer block 705, a model estimation block 710, a SOC tracking block 715, and a voltage drop prediction module or block 720.

In example embodiments, hysteresis is modeled as an error in the OCV of the battery 105. The voltage drop $v_D[k]$ may represent the voltage across the internal battery model components $R_0$, $R_1$, $R_2$ and $x_h[k]$ (see FIG. 13A). The term $x_h[k]$ may be used to account for the errors in predicted SOC. In other words, $x_h[k]$ may be an "instantaneous hysteresis" which can be corrected to zero by adjusting a calculated or estimated SOC. For a calculated or estimated SOC to be equal to SOC, a calculated or estimated $x_h[k]$ should be equal to zero. In other words, a calculated or estimated $x_h[k]$ not equal to zero indicates an error in the calculated or estimated SOC. The voltage drop model parameter vector (b) includes an element corresponding to calculated or estimated $x_h[k]$.

Accordingly, in the flow of FIG. 7, a current calculated or estimated SOC from SOC tracking block 715 is used in voltage block prediction block 720 to compute the voltage drop $v_D[k]$. At least one past voltage drop $v_D[k]$ is stored in the buffer 705 and used for estimation of the parameter vector b. A nonzero value of the corresponding calculated or estimated $x_h[k]$ in the parameter vector b indicates the presence of instantaneous hysteresis. This implies SOC estimation error. The SOC tracking algorithm of SOC tracking block 715 is configured to correct the SOC whenever the calculated or estimated $x_h[k]$ is nonzero. Further details with regard to voltage drop $v_D[k]$, hysteresis, estimated $x_h[k]$, voltage drop model parameter vector (b) and SOC tracking are described (mathematically) below. Accordingly a BFG system can utilize a previously calculated SOC and SOC error to accurately estimate SOC, improve calculation efficiency and reduce processing times.

Figure 8:
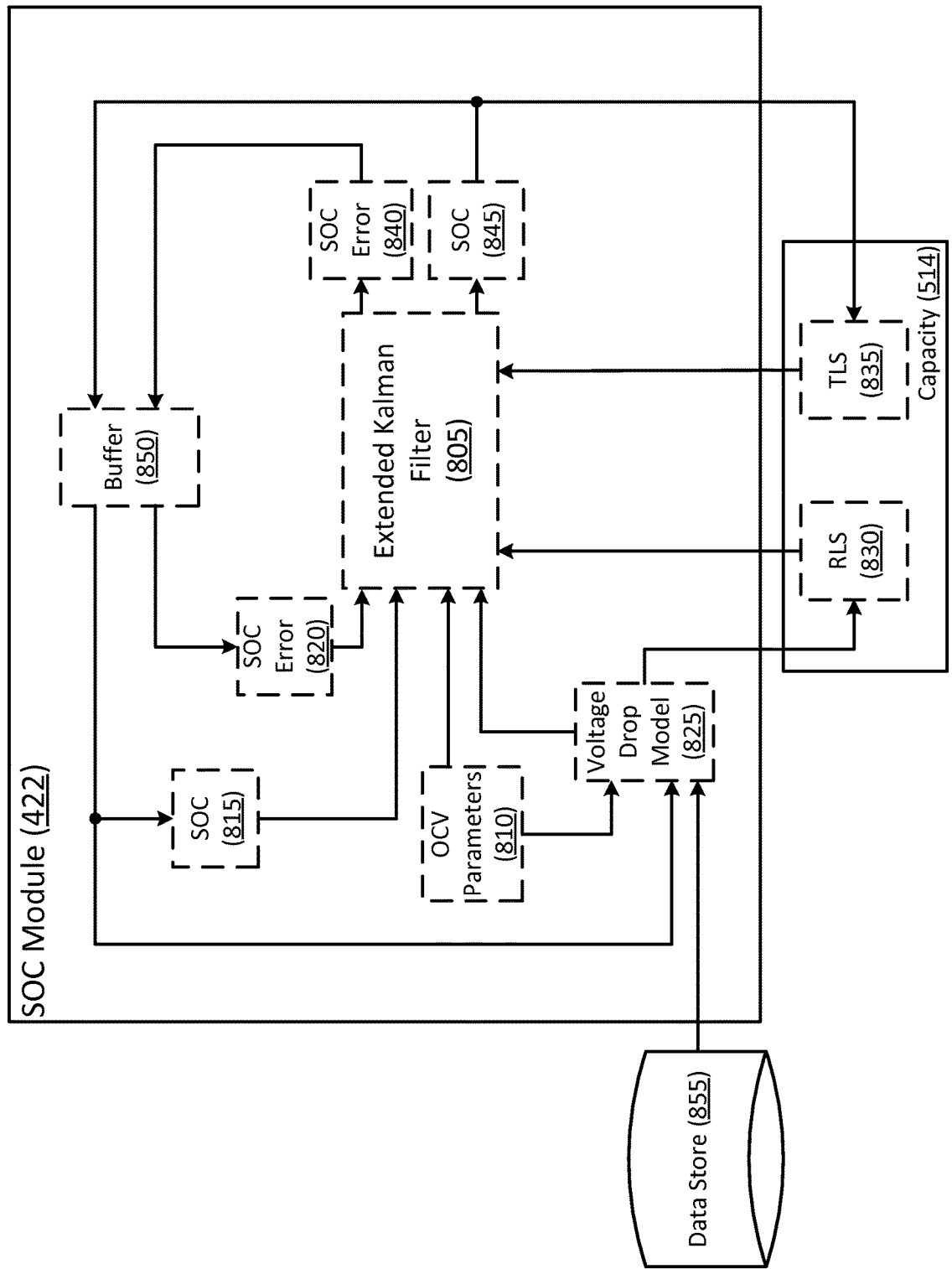
FIG. 8 illustrates a block diagram of the SOC module according to at least one example embodiment.

FIG. 8 illustrates a block diagram of the SOC module 422 according to at least one example embodiment. As shown in FIG. 8, the SOC module 422 includes an extended Kalman filter (EKF) block 805. The EKF block may be configured to calculate a SOC 845 and an SOC error 840. The EKF block 805 may be configured to calculate the SOC 845 as an estimated SOC using Equation 1 and the SOC error 840 as an estimated SOC error (or variance) using Equation 2. In each of the below equations k refers to an instantaneous iteration, k+1|k refers to a last, a previous or earlier iteration and k+1|k+1 refers to a current, an update, a next or a subsequent iteration.

$$\hat{x}[k+1|k+1] = \hat{x}[k+1|k] + G[k+1]v_{k+1} \quad (1)$$

where:
$\hat{x}[k+1|k+1]$ is the estimated SOC for the current or update iteration;
$\hat{x}[k+1|k]$ is the estimated SOC for the last or predicted iteration;
$G[k+1]$ is the filter gain for the last or predicted iteration; and
$v_{k+1}$ is the load voltage for the last or predicted iteration.

$$P_s[k+1|k+1] = (1 - G[k+1]H[k+1])P_s[k+1|k](1 - G[k+1]H[k+1])^T + G[K+1]^2 \Re n_D(0) \quad (2)$$

where:
$P_s[k+1|k+1]$ is the SOC estimation error or variance for the current or update iteration;
$G[k+1]$ is the filter gain for the last or predicted iteration;
$H[k+1]$ is the linearized observation coefficient;
$P_s[k+1|k]$ is the SOC estimation error or variance for the last or predicted iteration; and
$\Re n_D(0)$ is the voltage drop noise with zero mean and correlation at initialization.

The SOC module 422 includes an OCV parameters block 810. The OCV parameters block 810 may be configured to store and/or receive the OCV parameters $\{K_i\}$ from the OVC-SOC characterization module 540. The OCV parameters $\{K_i\}$ are constants in that they are measured offline and change over the life of the battery 105 is negligible (or nonexistent). The OCV parameters are used to calculate the OCV in terms of SOC according to Equation 3.
where:

$$V_0(s[k]) = K_0 + \frac{K_1}{s[k]} + \frac{K_2}{s^2[k]} + \frac{K_3}{s^3[k]} + \frac{K_4}{s^4[k]} + K_5 s[k] + K_6 \ln(s[k]) + K_7 \ln(1 - s[k]) \quad (3)$$

s[k] is the SOC; and
$V_0(s[k])$ is the open circuit voltage (OCV);

The SOC module 422 includes a voltage drop model block 825. The voltage drop block 825 may be configured to calculate voltage drop across the load using the voltage drop model (discussed above) according to Equation 4 or 5.

$$Z_v[k] = V_o(x_s[k]) + a[k]^T b + n_D[k] \quad (4)$$

$$Z_v[k] = V_o(x_s[k]) + \hat{a}[k]^T \hat{b} + n_D[k] \quad (5)$$

where:
$Z_v[k]$ is the measured voltage;
$V_o(x_s[k])]$ is the open circuit voltage (OCV);
$a[k]^T$ is the voltage drop model;
b is the voltage drop model parameter vector;
$\hat{a}[k]^T$ is the estimated voltage drop model;
$\hat{b}$ is the estimated voltage drop model parameter vector; and
$n_D[k]$ is the voltage drop observation noise.

The voltage drop model may vary based on a selected equivalent circuit model as described above. The selected equivalent circuit model and/or the voltage drop model may be read from data store 855. For example data store 855 may include the equivalent model library 305.

The EKF (module or) block 805 may be configured to calculate the SOC 845 as an estimated SOC using Equation 1 and store the resultant SOC 845 in buffer 850. The EKF block 805 may be configured to calculate the SOC error 840 as an estimated SOC error (or variance) using Equation 2 and store the resultant SOC error 840 in buffer 850. The stored SOC and SOC error may be read as SOC 815 and SOC error 820 the stored SOC 845 and SOC error 840. Accordingly, the EKF block may calculate SOC 845 and SOC error 840 recursively (e.g., in a loop) such that a subsequent (update, next, and/or later in time) SOC 845 and SOC error 840 calculation may be based on at least one previous (current, last or earlier in time) SOC 815 and SOC error 820 calculation.

As shown in FIG. 8, recursive least squared (RLS) block 830 and total least squared (TLS) block 835 may generate inputs to the EKF block 805. The RLS block may generate an initial the estimated voltage drop model parameter vector (which may include at least one voltage drop model parameter) and the TLS block 835 may generate an initial estimated capacity. The initial the estimated voltage drop model parameter vector and the initial estimated capacity may be generated for each loop. In an example implementation, a change in the initial the estimated voltage drop model parameter vector and the initial estimated capacity may become negligible as the number of iterations (k) increases.

Figure 9:
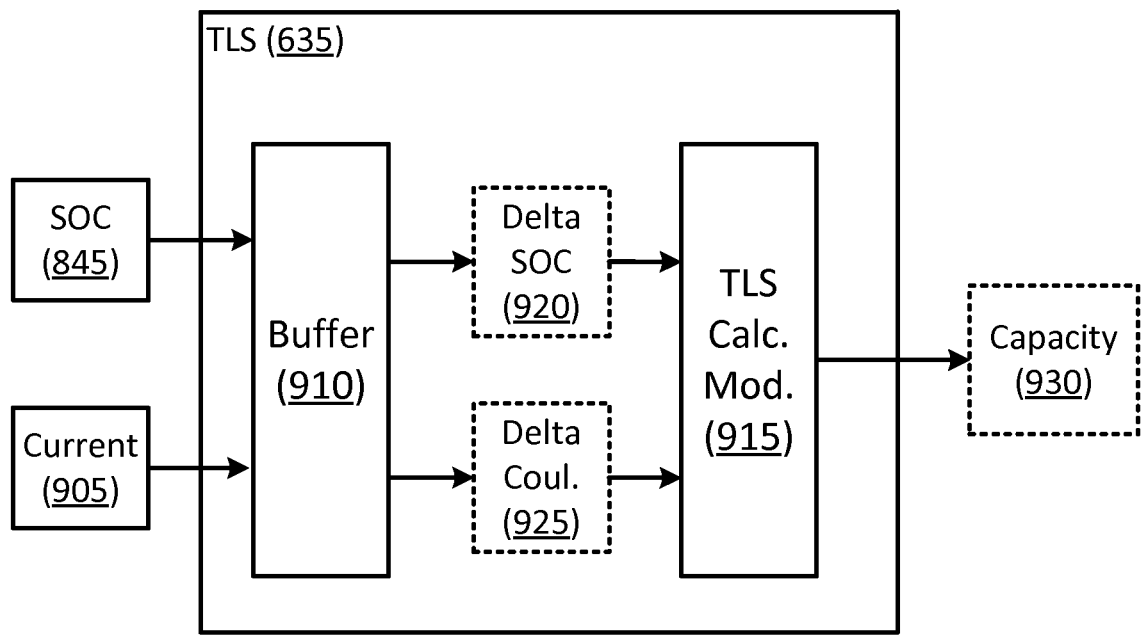
FIG. 9 illustrates a block diagram of a total least squared (TLS) module of the SOC module according to at least one example embodiment.

FIG. 9 illustrates a block diagram of a total least squared (TLS) block 835 of the SOC module 422 according to at least one example embodiment. As shown in FIG. 9, the TLS block 635 includes a buffer 910 and a TLS calculation module 915. The buffer 910 is configured to receive, store and output SOC data e.g., delta (or change in) SOC data 920 for use by the TLS calculation module 915. The buffer 910 is further configured to receive, store and output delta (or change in) coulomb data 925 use by the TLS calculation module 915. The buffer 910 may receive current data 905 as, for example, coulomb counting data based on measured current associated with the battery 105.

Figure 10:
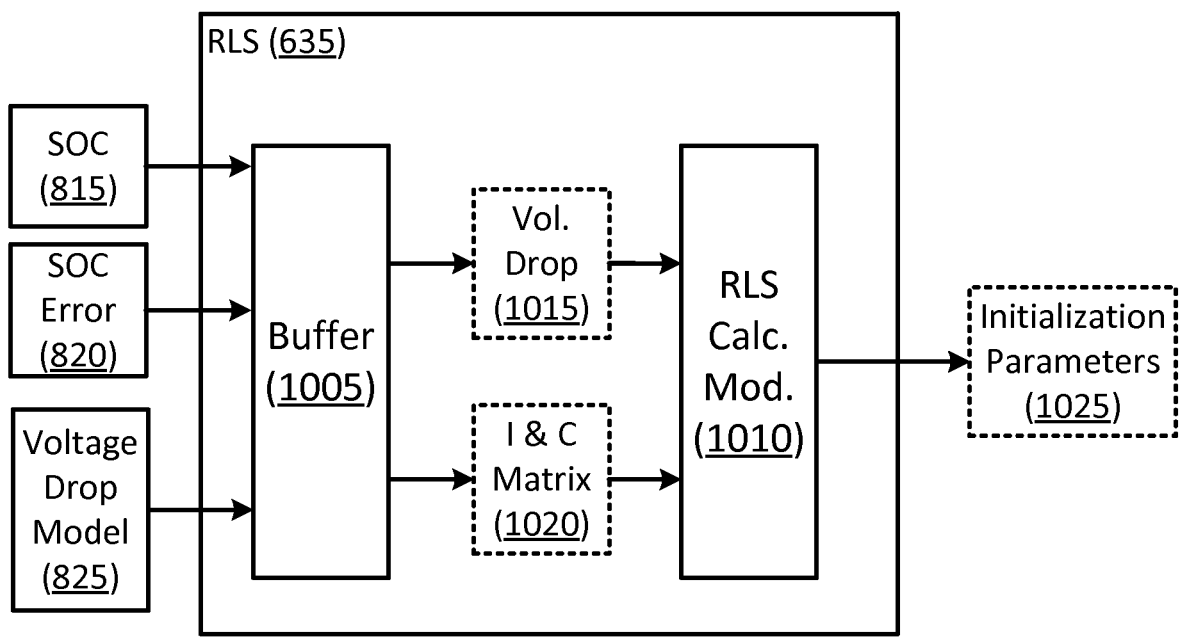
FIG. 10 illustrates a block diagram of a recursive least squared (RLS) module of the SOC module according to at least one example embodiment.

The TLS calculation module 915 may be configured to calculate capacity 930 of the battery 105 based on the delta SOC 920 and the delta coulomb 925. For example, the TLS calculation module 915 may calculate capacity 930 using Equation 6. Derivation of Equation 6 is shown in more detail below.

$$\hat{C}_{TLS}[k] = \frac{s_H^k(1,2)}{s_H^k(1,1) - \Delta^k(2,2)} \quad (6)$$

where:
$\hat{C}_{TLS}[k]$ is the estimated capacity;
$S_H^k(i,j)$ is the covariance of an augmented observation matrix; and
$\Delta^k(2,2)$ is a diagonal 2×2 matrix of non-negative eigenvalues;

FIG. 10 illustrates a block diagram of a recursive least squared (RLS) block 830 of the SOC module 422 according to at least one example embodiment. As shown in FIG. 10, the RLS block 635 includes a buffer 1005 and a RLC calculation module 1010. The buffer 1005 is configured to receive and store SOC 815, SOC error 820 and voltage drop data (e.g., Z[k] or OCV) as output from the voltage drop model block 825. The buffer 1005 is configured to output a voltage drop 1015 and a current and capacitance (I&C) matrix 1020.

The RLC calculation module 1010 may be configured to calculate initialization parameters 1025 based on the voltage drop 1015 and the (I&C) matrix 1020. For example, the RLC calculation module 1010 may calculate initialization parameters 1025 using Equation 7. Derivation of Equation 7 is shown in more detail below.

$$b = \begin{cases} b(1) \triangleq \alpha(k) = \alpha_1 + \alpha_2 \\ b(2) \triangleq \beta(k) = \alpha_1 + \alpha_2 \\ b(3) = R_0 \\ b(4) \triangleq \hat{R}_1 = (\alpha_1 + \alpha_2)R_0 - (1 - \alpha_1)R_1 - (1 - \alpha_2)R_2 \\ b(5) \triangleq \hat{R}_2 = (\alpha_1 \alpha_2)R_0 - \alpha_2(1 - \alpha_1)R_1 - \alpha_1(1 - \alpha_2)R_2 \\ b(6) \triangleq \hat{h}[k] = x_h[k] - \alpha(k)x_h[k+1] + \beta(k)x_h[k-2] \end{cases} \quad (7)$$

where:
$\alpha_i$ is the current decay coefficient in the $R_1C_1$ circuit;
$\beta_i$ is the current decay coefficient in the $R_2C_2$ circuit;
$\hat{R}_1$ is the estimated resistance value of $R_1$;
$\hat{R}_2$ is the estimated resistance value of $R_2$;
$\hat{h}[k]$ is the estimated hysteresis voltage of the battery; and
$x_h[k]$ is the instantaneous hysteresis;

Noting as described with regard to FIG. 7 above, estimated hysteresis voltage of the battery should be zero. Accordingly, in example implementations b(6) in Equation 7 should be zero using SOC tracking block 715 to remove (or substantially remove) error due to hysteresis using SOC tracking. Accordingly, the SOC estimate is more accurate because hysteresis may be accounted for.

In FIGS. 8-10, buffer 1005 length may be $L_b$ for parameter estimation and buffer 905 length may be $L_c$ for capacity estimation. The EKF block 805 iterates for every k whereas the RLS 830 iterates for every k which is an integer multiple of $L_b$, and TLS 835 iterates for every k which is an integer multiple of $L_c$ where k is the time index. The BFG estimates all the required model parameters and battery capacity required for SOC tracking except for the OCV parameters (that are estimated offline) and voltage and current measurement error standard deviations $\sigma_v$, $\sigma_i$ that come from the calibration of measurement instrumentation circuitry. The RLS blocks do not require any external initial conditions—just setting $\lambda=1$ provides a robust LS estimate as initializations, i.e., $\hat{b}_{RLS}[K_b]$ and $\hat{C}_{TLS}[K_c]$ where $$\kappa_b = \left\lfloor \frac{k}{L_b} \right\rfloor \text{ and } \kappa_c = \left\lfloor \frac{k}{L_c} \right\rfloor$$

are the batch numbers. The mathematical proof of the EKF block 805 is described below.

Figure 11:
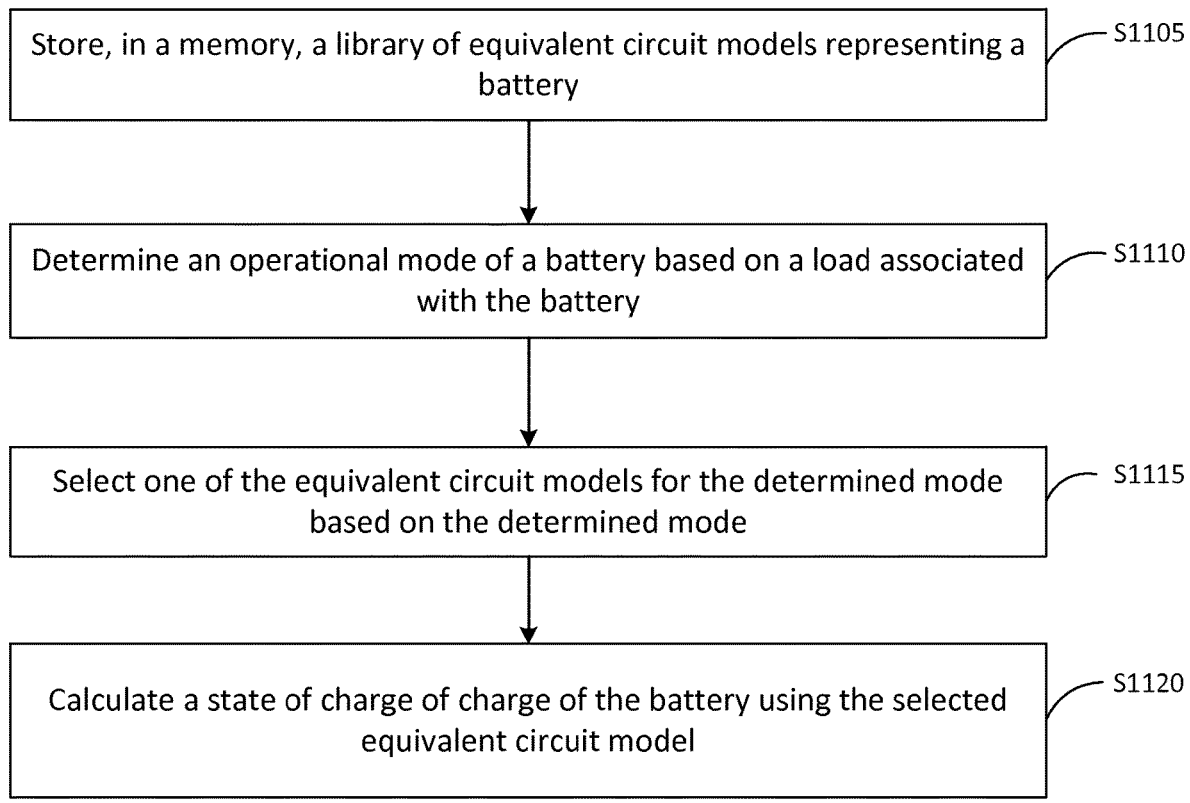
FIGS. 11 and 12 illustrate flowcharts of methods according to at least one example embodiment.
Figure 12:
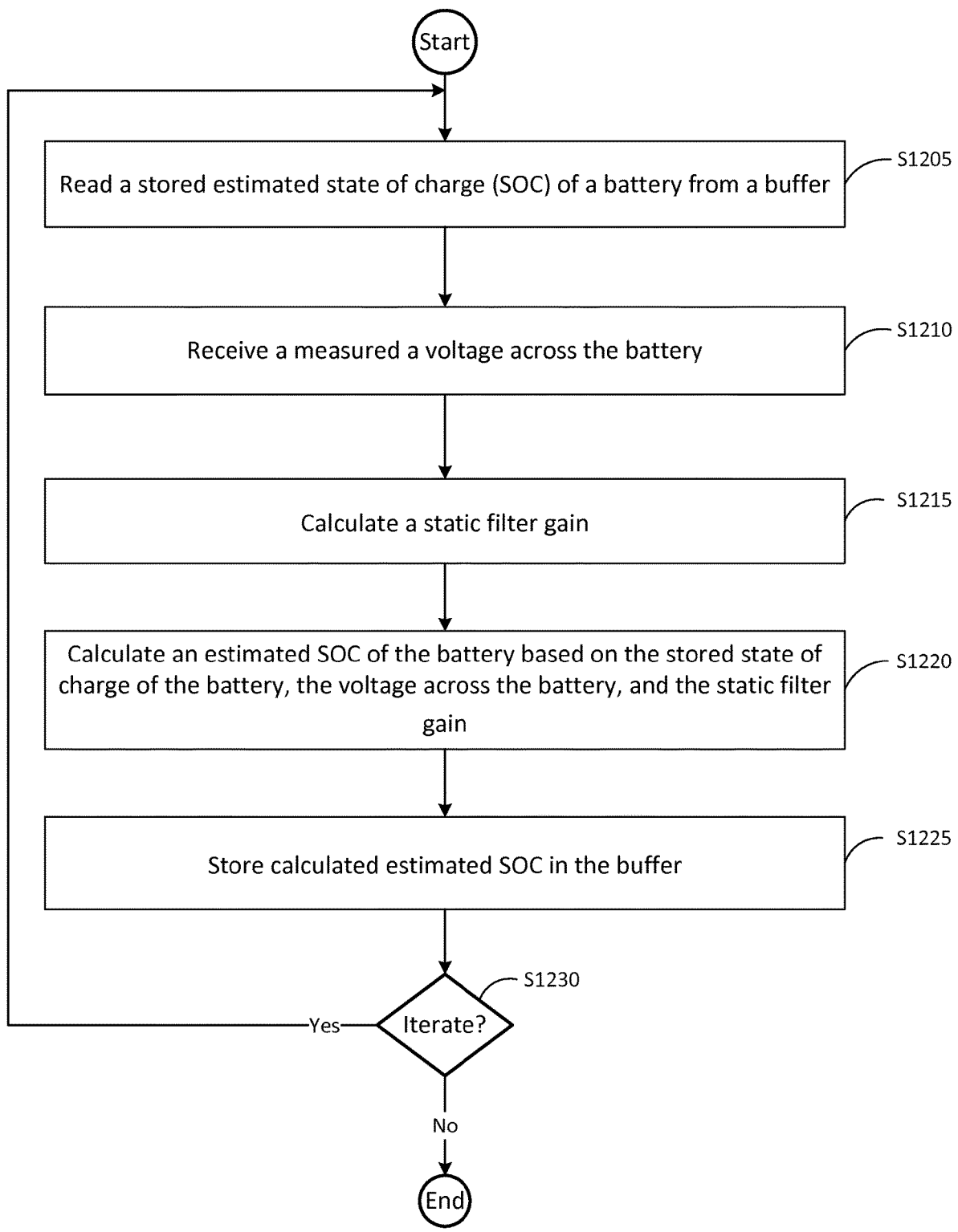

FIGS. 11 and 12 illustrate flowcharts of methods according to at least one example embodiment. The steps described with regard to FIGS. 11 and 12 may be performed due to the execution of software code stored in a memory (e.g., memory 230) associated with an apparatus (e.g., the BMS 110 as shown in FIGS. 1 and 2) and executed by at least one processor (e.g., processor 235) associated with the apparatus. However, alternative embodiments are contemplated such as a system embodied as a special purpose processor. Although the steps described below are described as being executed by, for example, a processor, the steps are not necessarily executed by a same processor. In other words, at least one processor may execute the steps described below with regard to FIGS. 11 and 12.

FIG. 11 illustrates a flowchart of a method for selecting an equivalent model representing a battery for use in calculating an estimated SOC. As shown in FIG. 11, in step S1105 a library of equivalent circuit models representing a battery is stored in a memory. For example, using the offline data collection module 555, data associated with battery 105 (or an equivalent battery) can be collected. Using the data and general circuit tools, at least one equivalent circuit representing the battery may be generated. The equivalent circuit may include any combination of at least one equivalent voltage, resistance, capacitance and/or impedance equivalent. See, for example, FIGS. 13A-13D below. A mathematical equivalent for each equivalent circuit can also be generated. The equivalent circuit and/or the mathematical equivalent may be stored in, for example, equivalent model library 305.

In step S1110 an operational mode of a battery is determined based on a load associated with the battery. For example, each equivalent model may be based on an operational mode of the battery (or an equivalent battery). The operational mode may be based on a load associated with the battery. For example, the operational mode may be based on the voltage drop across the load. For example, the operational mode may be based on whether or not the voltage drop across the load is relatively high or low, relatively constant or dynamic, and/or a combination thereof. Therefore, the operational mode may be determined based on a current and/or a voltage associated with the battery and/or a load associated with the battery.

In step S1115 one of the equivalent circuit models for the determined mode is selected based on the determined mode. For example, the equivalent model library 305 may be searched based on the determined operational mode. For example, the equivalent circuit and/or the mathematical equivalent representing the battery may be stored in equivalent model library 305 in correspondence with an operational mode identification (e.g., a unique name or a unique identification number). Accordingly, determining the operational mode may include determining an operational mode identification which is then used to search the equivalent model library 305. Selecting the equivalent circuit can include selecting the equivalent circuit or mathematical equivalent returned by the search of the equivalent model library 305.

In step S1120 a state of charge of charge (SOC), or an estimated SOC, of the battery is calculated using the selected equivalent circuit model. For example, as described above, calculating the SOC may be based on a voltage drop model parameter vector (b). The voltage drop model parameter vector may have parameters that are based on the equivalent circuit of the battery (see Equation 7 above). Accordingly, the determined voltage drop model parameter vector may more or less complex based on the equivalent circuit. For example, as described below, an equivalent circuit may not include RC circuit elements because the capacitor charges and bypasses the resistance. Accordingly, b(3) may be the only remaining voltage drop model parameter vector element. Thus simplifying the calculation of the SOC or estimated SOC. Further, a voltage across the battery 105 terminals v[k], which may be used in calculating the SOC or estimated SOC may be based on the equivalent circuit model. Equations relating v[k], SOC and the equivalent circuit model are described in more detail below.

FIG. 12 illustrates a flowchart of a method for calculating an estimated SOC using a recursive filter. As shown in FIG. 12, in step S1205 a stored estimated state of charge (SOC) of a battery is read from a buffer. For example, the buffer 850 may have stored in it at least one SOC error and SOC calculated in a previous iteration of the steps described with regard to this flowchart. At least one of the stored SOC values may be read from buffer 850.

In step S1210 a measured voltage across the battery is read. For example, a voltage (e.g., v[k] shown in FIGS. 13A-13D below) may be read or determined using, for example, digital amplifier 215. In one example implementation, the voltage is stored in a buffer. Accordingly, different iterations can use different voltage measurements. In other words, a previous (in time) voltage measurement can be used in a current iteration or v[k+1] could be used in iteration k+2.

In step S1215 a filter gain is calculated. For example, as described briefly above and in more detail below, filter gain for the EKF block 805 (e.g., G[k+1]) is calculated. Filter gain may be based on at least one capacity value calculated using a weighted least squared algorithm. For example, filter gain may be based on at least one capacity value calculated using at least one of a weighted recursive least squared (RLS) algorithm and a total least squared (TLS) algorithm. Filter gain may be based on a capacity value calculated using a weighted RLS algorithm based on a SOC tracking error covariance and a current measurement error standard deviation. Filter gain may be based on an estimated SOC variance. Filter gain may be based on a capacity value calculated using a TLS algorithm based on a recursive updating of a covariance matrix. Filter gain may be based on a capacity value calculated using an open circuit voltage (OCV) look-up. Each of the SOC tracking error covariance, current measurement error standard deviation, SOC variance, covariance matrix and OCV are described in more detail (e.g., mathematically) below.

In step S1220 an estimated SOC of the battery is calculated based on the stored SOC of the battery, the voltage across the battery, and the filter gain. For example, the estimated SOC may be equal to the filter gain times the digital voltage value plus the stored estimated SOC. In step S1225 the calculated estimated SOC is stored in the buffer (e.g., buffer 850). If further calculating of the estimated SOC is necessary and/or desired (S1230), processing returns to step S1205. For example, further calculations may be necessary and/or desired if the battery 105 is in continual use, if SOC error exceeds a desired value and further iterations may reduce the error, a battery test is in process and/or the like.

FIGS. 13A-13D illustrate schematic diagrams of battery equivalent models according to at least one example embodiment. FIGS. 13A-13D will be referred to as necessary below to describe one or more example implementations. As shown in FIGS. 13A-13D, equivalent models representing a battery 1300-1, 1300-2, 1300-3, 1300-4 may include any combination of resistors 1315, 1325, 1340, capacitors 1330, 1345 and equivalent voltage sources 1305, 1310. Voltage 1355 represents the voltage drop across the battery when loaded. Currents 1320, 1335 and 1350 represent current flowing through (or to) an element of the equivalent model. For example, current 1350 represents the current flowing to a load.

A resistor and a capacitor may define an RC circuit. For example, resistor 1325 and 1330 define an RC circuit. In some example implementations, a capacitor may be fully charged and short causing an RC circuit to effectively disappear from the equivalent model. For example, in equivalent model representing a battery 1300-2 the RC circuit defined by resistor 1340 and capacitor 1345 is not in the model because capacitor 1345 is fully charged forming a short circuit. In some example embodiments there is no (or minimal) hysteresis associated with the battery (e.g., the battery is at rest or drawing minimal load). Therefore, as shown in equivalent model representing a battery 1300-4 equivalent voltage source 1310 is not in the model because of the lack of hysteresis.

This disclosure continues by describing details of example implementations. The details may include development (e.g., mathematical proof or simplification) of at least one of the above equations. The equations may be repeated for clarity, however, the equations will retain the equation number shown in a bracket ([ ]). Beginning with real time model identification, which may reference the following notations.

$a[k]^T$ Observation model
$A^\kappa$ Consecutive observations of $a[k]^T$ in batch $\kappa$, stacked in a matrix
$b[k]$ Observation model parameter
$\hat{b}_{RLS}[\kappa]$ LS estimate of model parameters
$\hat{b}_{RLS}[\kappa]$ RLS estimate of model parameter
$i[k]$ Current through the battery
$K_i$ OCV parameters: $K_0, K_1, K_2, K_3, K_4, K_5, K_6, K_7$
$L_b$ Length of batch for parameter estimation
$n_i[k]$ Current measurement error
$n_v[k]$ Voltage measurement error
$P_b[\kappa]$ Covariance matrix of the LS estimator
$R_0$ Battery internal series resistance
$R_1$ Battery internal resistance in $R_1C_1$ circuit
$R_2$ Battery internal resistance in $R_2C_2$ circuit
$v[k]$ Voltage across the battery $v_D[k]$ Voltage drop
$v^\kappa_D$ $k^{th}$ batch of consecutively observed voltage drops in vector form
$V_D[z]$ z—transform of the voltage drop
$x_{i_1}[k]$ Current through $R_1$
$x_{i_2}[k]$ Current through $R_2$
$x_s[k]$ State of charge (SOC) s[k]
$\hat{x}_s[k]$ Estimate of $x[k]$
$z_i[k]$ Measured current through the battery
$z_v[k]$ Measured voltage across the battery
$\Delta$ Sampling time
$\varepsilon_{b_i}(k)$ LS fitting error
$\varepsilon_{C_i}[k]$ Percentage estimation error of $C_i$
$\varepsilon_{R_i}[k]$ Percentage estimation error of $R_i$
$\Sigma_D^\kappa$ Voltage drop observation noise covariance Elements of an SOC tracking algorithm may include:
  a. Estimation of the OCV parameters: The OCV-SOC characterization is stable over temperature changes and aging of the battery when normalized by age and age dependent battery capacity.
  b. Estimation of the dynamic electrical equivalent circuit parameters: These parameters have been observed to vary with temperature, SOC and age of the battery and hence should be adaptively estimated while the BFG is operational.
  c. Estimation of battery capacity: Even though the nominal capacity of the battery is specified by the manufacturer, the usable battery capacity is known to vary due to errors in the manufacturing process, temperature changes, load patterns, and aging.
  d. Model parameter-conditioned SOC tracking: Once the model parameters are known, the SOC tracking becomes a nonlinear filtering problem.

Example embodiments allow for the real time, linear estimation of dynamic equivalent circuit parameters for batteries. Improving existing approaches for battery equivalent circuit modeling and parameter estimation are accomplished in this example implementation by addressing the following issues:
  a. Some models consider resistance-only and are unsuitable for dynamic loads.
  b. They employ nonlinear approaches for system identification.
  c. Require initial parameter estimates for model identification methods
  d. A single dynamic equivalent model is assumed to represent all battery modes of operation In this example implementation, the above four issues are addressed and summarized below as:
  a. An online, linear approach for model parameter estimation without estimating the parameters of the exact physical representation of the battery equivalent circuit. SOC tracking state-space model leverages an estimation of modified parameters that can be linearly estimated.
  b. Applicability to wide variety of batteries without requiring any initialization values or calibrations: Due to the adaptability of the example state-space model, the proposed SOC tracking approach does not require any offline initializations of model parameters. A least squares (LS) method provides initializations (or re-initializations) of parameters whenever required and a block recursive least squares (RLS) is employed to continuously track the model parameters. Further, a modified open circuit voltage (OCV) model is shown to be valid across different battery models, different temperatures and different load conditions. This allows an example BFG to be applicable in a plug-and-play fashion on a wide range of batteries without requiring any other additional information about them.

c. Possibility for seamless SOC tracking through different modes of the battery. Four different battery equivalent models may be identified in order to reflect very light loading or rest state, constant current or low frequency loading, dynamic loads and varying heavy loads. Four (slightly) different dynamic equivalent models are identified in order to best match these modes as well. These models can be used for seamless SOC tracking regardless of the mode changes in the battery operation.

d. Hysteresis modeling which obviates the need for hysteresis modeling: Example implementations recognize that it is nearly impossible to model hysteresis offline (perfectly) because hysteresis is a function of SOC∈[0 1] and load current I∈R. Therefore, according to example embodiments, in a voltage drop model, the hysteresis is modeled as the error in the OCV and the online filtering approach continuously tries to fill the gap by adjusting SOC (to the correct value.)

Figure 13A:
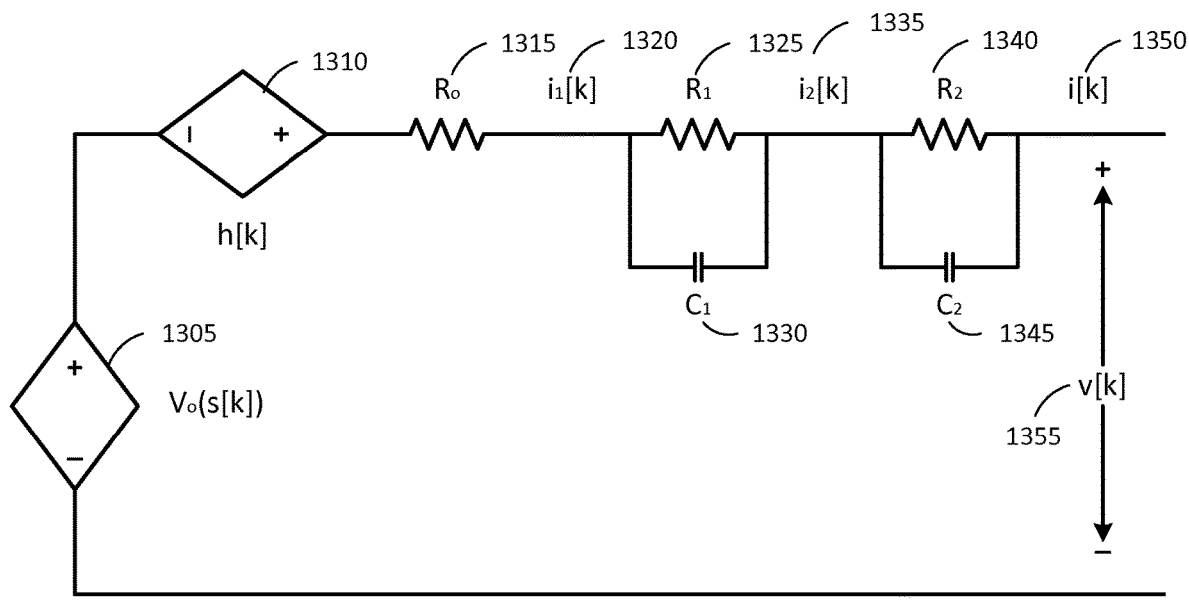
FIGS. 13A-13D illustrate schematic diagrams of battery equivalent models according to at least one example embodiment.

Real time model identification includes real time model parameter estimation using equivalent circuits. FIG. 13A is an equivalent circuit of an example battery (e.g., battery 105). When the battery is at rest, $V_0(s[k])$ is the OCV of the battery. The OCV uniquely depends on the SOC of the battery, $s[k] \in [0,1]$. When the battery is active, for example, when there is current activity, the behavior of the battery is represented through the dynamic equivalent circuit consisting of a hysteresis component h[k], a series resistance $R_0$ and two parallel RC circuits in series, $(R_1, C_1)$ and $(R_2, C_2)$. The discrete time is indicated using [k].

In FIG. 13A, the measured current through the battery is written as:

$$z_i[k] = i[k] + n_i[k] \quad (8)$$

where i[k] is the true current through the battery and $n_i[k]$ is the current measurement noise which is assumed to be zero mean and has standard deviation (s.d.) $\sigma_i$. The measured voltage across the battery is:

$$z_v[k] = v[k] + n_v[k] \quad (9)$$

where v[k] is the true voltage across the battery and $n_v[k]$ is the voltage measurement noise which is assumed to be zero mean with s.d. $\sigma_v$.

Writing the voltage drop of the battery across the internal components $R_0$, $R_1$, $R_2$ and h[k] in the following form:

$$v_D[k] \triangleq z_v[k] - V_0[s[k]] = i[k]R_0 + x_{i_1}[k]R_1 + x_{i_2}[k]R_2 + x_h[k] + n_v[k] \quad (10)$$

where the currents through the resistors $R_1$ and $R_2$ can be written in the following form $$x_{i_1}[k+1] \triangleq i_1[k+1] = \alpha_1 i_1[k] + (1-\alpha_1)i[k] \quad (11)$$

$$x_{i_2}[k+1] \triangleq i_2[k+1] = \alpha_2 i_2[k] + (1-\alpha_2)i[k] \quad (12)$$

where, $$\alpha_1 \triangleq e - \frac{\Delta}{R_1 C_1}; \quad (13)$$

$$\alpha_2 \triangleq e - \frac{\Delta}{R_2 C_2}; \text{ and} \quad (14)$$

$\Delta$ is the sampling interval.

By substituting the measured current $z_i[k]$ for i[k], the currents in (11) and (12) can be rewritten as follows:

$$x_{i_1}[k+1] = \alpha_1 x_{i_1}[k] + (1-\alpha_1)z_i[k] - (1-\alpha_1)n_i[k] \quad (15)$$

$$x_{i_2}[k+1] = \alpha_2 x_{i_2}[k] + (1-\alpha_2)z_i[k] - (1-\alpha_2)n_i[k] \quad (16)$$

Now, using (8), (10) can be rewritten in the z-domain as follows:

$$V_D[z] = Z_i[z]R_0 + X_{i_1}[z]R_1 + X_{i_2}[z]R_2 + X_h[z] + N_v[z] - R_0 N_i[z] \quad (17)$$

Next, rewriting (15) in z-domain:

$$zX_{i_1}[z] = \alpha_1 X_{i_1}[z] + (1-\alpha_1)Z_i[z] - (1-\alpha_1)N_i[z] \quad (18)$$

which yields $$X_{i_1}[z] = \frac{1-\alpha_1}{z-\alpha_1}(Z_i[z] - N_i[z]) \quad (19)$$

and similarly for (16), $$X_{i_2}[z] = \frac{1-\alpha_2}{z-\alpha_2}(Z_i[z] - N_i[z]) \quad (20)$$

By substituting (19) and (20) into (17):

$$V_D[z] = Z_i[z]R_0 + \frac{1-\alpha_1}{z-\alpha_1}Z_i[z]R_1 + \frac{1-\alpha_2}{z-\alpha_2}Z_i[z]R_2 + X_h[z] + N_v[z] - \left(R_0 + \frac{1-\alpha_1}{z-\alpha_1}R_1 + \frac{1-\alpha_2}{z-\alpha_2}R_2\right)N_i[z] \quad (21)$$

Rearranging (21) and converting it back to time domain:

$$v_D[k] = \alpha v_D[k-1] - \alpha v_D[k-2] + R_0 z_i[k] + \check{R}_1 z_i[k-1] - \check{R}_2 z_i[k-2] + \bar{h}[k] + \bar{n}_i[k] + \bar{n}_v[k] \quad (22)$$

where, $$\alpha = \alpha_1 + \alpha_2, \quad (23)$$

$$\beta = \alpha_1 \alpha_2, \quad (24)$$

$$\check{R}_1 = (\alpha_1 + \alpha_2)R_0 - (1-\alpha_1)R_1 - (1-\alpha_2)R_2, \quad (25)$$

$$\check{R}_2 = \alpha_1 \alpha_2 R_0 - \alpha_2(1-\alpha_1)R_1 - \alpha_1(1-\alpha_2)R_2, \quad (26)$$

$$\bar{h}[k] = x_h[k] - \alpha x_h[k-1] + \beta x_h[k-2], \quad (27)$$

$$\bar{n}_v[k] = n_v[k] - \alpha n_v[k-1] + \beta n_v[k-2], \text{ and} \quad (28)$$

$$\bar{n}_i[k] = -R_0 n_i[k] + \check{R}_1 n_i[k-1] - \check{R}_2 n_i[k-2]. \quad (29)$$

Figure 13B:
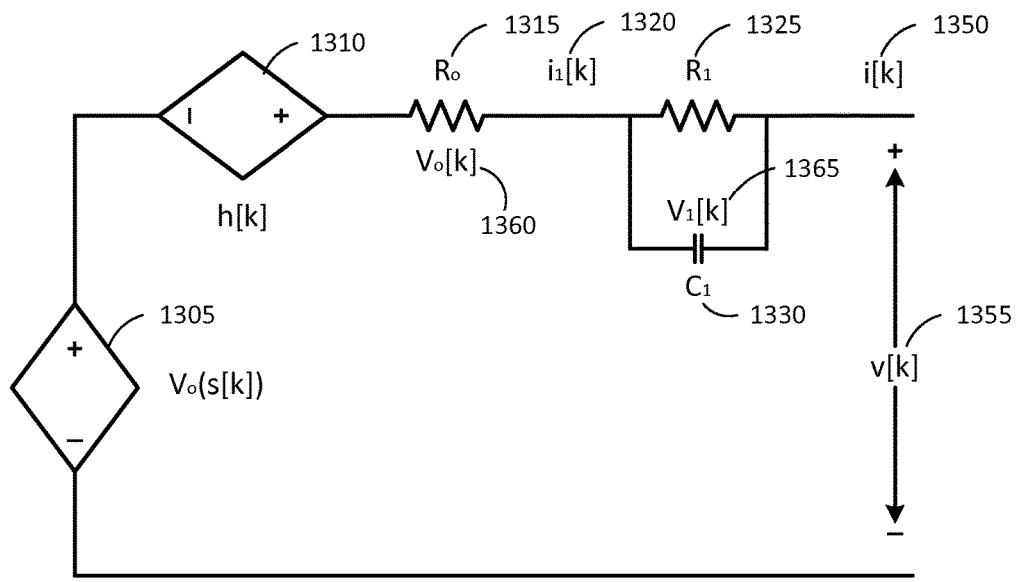

Now, rewriting (22) in the following form:

$$v_D[k] = [k]^T + n_D[k] \quad (30)$$

where the observation model $a[k]^T$ and the model parameter vector b are given by:

$$a[k]^T = \quad (31)$$
$$4^{[k]^T} \triangleq [\, v_D[k-1] \;\; -v_D[k-2] \;\; z_i[k] \;\; z_i[k-1] \;\; -z_i[k-2] \;\; 1 \,]$$

$$b = 4 \triangleq [\, \alpha \;\; \beta \;\; R_0 \;\; \check{R}_1 \;\; \check{R}_2 \;\; H \,]^T \quad (32)$$

where the subscript 4 indicates the above model corresponding to Model 4 of the four models shown in FIGS. 13A-13B.

The noise in the voltage drop observation in (30) is written as:

$$n_D[k] \triangleq \bar{n}_i[k] + \bar{n}_v[k] \quad (33)$$

which has autocorrelation given by:

$$R_{n_D}(l) \cong E\{n_D[k]n_D[k-l]\} = \quad (34)$$

$$\begin{cases} (1+\alpha^2+\beta^2)\sigma_v^2 + (R_0^2 + \breve{R}_1^2 + \breve{R}_2^2)\sigma_i^2 & |l|=0 \\ -\alpha(1+\beta)\sigma_v^2 - \breve{R}_1(R_0 + \breve{R}_2)\sigma_i^2 & |l|=1 \\ \beta\sigma_v^2 + R_0\breve{R}_2\sigma_i^2 & |l|=2 \\ 0 & |l|>2 \end{cases}$$

and it is assumed that the hysteresis component is a constant during the batch of time intervals of length $L_b$, for example, $$\bar{h}[l] = x_h[l] - (\alpha_1+\alpha_2)x_h[l-1] + \alpha_1\alpha_2 x_h[l-2] \approx H, l = k-L_b+1, \ldots, k \quad (35)$$

Now, four different "modes" of battery operations and appropriate battery equivalent models that match these modes can be described.

a. Mode 1—Light loading or rest state: When the battery undergoes only light loading and then followed by charging and then resting, the hysteresis component will be negligibly small. An example of this mode will be a cellular phone that, after being fully charged, spends almost all its time until the next charging event pinging the tower except for the possibility of few phone calls. A single resistor (see FIG. 13D), fits this mode well.

b. Mode 2—Constant current operation: When the current through the battery is constant, the capacitors in the RC circuits become fully charged. As a result, from a parameter estimation point of view, the resultant circuit can be considered as a single resistor and a hysteresis/bias component (see FIG. 13C). The constant current charging of the battery is a good example for this mode.

c. Mode 3—Dynamic loading: When the battery is in this mode, there is significant load of differing magnitudes. Example: a smart phone that is being regularly used for phone calls, web browsing, video clips etc. The battery equivalent shown in FIG. 13B fits this scenario well.

d. Mode 4—Heavy and varying usage: For a mobile phone, heavy and varying usage includes prolonged video play, multimedia and gaming applications, etc. FIG. 13A fits this scenario well.

Note that different model complexities of the dynamic equivalent circuit can be represented by changing only $[k]^T$. The definitions of $[k]T$ and for each model are shown below. For each of the above model complexities, the noise term $n_D[k]$ is expressed in terms of $\bar{n}_i[k]$ and $\bar{n}_v[k]$ as follows:

$$\bar{n}_v[k] = \begin{cases} n_v[k] & \text{Model 1} \\ n_v[k] & \text{Model 2} \\ n_v[k] - \alpha_1 n_v[k-1] & \text{Model 3} \\ n_v[k] - (\alpha_1+\alpha_2)n_v[k-1] + \alpha_1\alpha_2 n_v[k-2] & \text{Model 4} \end{cases} \quad (36)$$

$$\bar{n}_i[k] = \begin{cases} -R_0 n_i[k] & \text{Model 1} \\ -R_0 n_i[k] & \text{Model 2} \\ -R_0 n_i[k] + \tilde{R}_1 n_i[k-1] & \text{Model 3} \\ -R_0 n_i[k] + \breve{R}_1 n_i[k-1] - \breve{R}_2 n_i[k-2] & \text{Model 4} \end{cases} \quad (37)$$

where, $$\alpha = \alpha_1 + \alpha_2 \quad (38)$$

$$\beta = \alpha_1 \alpha_2 \quad (39)$$

$$\tilde{R}_1 = \alpha_1 R_0 - (1-\alpha_1)R_1 \quad (40)$$

The following discussion relates to least squared estimation of time-invariant dynamic model parameters. Denoting the true SOC at time k as:

$$x_S[k] \triangleq s[k] \quad (41)$$

An SOC tracking algorithm developed can be used to obtain $\hat{x}_s[k|k]$, an updated estimate of $x_s[k]$. Now, the voltage drop $v_D[k]$ in (10) can be written as:

$$v_D[k] = z_v[k] - V_0(\hat{x}_s[k|k]) \quad (42)$$

where $V_0(\hat{x}_s[k|k])$ denotes the estimated open circuit voltage (OCV) of the battery which can be described as a function of estimated SOC. The following OCV-SOC relationship may be adopted:

$$V_0(\hat{x}_s[k|k]) = K_0 + \frac{K_1}{\hat{x}_s[k|k]} + \frac{K_2}{\hat{x}_s[k|k]^2} + \frac{K_3}{\hat{x}_s[k|k]^3} + \frac{K_4}{\hat{x}_s[k|k]^4} + K_5\hat{x}_s[k|k] + K_6\ln(\hat{x}_s[k|k]) + K_7\ln(1-\hat{x}_s[k|k]) \quad (43)$$

The OCV parameters $K_i \in \{K_0, K_1, K_2, K_3, K_4, K_5, K_6, K_7\}$ can be estimated offline through the procedure described in in detail below. By considering a batch of $L_b$ observations, (30) can be rewritten as follows:

$$v_D^\kappa = A^\kappa + n_D^\kappa \quad (44)$$

where κ is the batch number, $$v_D^\kappa = [v_D[\kappa L_b - L_b + 1] v_D[\kappa L_b - L_b + 2] \ldots v_D[\kappa L_b]]^T \quad (45)$$

$$A^\kappa = [[\kappa L_b - L_b + 1][\kappa L_b - L_b + 2] \ldots [\kappa L_b]]^T \quad (46)$$

and the noise $n_D^\kappa$ has the following covariance $$\Sigma_D^\kappa = E\{n_D^\kappa n_D^{\kappa T}\} \quad (47)$$

where $\Sigma_D^\kappa$ is a pentadiagonal Toeplitz matrix for which the diagonal, first and second off diagonal entries are given by $R_{n_D}(0)$, $R_{n_D}(1)$ and $R_{n_D}(2)$, respectively (see (32)). Now, the dynamic model parameter vector can be estimated from (42) through least squares (LS) optimization as follows:

$$\hat{b}_{LS}[\kappa] = ((A^\kappa)^T (\Sigma_D^\kappa)^{-1} A^\kappa)^{-1} A^{\kappa T} (\Sigma_D^\kappa)^{-1} v_D^\kappa \quad (48)$$

The covariance matrix of the LS estimator is given by:

$$P_b[\kappa] = ((A^\kappa)^T (\Sigma_D^\kappa)^{-1} A^\kappa)^{-1} \quad (49)$$

When new batch of measurements are obtained, the LS estimates can be recursively updated by repeating (50)-(51)

$$P_b^{-1}[\kappa+1] = \lambda P_b^{-1}[\kappa] + (A^{\kappa+1})^T (\Sigma_D^\kappa)^{-1} A^{\kappa+1} \quad (50)$$

$$\hat{b}_{RLS}[\kappa+1] = P_b[\kappa+1](\lambda P_b^{-1}[\kappa]\hat{b}_{RLS}[\kappa] + (A^{K+1})^T(\Sigma_D^\kappa)^{-1}v_D^{K+1}) \quad (51)$$

where $\lambda$ is the forgetting (fading memory) factor, $(\bullet)^T$ denotes transpose, $(\bullet)^{-1}$ denotes inverse and $P_b^{-1}[\kappa]$ is known as the information matrix that can be initialized with an identity matrix of appropriate size multiplied by a suitable constant. It can be noticed that when $\lambda=0$, $\hat{b}_{RLS}$ becomes $\hat{b}_{LS}$. There can be several ways of approximating. The following two approximations may be selected for comparison:

a. The following approximation can be made:

$$\Sigma_D^\kappa \approx I_{l_b} \quad (52)$$

b. Use the previous estimate of in order to construct the current covariance matrix, for example, use:

$$\hat{b}_{RLS}[K-1] \text{ in } \Sigma_D^\kappa \quad (53)$$

The following discussion relates to minimum mean square error (MMSE) estimation of time-varying dynamic model parameters. Assuming the dynamic model parameters to be random variables that undergo the following slowly changing Wiener process:

$$x_b[k+1] = x_b[k] + w_b[k] \quad (54)$$

where $w_b[k]$ is zero mean white Gaussian noise with covariance $\Sigma_b$. Now, using (30) as the measurement model and (53) as the process model, a Kalman filter gives the MMSE estimate of b. SOC may be used to determine $v_D[k]$ (see (42)) an iterative scheme of SOC tracking/smoothing and Kalman filtering based parameter estimation over a sufficient length observation window could be used for increased accuracy in SOC tracking and parameter estimation.

The following discussion relates to open circuit voltage (OCV) parameter estimation. SOC estimation may exploit a unique and stable relationship between the open circuit voltage (OCV) and SOC of the battery and allows computation the SOC for a measured OCV. However, it is possible to directly measure the OCV only when the battery is at rest. When the battery is in use, the dynamic relationship between the battery voltage and current has to be accounted for through parameter and state estimation approaches. The OCV-SOC based state of charge estimation approach includes error associated with (1) uncertainty in the modeling and parameter estimation of the dynamic electrical equivalent model of the battery; and (2) errors in measured voltage and current. The parameters of the OCV-SOC characterization in (43) can be estimated by collecting OCV characterization data on a sample battery as follows:

a. Start with a fully charged, fully rested battery
b. Record its open circuit voltage $V_{batt}=V_{full}$
c. Set k=1
d. Record $v[k]=V_{batt}$; Record SOC[k]=1
e. Set k=k+1
f. Continuously discharge the battery using a very small amount of (typically, C/30 or C/40 where C is the capacity of the battery in Ah) constant current i[k] until the battery is completely discharged. Once fully discharged, leave the battery to rest and after that charge until the battery becomes full. Then
  1. Measure the battery terminal voltage, $V_{batt}$ every $\Delta$ seconds
  2. Record $v[k]=V_{batt}$
g. Record $SOC[k]=SOC[k-1]+c_{b,i}i[k]\Delta$ Now, OCV model (43) can be expressed in the following vector format for all the measurements v[k]:

$$v = A_{ocv}k \quad (55)$$

where $$v = [v[1], v[2] \ldots, v[N_v]]^T \quad (56)$$

$$A_{ocv} = [a_{ocv}(1), a_{ocv}(2), \ldots, a_{ocv}(N_v)]^T \quad (57)$$

$$k = [K_0 K_1 K_2 K_3 K_4 K_5 K_6 K_7 R_0]^T \quad (58)$$

and by assigning s[k]=SOC[k]

$$a_{ocv}[k] = \quad (59)$$
$$\left[ 1 \quad \frac{1}{s[k]} \quad \frac{1}{s^2[k]} \quad \frac{1}{s^3[k]} \quad \frac{1}{s^4[k]} \quad s[k] \quad \ln(s[k]) \quad \ln(1-s[k]) \quad i[k] \right]^T$$

Now, the least square estimation of the OCV parameters and the battery internal resistant $R_0$ are given by:

$$\hat{k} = (A_{ocv}^T A_{ocv})^{-1} A_{ocv}^T v \quad (60)$$

The following discussion relates to four exemplary equivalent circuit models.

TABLE 1

Figure 13C:
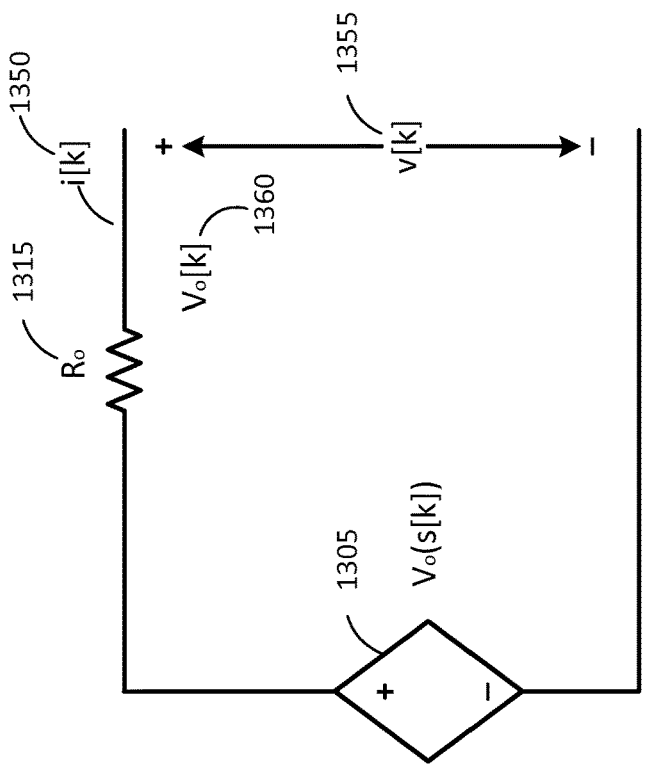
Figure 13D:
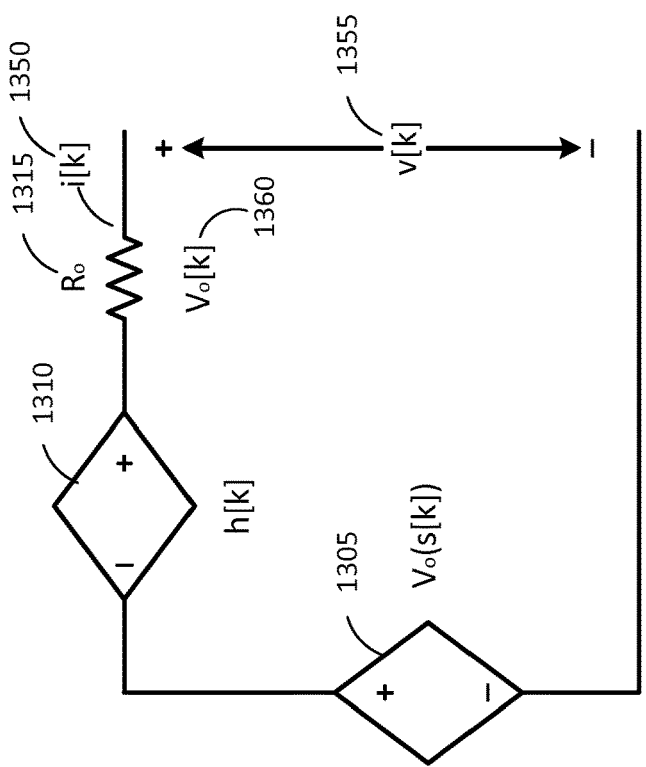

| Model Number | Equivalent Circuit |
|---|---|
| Model 1 | FIG. 13D |
| Model 2 | FIG. 13C |
| Model 3 | FIG. 13B |
| Model 4 | FIG. 13A |

The voltage drop across the circuit components of each of the four equivalent circuit models shown in Table 1 can be written in the following form:

$$v_D[k] = [k]^T[k] + n_D[k] \quad (61)$$

where, $$a[k]^T = \quad (62)$$
$$\begin{cases} a_1^T[k] \cong z_i[k] & \text{Model 1} \\ a_2^T[k] \cong z_i[k] & \text{Model 2} \\ a_3^T[k] \cong [v_D[k-1]z_i[k] - z_i[k-1]1] & \text{Model 3} \\ a_4^T[k] \cong [v_D[k-1] - v_D[k-2]z_i[k] - z_i[k-1]1z_i[k-2]1] & \text{Model 4} \end{cases}$$

$$b = \begin{cases} b_1[k] \cong R_0 & \text{Model 1} \\ b_2[k] \cong [R_0 \ H]^T & \text{Model 2} \\ b_3[k] \cong [\alpha_1 \ R_0 \ \tilde{R}_1 \ \tilde{H}]^T & \text{Model 3} \\ b_4[k] \cong [\alpha \ \beta \ R_0 \ \check{R}_1 \ \check{R}_2 \ \check{H}]^T & \text{Model 4} \end{cases} \quad (63)$$

$$\tilde{R}_1 = \alpha_1 R_0 - (1-\alpha_1)R_1 \quad (64)$$

$$\tilde{H} = h[k] - \alpha_1 h[k-1] \quad (65)$$

and, for model 4:

$$\alpha = \alpha_1 + \alpha_2 \quad (66)$$

$$\beta = \alpha_1 \alpha_2 \quad (67)$$

$$\check{R}_1 = (\alpha_1+\alpha_2)R_0 - (1-\alpha_1)R_1 - (1-\alpha_2)R_2 \quad (68)$$

$$\check{R}_2 = \alpha_1\alpha_2 R_0 - \alpha_2(1-\alpha_1)R_1 - \alpha_1(1-\alpha_2)R_2 \quad (69)$$

$$\check{H} = h[k] - (\alpha_1+\alpha_2)h[k-1] + \alpha_1\alpha_2 h[k-2] \quad (70)$$

The following relates to a derivation of the noise correlation. In this section the autocorrelation (27) for |l|=0,1,2 and for |l|>2 may be derived from (33) the following:

$l = 0$: $R_{n_D}(0) =$ (71)

$$E\{n_D[k]n_D[k]\} = E\Big\{\big\{n_v^2[k] + \alpha^2 n_v^2[k-1] + \beta^2 n_v^2[k-2] + R_0^2 n_i^2[k] + \breve{R}_1^2 n_i^2[k-1] + \breve{R}_2^2 n_i^2[k-2]\big\}\Big\}$$

$$= (1 + \alpha^2 + \beta^2)\sigma_v^2 + \big(R_0^2 + \breve{R}_1^2 + \breve{R}_2^2\big)\sigma_i^2 \quad (72)$$

$l = 1$: $R_{n_D}(1) = E\{n_D[k]n_D[k-1]\} =$ (73)

$$E\Big\{\big(-\alpha n_v[k-1] + \beta n_v[k-2] + \breve{R}_1 n_i[k-1] - \breve{R}_2 n_i[k-2]\big)$$
$$\big(n_v[k-1] - \alpha n_v[k-2] - R_0 n_i[k-1] + \breve{R}_1 n_i[k-2]\big)\Big\} =$$
$$E\big\{-\alpha n_v^2[k-1] - \alpha\beta n_v^2[k-2] - R_0\breve{R}_1 n_i^2[k-1] -$$
$$\breve{R}_1\breve{R}_2 n_i^2[k-2]\big\} = -\alpha(1+\beta)\sigma_v^2 - \breve{R}_1\big(R_0 + \breve{R}_2\big)\sigma_i^2$$

$l = 2$: $R_{n_D}(2) = E\{n_D[k]n_D[k-2]\} =$ (74)

$$E\Big\{\big(\beta n_v[k-2] - \breve{R}_2 n_i[k-2]\big)\big(n_v[k-2] - R_0 n_i[k-2]\big)\Big\} =$$
$$E\big\{\beta n_v^2[k-2] + R_0 \breve{R}_2 n_i^2[k-2]\big\} = \beta\sigma_v^2 + R_0\breve{R}_2\sigma_i^2$$

Now, the above can be expressed for each models as follows:

$$R_{n_D}(0) = \begin{cases} \sigma_v^2 + R_0^2\sigma_i^2 & \text{Model 1} \\ \sigma_v^2 + R_0^2\sigma_i^2 & \text{Model 2} \\ (1+\alpha_1^2)\sigma_v^2 + \big(R_0^2 + \breve{R}_1^2\big)\sigma_i^2 & \text{Model 3} \\ (1+\alpha^2+\beta^2)\sigma_v^2 + \big(R_0^2 + \breve{R}_1^2 + \breve{R}_2^2\big)\sigma_i^2 & \text{Model 4} \end{cases}$$ (75)

$$R_{n_D}(1) = \begin{cases} 0 & \text{Model 1} \\ 0 & \text{Model 2} \\ -\alpha_1\sigma_v^2 - R_0\breve{R}_1\sigma_i^2 & \text{Model 3} \\ -\alpha(1+\beta)\sigma_v^2 - \breve{R}_1\big(R_0 + \breve{R}_2\big)\sigma_i^2 & \text{Model 4} \end{cases}$$ (76)

$$R_{n_D}(2) = \begin{cases} 0 & \text{Model 1} \\ 0 & \text{Model 2} \\ 0 & \text{Model 3} \\ \beta\sigma_v^2 + R_0\breve{R}_2\sigma_i^2 & \text{Model 4} \end{cases}$$ (77)

The discussion continues with real time capacity estimation, which may reference the following notations.
$C_{batt}$ Capacity of the battery
$\varsigma_h$ Coulomb counting coefficient
$\hat{C}_{LS}$ LS estimate of battery capacity
$\hat{C}_{RLS}$ RLS estimate of battery capacity
$\hat{C}_{TLS}$ TLS estimate of the battery capacity
$d_c^k$ Vector of SOC differences
$d_{c,ocv}^k$ Vector of SOC differences between two rests
$d_s^k$ Vector of Coulombs
$d_{s,ocv}^k$ Vector of Coulombs between two rests
$H^k$ Augmented observation matrix
i[k] Current through the battery
$K_l$ OCV parameters: $K_0, K_1, K_2, K_3, K_4, K_5, K_6, K_7$
$n_i[k]$ Noise in measured current
$P_s[k|k]$ SOC estimation error variance
$Q_c$ [κ] Variance of capacity drift
$R_c[k]$ Capacity estimation error by TLS, RLS or OCV method
$\hat{R}_{RLS}[\kappa]$ RLS capacity estimation error variance
$R_{TLS}[\kappa]$ TLS capacity estimation error variance
$w_s[k]$ Process noise
$\tilde{w}_s[k]$ Differential SOC error
$\overline{w}_s^k$ k Accumulative of process noise between rest at k and the subsequent rest
$\tilde{w}_{s,ocv}^k$ Differential SOC error based on OCV lookup
$\tilde{w}_s^k$ Vector of differential SOC errors
$\tilde{w}_{s,ocv}^k$ Vector of differential OCV based SOC errors
$x_c[\kappa]$ Fused battery capacity
$\hat{x}_s[k|k]$ SOC estimate
$\tilde{x}_s[k|k]$ Error in the estimate of SOC
$x_s[k+1]$ SOC
$\hat{x}_{s,ocv}[k]$ OCV lookup based SOC estimate
$\tilde{x}_{s,ocv}[k]$ Error in OCV lookup based SOC estimate
$z_c[\kappa]$ Capacity estimates by TLS, RLS or OCV method
$z_i[k]$ Measured current
$\varepsilon_{D_{batt}}[k]$ Capacity estimation error
$\eta_c$ Charging efficiency ($\eta=\eta_c$)
$\eta_d$ Discharging efficiency ($\eta=\eta_d$)
$S_H^k$ Covariance of the augmented observation matrix
$\Sigma_{\tilde{w}_s}^k$ Covariance of differential SOC errors
The state of charge (SOC) of the battery, defined as:

$$SOC = \frac{Remaining\,charge\,in\,Ampere\,hours\,(Ah)}{Capacity\,of\,the\,battery\,in\,Ampere\,hours\,(Ah)} \quad (78)$$

Equation 78 provides information about the status of the battery. The knowledge of SOC and battery capacity are used to estimate the time to shut down (TTS) or time to fully charge (TTF) the battery. Battery capacity typically varies with temperature and that it fades over time depending on usage patterns and age. Accurate tracking of battery capacity is a critical element of battery fuel gauging.

In this example implementation, the online capacity estimates can be based on:
  a. A weighted recursive least squares (RLS) estimate of capacity with the derivation of the exact weights. A weighted RLS approach for online capacity estimation includes deriving expressions for the weights based on the variances and covariances across times of the updated SOC tracking and the current measurement error standard deviation.
  b. A TLS approach for real time tracking of battery capacity. The TLS approach gives a closed form expression for capacity estimation. This approach can be used for continuously tracking changes in the battery capacity.
  c. Adaptive capacity estimation based on OCV lookup of a rested battery. A TLS approach for online tracking of battery capacity by exploiting battery resting instances for OCV lookup based SOC estimation.
  d. Fusion of capacity estimates obtained through different approaches.

The following discussion relates to battery capacity estimation and fusion. The instantaneous state of charge (SOC) of the battery can be written as the following process model, which is also known as the Coulomb counting equation, in terms of the measured current as follows:

$$x_s[k+1] = x_s[k] + \frac{\eta\Delta}{3600\,C_{batt}} z_i[k] + w_s[k] \quad (79)$$

where $x_s[k] \in [0,1]$ denotes the SOC of the battery, $C_{batt}$ is the capacity of the battery in Ampere hours (Ah) and $z_i[k]$ is the measured current $$z_i[k] = i[k] + n_i[k] \tag{80}$$

which is corrupted by zero mean white noise $n_i[k]$ with standard deviation (s.d.) $\sigma_i$. The process noise in (79) relates to the measurement noise in (80) as $$w_s[k] = c_h \Delta n_i[k] \tag{81}$$

and is zero mean with s.d.

$$\sigma_s = c_h \Delta \sigma_i \tag{82}$$

where the Coulomb counting coefficient is $$c_h \cong \frac{\eta}{3600 \, C_{batt}} \tag{83}$$

Here, $\eta$ is a constant that depends on whether the battery is being charged or discharged, for example, $$\eta = \begin{cases} \eta_c & i[k] > 0 \\ \eta_d & i[k] < 0 \end{cases} \tag{84}$$

and $\Delta$ is the (constant) sampling interval.

The following discussion relates to online battery capacity estimation using recursive least squared (RLS). Estimating SOC can be based on both voltage and current measurements. Two consecutive SOC values $x_s[k]$ and $x_s[k+1]$ are written in terms of their estimates as:

$$x_s[k] = \hat{x}_s[k|k] + \tilde{x}_s[k|k] \tag{84}$$

$$x_s[k+1] = \hat{x}_s[k+1|k+1] + \tilde{x}_s[k+1|k+1] \tag{85}$$

where the estimation errors $\tilde{x}_s[k|k]$ and $\tilde{x}_s[k+1|k+1]$ have zero mean and variances $P[k|k]$ and $P[k+1|k+1]$, respectively. The covariance between two consecutive estimation errors is:

$$E\{\tilde{x}_s[k|k]\tilde{x}_s[k+1|k+1]\} = (1 - G[k+1]H[k+1])P_s[k|k] \tag{86}$$

where $G[k+1]$ is the scalar Kalman gain and $H[k+1]$ is the scalar linearized observation model at time $k+1$. Now, rewriting (80) in the following form:

$$x_s[k+1] - x_s[k] = \frac{\eta \Delta}{3600 C_{batt}} z_i[k] + w_s[k] \tag{87}$$

Substituting (84) and (85) in (87) yields:

$$\Delta x_s[k+1,k] \cong \hat{x}_s[k+1|k+1] - \hat{x}_s[k|k] = \frac{\eta_h \Delta}{C_{batt}} z_i[k] + \tilde{w}_s[k] \tag{88}$$

where, $$\eta_h = \frac{\eta}{3600} \tag{89}$$

and the differential error given by:

$$\tilde{w}_s[k] = \tilde{x}_s[k|k] - \tilde{x}_s[k+1|k+1] + w_s[k] \tag{90}$$

is zero mean with variance:

$$E\{\tilde{w}_s[k]^2\} \cong R_{\tilde{w}_s[k]} = G[k+1]^2 S[k+1] \tag{91}$$

where $S[k+1]$ is the innovation covariance of the Kalman filter. By considering a batch of $L_c$ of samples, (88) can be written in vector from as follows:

$$d_s^\kappa = C_{batt}^{-1} d_c^\kappa + \tilde{w}_s^\kappa \tag{92}$$

where, $\kappa$ is the batch number,
$L_c$ is the length of the batch, $$d_s^\kappa = [\Delta x_s[\kappa L_c - L_c + 1, \kappa L_c - L_c] \Delta x_s[\kappa L_c - L_c + 2, \kappa L_c + 1] \tag{93}$$

$$\Delta x_s[\kappa L_c, \kappa L_c - 1]]^T$$

$$d_c^\kappa = [\eta_h \Delta_{\kappa L_c - L_c + 1} z_i[\kappa L_c - L + 1] \eta_h \Delta_{\kappa L_c - L_c + 1} z_i[\kappa L_c - L_c + 2] \tag{94}$$

$$\eta_h \Delta_{\kappa L_c} Z_i[\kappa L_c]]^T$$

$$\tilde{W}_s^\kappa = [\tilde{w}[\kappa L_c - L_c + 1] \tilde{w}[\kappa L_c - L_c + 2] \ldots \tilde{w}[\kappa L_c]]^T \tag{95}$$

and $\tilde{W}_s^\kappa$ is a white Gaussian noise vector with covariance:

$$\Sigma_{\tilde{w}_s}^\kappa = E\{_s^\kappa (_s^\kappa)^T\} \tag{96}$$

which is an $L_c \times L_c$ diagonal matrix with its $n^{th}$ diagonal element given by:

$$(\Sigma_{\tilde{w}_s}^\kappa)_{nn} = G[\kappa L_c - L_c + n]^2 S[\kappa L_c - L_c + n] \tag{97}$$

Now, the LS estimate of the inverse battery capacity is given by:

$$\hat{C}_{LS}^{-1} = ((d_c^\kappa)^T (\Sigma_{\tilde{w}_s}^\kappa)^{-1} d_c^\kappa)^{-1} (d_c^\kappa)^T \Sigma_{\tilde{w}_s}^\kappa)^{-1} d_c^\kappa \tag{98}$$

and the variance of the LS inverse capacity estimate is:

$$\hat{R}_{RLS}[\kappa] = ((d_c^\kappa)^T (\Sigma_{\tilde{w}_s}^\kappa)^{-1} d_c^\kappa)^{-1} \tag{99}$$

When a new batch of $\{d_s^{\kappa+1}, d_s^{\kappa+1}\}$ pair arrives, the LS estimates can be recursively updated by:

$$\hat{R}_{RLS}^{-1}[\kappa+1] = \lambda \hat{R}_{RLS}^{-1}[\kappa] + (d_c^{\kappa+1})^T (\Sigma_{\tilde{w}_s}^\kappa)^{-1}) d_c^{\kappa+1} \tag{100}$$

$$\hat{R}_{RLS}^{-1}[\kappa+1] = \hat{R}_{RLS}[\kappa+1](\lambda \hat{R}_{RLS}^{-1}[\kappa] \hat{C}_{RLS}^{-1}[\kappa] + (d_c^{\kappa+1})^T (\Sigma_{\tilde{w}_s}^{\kappa+1}) d_b^{\kappa+1}) \tag{101}$$

where $\hat{R}_{RLS}^{-1}[\kappa]$ is the $L_c \times L_c$ information matrix for capacity estimation and $\lambda$ is the fading memory constant. It should be noted that $d_c^\kappa$ in (92) is constructed from measured current values that are known to be noisy whereas the LS and RLS estimation methods described above assume that $d_c^\kappa$ is perfectly known. For a more realistic solution, the uncertainty in $d_c^\kappa$ should be considered. Next, an approach based on total least squares (TLS) optimization that addresses errors in $d_c^\kappa$ is described.

The following discussion relates to online battery capacity estimation using adaptive total least square (TLS). In this section, an online capacity estimation method is developed based on TLS which assumes uncertainty in both $d_s^\kappa$ and d $d_c^\kappa$ in (92). Constructing the following augmented observation matrix:

$$H^\kappa = [d_s^\kappa d_c^\kappa] \tag{102}$$

The information matrix associated with the augmented observation matrix is:

$$S_H^k = (H^\kappa)^T H^\kappa \tag{103}$$

Writing the eigendecomposition of $S_H^k$ in the following form:

$$S_H^k = V^\kappa \Lambda^\kappa V^{\kappa T} \tag{104}$$

where, $A^\kappa$ is a diagonal 2×2 matrix of nonnegative eigenvalues arranged from the largest to the smallest, i.e., $A^\kappa(1,1)$ denotes the largest eigen value and $A^\kappa(2,2)$ denotes the smallest eigenvalue.

Each column of the 2×2 matrix $V^k=[v_1^\kappa, v_2^\kappa]$ has the corresponding eigenvectors, i.e., the first column $v_1^\kappa$ is the eigenvector corresponding to the largest eigenvalue and the second column $v_2^\kappa$ is the eigenvector corresponding to the smallest eigenvalue.

The TLS estimate of the inverse battery capacity is then given by the ratio of the components of $v_2^\kappa$, namely:

$$\hat{C}_{TLS}^{-1}[\kappa] = -\frac{v_2^k(1)}{v_2^k(2)} = \frac{S_H^k(1,2)}{S_H^k(1,1) - \Lambda^\kappa(2,2)} \quad (105)[6]$$

where $v_2^\kappa(i)$ is the $i^{th}$ element of $v_2^\kappa$ and $S_H^k(i,j)$ is the $(i,j)^{th}$ element of $S_H^k$. The derivation of (105) is shown in below.

For smoother estimates, the information matrix in (103) can be updated with a fading memory, as follows:

$$S_H^k = \lambda S_H^{k-1} + \frac{(H^\kappa)^T H^\kappa}{L_c - 1} \quad (106)$$

Now, based on [85], the TLS estimation error covariance is (approximately):

$$\hat{R}_{TLS}[\kappa] = \left(\frac{1}{(z^\kappa)^T S_H^k z^\kappa} \sum_{i=1}^{M} h_i^k (h_i^k)^T\right)^{-1} \quad (107)$$

where $h_i^\kappa$ is the $i^{th}$ row of $H^\kappa$, M is the number of rows in $H^\kappa$ and $$z^\kappa = \left[-\frac{v_2^k(1)}{v_2^k(2)} \quad -1\right]^T \quad (108)$$

The following discussion relates to open circuit voltage (OCV) based battery capacity estimation. For a given rested voltage $z_v[k]$, the corresponding SOC estimate $\hat{x}_{s,ovc}[k]$ can be obtained by inverting (33). Due to hysteresis in the battery, this SOC estimate $\hat{x}_{s,ovc}[k]$ will differ from the actual SOC $x_s[k]$, resulting in an OCV lookup error $\tilde{x}_{s,ovc}[k]$. The OCV lookup error will always be negative during discharging and positive during charging. The open circuit voltage (OCV) of the battery can be written as a nonlinear function of SOC as $$V_0(x_s[k]) = K_0 + \frac{K_1}{x_s[k]} + \frac{K_2}{x_s[k]^2} + \frac{K_3}{x_s[k]^3} + \quad (109)$$
$$\frac{K_4}{x_s[k]^4} + K_5 x_s[k] + K_6 \ln(x_s[k]) + K_7 \ln(1 - x_s[k])$$

where the coefficients $K_0, K_1, K_2, K_3, K_4, K_5, K_6$ and $K_7$ can be estimated offline by collecting voltage and current measurements by slowly charging and then discharging the battery. The resultant OCV-SOC characteristic curve can be used to get a measure of SOC whenever the battery is sufficiently rested. The SOC of the battery for a given at-rest terminal voltage (which is also the open circuit voltage) $z_v[k]$, written as:

$$\hat{x}_{s,ovc}[k] = f_{ocv-soc}^{-1}(z_v[k]) \quad (110)$$

can be computed using the OCV-SOC characterization by computing the inverse of (109). There are several methods for computing the inverse of a nonlinear function, such as Newton's method and binary search. This may be referred to as OCV lookup based SOC estimate. The SOC estimate in (110) is corrupted by the hysteresis voltage as follows:

$$x_s[k] = \hat{x}_{s,ovc}[k] + \tilde{x}_{s,ovc}[k] \quad (111)$$

where the OCV lookup error $\tilde{x}_{s,ovc}[k]$ is caused by the hysteresis effect in OCV. It should be noted that when the battery comes to rest at time k after a discharging process, the OCV lookup error $\tilde{x}_{s,ovc}[k]$ should be negative. Similarly, when the battery comes to rest at time k after a charging process, the OCV lookup error is, $\tilde{x}_{s,ovc}[k]$ will always be positive. However, the magnitude of the error will vary with the amount of hysteresis, which is a function of the magnitude of the current before rest, SOC and time. Now, rewriting (79) in the following form:

$$x_s[k+1] = x_s[k] + c_h \Delta z_i[k] + w_s[k] \quad (112)$$

$$x_s[k+2] = x_s[k+1] + c_h \Delta_{k+1} z_i[k+1] + w_s[k+1] \quad (113)$$

$$\vdots$$

$$x_s[k+N] = x_s[k+N-1] + c_h \Delta_{k+N-1} z_i[k+N-1] + w_s[k+N-1] \quad (114)$$

By adding (112) through (114) on both sides, the following results:

$$x_s[k+N] = x_s[k] + \frac{\eta \sum_{j=k}^{j=K+N-1} \Delta z_i[k]}{3600 C_{batt}} + \underbrace{\sum_{j=k}^{k+N-1} w_s[j]}_{\overline{w}_s^k} \quad (115)$$

where, $\overline{w}_s^k$ is zero mean with standard deviation $\sqrt{N}\sigma_s$.

Assuming that the battery is at rest at time k and k+N, (115) can be written as:

$$d_{s,ocv}^k = C_{batt}^{-1} d_{c,ocv}^k + \tilde{w}_{s,ocv}^k \quad (116)$$

$$d_{c,ocv}^k = \frac{\eta \sum_{j=k}^{j=K+N-1} \Delta z_i[k]}{3600} \quad (117)$$

$$d_{s,ocv}^k = \hat{x}_{s,ocv}[k+N] - \hat{x}_{s,ocv}[k] \quad (118)$$

$$\tilde{w}_{s,ocv}^k = \underbrace{\tilde{x}_{s,ocv}[k] - \tilde{x}_{s,ocv}[k+N]}_{\tilde{x}_{d,ocv}^k} + \overline{w}_s^k \quad (119)$$

It should be noted that, regardless of the fact that the sign of OCV lookup error $\tilde{x}_{s,ovc}[k]$ is biased towards the battery mode∈{charging,discharging}, the "differential error" $\tilde{x}_{d,ovc}^k$ (defined in (119)) can either be positive or negative. By considering a large number of differential errors, assuming $\tilde{x}_{d,ovc}{}^k$ is approximately white. Assuming that the $\kappa^{th}$ batch of differential SOCs $d_{s,ocv}{}^\kappa$ is collected between a first set of rest points $k=k_1,k_2,\ldots,k_{L_c}$ and a second set of rest points $k+N=k_1+N_1,k_2+N_2,\ldots,k_{L_c}+N_{L_c}$, respectively, and given by:

$$d_{s,ocv}{}^\kappa = C_{batt}d_{c,ocv}{}^\kappa + \tilde{w}_{s,ocv}{}^\kappa \tag{120}$$

where, $$d_{s,ocv}{}^k = [d_{s,ocv}{}^{k_1}, d_{s,ocv}{}^{k_2}, \ldots, d_{s,ocv}{}^{k_{L_c}}]^T \tag{121}$$

$$d_{c,ocv}{}^k = [d_{c,ocv}{}^{k_1}, d_{c,ocv}{}^{k_2}, \ldots, d_{c,ocv}{}^{k_{L_c}}]^T \tag{122}$$

$$\tilde{w}_{s,ocv}{}^k = [d_{s,ocv}{}^{k_1}, d_{s,ocv}{}^{k_2}, \ldots, d_{s,ocv}{}^{k_{L_c}}]^T \tag{123}$$

Now, it can be seen that (120) is in the same form as (92) with $d_{s,ocv}{}^k$, $d_{c,ocv}{}^k$ and $\tilde{w}_{s,ocv}{}^k$ replacing $d_s{}^\kappa$, $d_c{}^\kappa$, and $\tilde{w}_s{}^\kappa$, respectively. Hence, RLS and TLS based capacity estimates can be derived for OCV based observations, as shown below. Denoting the RLS and TLS estimates of OCV based capacity as $\hat{C}_{RO}[\kappa]$ and $\hat{C}_{TO}[\kappa]$, respectively. It should be noted that, given $N_r$ number of rest states interspersed with a discharge, $N_r(N_r-1)/2$ differential observations are possible. For example, for $N_r=4$, assuming the battery is in rest state at time instances $t_1,t_2,t_3$ and $t_4$.

The following relates to capacity estimation through fusion. In this section, an example implementation for fusing the TLS estimates of capacity are described. The derivations in this section are developed for a TLS based capacity estimate. The derivations can be applied for fusing RLS based capacity estimates as well.

The online capacity estimate $\hat{C}_{TLS}[\kappa]$ is corrupted by the uncertainty in $d_c{}^\kappa$ (see (92)) which is caused by the errors in the measured current and the uncertainty in the $d_s{}^\kappa$ which is caused by the errors in the SOC tracking algorithm. Similarly, the OCV based capacity estimation $C_{TO}[\kappa]$ is corrupted by the uncertainty in $d_{c,ocv}{}^\kappa$ (see (120)) which is caused by the errors in the measured current and the uncertainty in $_s{}^\kappa$ that is caused by the OCV lookup differential error. Assuming that the errors in online capacity estimates $e_1[\kappa]$ and the OCV lookup based capacity estimates $e_{to}[\kappa]$ are uncorrelated. Based on these assumptions, the capacity the fusion becomes the fusion of two independent tracks.

First, it should be noted that estimates for the inverse capacities, for example, the capacity estimates $\hat{C}_{TLS}^{-1}[\kappa]$ and $\hat{C}_{TLS}^{-1}[\kappa]$, respectively are estimates of $1/C_{batt}$. Correspondingly, the respective estimation error covariances, $\hat{R}_{TLS}[\kappa]$ and $\hat{R}_{TO}[\kappa]$ correspond to the inverse capacity estimates as well. Based on Taylor series expansion, the expected value of the TLS based dynamic capacity estimate and the corresponding estimation error variance are approximated as:

$$\hat{C}_{TLS}[\kappa] = \frac{1}{\hat{C}_{TLS}^{-1}[\kappa]} + \frac{\hat{R}_{TLS}[\kappa]}{\left(\hat{C}_{TLS}^{-1}[\kappa]\right)^3} \tag{124}$$

$$R_{TLS}[\kappa] = \frac{\hat{R}_{TLS}[\kappa]}{\left(\hat{C}_{TLS}^{-1}[\kappa]\right)^4} \tag{125}$$

where $\hat{C}_{TLS}$ is the estimate of $C_{batt}$ based on dynamic data and $R_{TLS}[\kappa]$ is the estimation error variance. By following the same procedure, the OCV based capacity estimates $C_{TO}[\kappa]$ and the corresponding estimation error covariance $R_{TO}[\kappa]$ can be obtained. Now, assuming the battery capacity to be a random variable that undergoes the following slowly changing Wiener process:

$$x_c[\kappa+1] = x_c[\kappa] + w_c[\kappa] \tag{126}$$

where $w_c[\kappa]$ assumed to be zero mean white Gaussian noise with variance $Q_c[\kappa]$. The capacity estimates $\hat{C}_{TLS}[\kappa]$ and $\hat{C}_{TO}[\kappa]$ fit the following observation model:

$$z_c[\kappa] = x_c[\kappa] + n_c[\kappa] \tag{127}$$

where $$z_c[\kappa] \in \{\hat{C}_{TLS}[\kappa'], \hat{C}_{TO}[\kappa'']\} \tag{128}$$

$\kappa'$ and $\kappa''$ are the time indices of latest estimates from the corresponding algorithms (TLS and TO, respectively), and $n_c[\kappa]$ is assumed to be a zero mean white noise with variance:

$$R_c[\kappa] = \begin{cases} R_{TLS}[\kappa] & \text{if } z_c[\kappa] = \hat{C}_{TLS}[\kappa] \\ R_{TO}[\kappa] & \text{if } z_c[\kappa] = \hat{C}_{TO}[\kappa] \end{cases} \tag{129}$$

Now, whenever a new measurement $z_c[\kappa] \in \{\hat{C}_{TLS}[\kappa'], \hat{C}_{TO}[\kappa'']\}$ is received, where either $\kappa'=\kappa$ or $\kappa''=\kappa$, the fused capacity estimate is obtained as:

$$\hat{x}_c[k \mid \kappa] = \hat{x}_c[\kappa-1 \mid \kappa-1] + \tag{130}$$
$$\frac{P_c[k-1 \mid k-1] + Q_c[k-1]}{P_c[k-1 \mid \kappa-1] + Q_c[k-1] + R_c[k]}(z_c[k] - \hat{x}_c[k-1 \mid k-1])$$

where $\hat{x}_c[\kappa-1|\kappa-1]$ is the previous update of capacity estimate and $P_c[\kappa-1|\kappa-1]$ is the previous estimation error variance which is updated as:

$$P_c[\kappa \mid \kappa] = \frac{R_c[\kappa](P_c[\kappa-1 \mid \kappa-1] + Q_c[\kappa-1])}{P_c[\kappa-1 \mid \kappa-1] + Q_c[\kappa-1] + R_c[\kappa]} \tag{131}$$

The above fusion approach can be similarly used for fusing RLS based capacity estimates.

The following relates to derivation of capacity estimation error covariance. In this section, the covariance of the differential error in (90) is derived. For convenience, the differential error (90) is rewritten below $$\tilde{w}_s[k] = \tilde{x}_s[k|k] - [k+1|k+1] + w_s[k] \tag{90}$$

The objective is to compute the variance:

$$E\{\tilde{w}_s[k]\tilde{w}_s[k]^T\} \cong R_{\tilde{w}_s}[k] \tag{132}$$

Writing the process equation (79) in the following forms:

$$x_s[k+1] = x_s[k] + c_h \Delta z_i[k] + w_s[k] \tag{134}$$

$$\hat{x}_s[k+1|k+1] = \hat{x}_s[k|k] + c_h \Delta z_i[k] + G[k+1]v[k+1] \tag{135}$$

where $\hat{x}_s[k+1|k+1]$ is the Kalman filter estimate of $x_s[k+1]$, $v[k+1]$ is the filter innovation and $G[k+1]$ is the Kalman gain. The difference between (134) and (135) is:

$$\tilde{x}_s[k+1] = \tilde{x}_s[k] + w_s[k] - G[k+1]v[k+1] \tag{136}$$

which can be rearranged to the following form:

$$\tilde{x}_s[k] - \tilde{x}_s[k+1] + w_s[k] = \tilde{w}_s[k] = G[k+1]v[k+1] \tag{137}$$

Hence, $$R_{\tilde{w}_s}[k] = G[k+1]^2 S[k+1] \tag{138}$$

where,

S[k+1] is the innovation covariance.

Below is an alternative or second approach that corroborates the above derivation is described. Expanding (132):

$$E\{\tilde{w}_s[k]\tilde{w}_s[k]\} = \tag{139}$$
$$\underbrace{E\{\tilde{x}_s[k\mid k]\tilde{x}_s[k\mid k]\}}_{E_1} + \underbrace{E\{\tilde{x}_s[k+1\mid k+1]\tilde{x}_s[k+1\mid k+1]\}}_{E_2} +$$
$$\underbrace{E\{w_s[k]w_s[k]\}}_{E_3} - \underbrace{2E\{\tilde{x}_s[k+1\mid k+1]\tilde{x}[k\mid k]\}}_{E_4} +$$
$$\underbrace{2E\{\tilde{x}_s[k\mid k]w_s[k]\}}_{E_5} - \underbrace{2E\{\tilde{x}_s[k+1\mid k+1]w_s[k]\}}_{E_6}$$

where
$E_1 = P_s[k\mid k]$ $E_2 = P_s[k+1\mid k+1] \tag{140}$ $E_3 = \sigma_s^2 \tag{141}$ $E_4 = E\{\tilde{x}_s[k+1]\tilde{x}_s[k\mid]\} \tag{142}$
$= E\{(x_s[k] + w_s[k] - \hat{x}_s[k\mid k] - G[k+1]v[k+1])\tilde{x}_s[k\mid k]\}$
$= E\{(\tilde{x}_s[k\mid k] + w_s[k] - G[k+1]v[k+1])\tilde{x}_s[k\mid k]\}$
$= E\{(\tilde{x}_s[k\mid k] + w_s[k] - G[k+1]H[k+1]\tilde{x}[k\mid k])\tilde{x}_s[k\mid k]\}$
$= E\{\tilde{x}_s[k\mid k]\tilde{x}_s[k\mid k]\} + \underbrace{E\{w_s[k]\tilde{x}_s[k\mid k]\}}_{=0} -$
$G[k+1]H[k+1]E\{\tilde{x}_s[k\mid k]\tilde{x}_s[k\mid k]\}$
$= (1 - G[k+1]H[k+1])P_s[k\mid k]$ $E_5 = 0 \tag{143}$ $E_6 = E\{\tilde{x}_s[k+1]w_s[k]\} \tag{144}$
$= E\{\tilde{x}_s[k\mid k]w_s[k]\} + E\{w_s[k]w_s[k]\} -$
$G[k+1]H[k+1]E\{\tilde{x}_s[k\mid k]w_s[k]\}$
$= \sigma_s^2$ $E\{\tilde{w}_s[k]\tilde{w}_s[k]\} = E1 + E2 + E3 - 2E4 + 2E5 - 2E6 \tag{145}$
$= P_s[k\mid k] + P_s[[k+1\mid k+1] + \sigma_s^2 -$
$2(1 - G[k+1]H[k+1])P_s[k\mid k] - 2\sigma_s^2$
$= P_s[k\mid k] + (1 - G[k+1]H[k+1])^2 P_s[k\mid k] + \sigma_s^2 +$
$G[k+1]R_D[0]G[k+1] + \sigma_s^2 -$
$2([1 - G[k+1]H[k+1])P_s[k\mid k] - 2\sigma_s^2$
$= G[k+1]^2 H[k+1]^2 P_s[k\mid k] +$
$G[k+1]R_D(0)G[k+1]$
$= G[k+1]^2(H[k+1]^2 P_s[k\mid k] + R_D(0))$
$= G[k+1]^2 S[k+1]$ The following relates to a closed form derivation of total least square (TLS) capacity estimate. Writing the 2×2 matrix $A \triangleq S_H^k$ as:

$$A = \begin{bmatrix} \sigma_{11} & \sigma_{12} \\ \sigma_{12} & \sigma_{22} \end{bmatrix} \tag{146}$$

The eigenvalues of A satisfies $$|A - \lambda I| = 0 \tag{147}$$

$$\begin{vmatrix} \sigma_{11} - \lambda & \sigma_{12} \\ \sigma_{12} & \sigma_{22} - \lambda \end{vmatrix} = 0 \tag{148}$$

which simplifies to $$\lambda_1 = \frac{\sigma_{11} + \sigma_{22} + \sqrt{(\sigma_{11} - \sigma_{22})^2 + 4(\sigma_{12})^2}}{2} \tag{149}$$

$$\lambda_2 = \frac{\sigma_{11} + \sigma_{22} - \sqrt{(\sigma_{11} - \sigma_{22})^2 + 4(\sigma_{12})^2}}{2} \tag{150}$$

where $\lambda_1$ is the largest eigenvalue and $\lambda_2$ is the smallest eigenvalue. The eigenvector corresponding to $\lambda_2$ satisfies $$A v_2^\kappa = \lambda_2 v_2^\kappa \tag{151}$$

where $$v_2^\kappa = \begin{bmatrix} \dfrac{-\sigma_{12}}{\sqrt{\sigma_{12}^2 + (\sigma_{11} - \lambda_2)^2}} \\ \dfrac{\sigma_{11} - \lambda_2}{\sqrt{\sigma_{12}^2 + (\sigma_{11} - \lambda_2)^2}} \end{bmatrix} \tag{152}$$

for example, $$v_2^\kappa(1) = \frac{-\sigma_{12}}{\sqrt{\sigma_{12}^2 + (\sigma_{11} - \lambda_2)^2}} \tag{153}$$

$$v_2^\kappa(2) = \frac{\sigma_{11} - \lambda_2}{\sqrt{\sigma_{12}^2 + (\sigma_{11} - \lambda_2)^2}} \tag{154}$$

and $$\hat{C}_{TLS}^{-1}[k] = -\frac{v_2^\kappa(1)}{v_2^\kappa(2)} = \frac{S_H^k(1,2)}{S_H^k(1,1) - \Lambda^\kappa(2,2)} \tag{155}[6]$$

The following relates to transformation of the inverse capacity estimates. An example implementation includes an approach to get the capacity estimate and the estimation error variance based on the inverse estimate and the inverse estimation error variance. Assigning simple variables for inverse capacity estimate and the error variance, for example, $$x \cong C_{TLS}^{-1}[\kappa] \tag{156}$$

$$x_0 \cong E\{x\} = \hat{C}_{TLS}^{-1}[\kappa] \tag{157}$$

$$R_x \cong E\{(x-x_0)^2\} = \hat{R}_{TLS}[\kappa] \tag{158}$$

Defining:

$$y \cong f(x) = \frac{1}{x} \tag{159}$$

our objective is to find approximations for $E\{y\}$ and $E\{(y-E\{y\})^2\}$.

The following relates to determining the expected value of y. The second order Taylor series approximation is given by:

$$y = f(x) = f(x_0) + f'(x_0)(x-x_0) + \frac{1}{2}f''(x_0)(x-x_0)^2 \quad (160)$$

The second order approximation of E{y} is given by:

$$E\{y\} = E\{f(x_0)\} + f'(x_0)\underbrace{(E\{x\} - E\{x_0\})}_{=0} + \frac{1}{2}f''(x_0) \quad (161)$$

$$E\{(x-x_0)^2\}$$

$$= \frac{1}{x_0} + \frac{R_x}{x_0^3}$$

The following relates to determining the variance of the expected value of y. Expanding f(x) as a first order Taylor series around the true value $x_0$.

$$y=f(x)=f(x_0)+f'(x_0)(x-x_0) \quad (162)$$

The variance of y is given by:

$$E\{(y-E\{y\})^2\} = E\{(f'(x_0)(x-x_0))^2\} \quad (163)$$

$$= \frac{R_x}{x_0^4}$$

Now, the expected values of the capacity estimate and its estimation error variance are given by:

$$C_{TLS}[\kappa] = \frac{1}{\hat{C}_{TLS}^{-1}[\kappa]} + \frac{\hat{R}_{TLS}[\kappa]}{\left(\hat{C}_{TLS}^{-1}[\kappa]\right)^3} \quad (164)$$

$$R_{TLS}[\kappa] = \frac{\hat{R}_{TLS}[\kappa]}{\left(\hat{C}_{TLS}^{-1}[\kappa]\right)^4} \quad (165)$$

The disclosure continues with state of charge (SOC) tracking, which may reference the following notations.
a[k]$^T$ Voltage drop model
ã[k]$^T$ Modified voltage drop model used in SOC tracking
BFG Battery fuel gauge
b Voltage drop model parameter
b̃ Modified voltage drop model parameter used in SOC tracking
$C_{batt}$ Battery capacity
$c_h$ Coulomb counting coefficient
G[k+1] SOC tracking filter gain
h[k] Hysteresis voltage of the battery
i[k] Current through battery
$i_1$[k] Current through $R_1$
$i_2$[k] Current through $R_2$
$K_i$ OCV parameters: $K_0$, $K_1$, $K_2$, $K_3$, $K_4$, $K_5$, $K_6$ $K_7$
$n_D$[k] Voltage drop observation noise
$n_i$[k] Noise in measured current
$n_v$[k] Noise in measured voltage
$n_z$[k] Noise in measurement model
OCV Open circuit voltage
$P_s$[k+1|k] SOC estimation error variance
P [k+1|k+1] SOC estimation error variance
$R_0$ Battery internal resistance in series
$R_1$ Battery internal resistance in $R_1C_1$ circuit
$R_2$ Battery internal resistance in $R_2C_2$ circuit
$R_{n_D}$ Autocorrelation of the voltage drop observation noise
SOC State of charge
s[k] State of charge (SOC)
U[k] Cross correlation between measurement and process noise
v[k] Voltage across battery terminals
$V_0$(s[k]) Open circuit voltage (OCV)
$x_h$[k] State component corresponding to h[k]
$x_{i_1}$[k] State component corresponding to $i_1$[k]
$x_{i_2}$[k] State component corresponding to $i_2$[k]
$x_s$[k] State component corresponding to s[k]
$\hat{x}_s$[k+1 k] Predicted SOC estimate
$\hat{x}_s$[k+1|k+1] Update SOC estimate
x[k] States in vector form
$z_i$[k] Measured current
$z_v$[k] Measured voltage
$\alpha_i$(k) Current decay coefficient in RC circuit, $$e^{-\frac{\Delta}{R_iC_i}}$$

Δ Time difference between adjacent samples
$\varepsilon_{x_s}$[k] SOC tracking error
$\eta_c$ Charging efficiency
$\eta_d$ Discharging efficiency In this example implementation, state of charge (SOC) of electrochemical storage devices (batteries) is tracked based on instantaneous terminal voltage, load current, and temperature measurements. An SOC tracking algorithm uses the knowledge of model parameter estimates and of the battery capacity estimate described above. Example SOC tracking models hysteresis as an error in the open circuit voltage (OCV) and employs a combination of parameter estimation and SOC tracking technique to compensate for it. This obviates the need for offline modeling of hysteresis as a function of SOC and load current. The example model results in a reduced order (e.g., single state) filtering for SOC tracking where no additional variables need to be tracked regardless of the level of complexity of the battery equivalent model. The presence of correlated noise is identified and used for improved SOC tracking. As a deviation from the conventional "one model fits all" strategy, four different equivalent models of the battery are identified that represent four unique modes of typical battery operation and develop the framework for seamless SOC tracking based on the appropriate model.

A typical reduced order state filtering approach that includes joint (recursive) estimation of SOC along with other redundant (nuisance) quantities involves computationally expensive matrix operations and reduces the accuracy of SOC estimation. In this example implementation, a reduced order filtering that does not increase the state space dimension resulting in better SOC accuracy and reduced computational complexity is utilized. The need for hysteresis modeling is obviated by modeling hysteresis as the error in the OCV and the online filtering approach continuously tries to fill the gap by adjusting SOC (to the correct value.) Hence, hysteresis is modeled as a time-varying bias. A noise whitening procedure is applied and a modified state-space model is derived in order to ensure that the SOC tracking algorithm yields the best possible results in the sense of minimum mean square error. SOC is tracked using different "modes" of the battery. At least four different battery equivalent models are used to reflect very light loading or rest state, constant current operations or low frequency loading (e.g., charging), dynamic loads and heavy loads. Four (slightly) different dynamic equivalent models are identified in order to best match these modes as well. The proposed reduced order filtering approach ensures seamless SOC tracking regardless of the mode changes in the battery operation.

The following discussion relates to an exemplary system model. The battery equivalent circuit model considered in this paper is shown in FIG. 13A. When the battery is at rest, $V_0(s[k])$ is the OCV of the battery. The OCV uniquely depends on the SOC of the battery, $s[k]$. When the battery is active, for example, when there is current activity, the behavior of the battery is represented through the dynamic equivalent circuit consisting of a hysteresis component $h[k]$, a series resistance $R_0$ and two parallel RC circuits in series, $(R_1, C_1)$ and $(R_2, C_2)$. The discrete time is indicated using $[k]$.

The battery equivalent circuit model considered in this section shown in FIG. 13A. The terminal voltage $v[k]$ in terms of the components of the battery equivalent circuit is given by:

$$v[k]=V_0(s[k])+i[k]R_0+i_1[k]R_1+i_2[k]R_2+h[k] \quad (166)$$

where $V_0(s[k])$ represents the open circuit voltage (in volts) of the battery at time k which is written here as a function of SOC at time k, $s[k] \in [0,1]$; $h[k]$ accounts for the hysteresis in the battery voltage; $i_1[k]$ and $i_2[k]$ are the currents through $R_1$ and $R_2$, respectively.

There are several nonlinear representations that approximate the OCV as a function of SOC. In this example implementation, an inverse polynomial-log-linear model for the representation of OCV in terms of SOC:

$$V_0(s[k]) = K_0 + \frac{K_1}{s[k]} + \frac{K_2}{s^2[k]} + \frac{K_3}{s^3[k]} + \frac{K_4}{s^4[k]} + K_5 s[k] + K_6 \ln(s[k]) + K_7 \ln(1-s[k]) \quad (167)[3]$$

where $K_0, K_1, K_2, K_3, K_4, K_5, K_6$ and $K_7$ can be estimated offline through OCV-SOC characterization. The instantaneous change in SOC can be written in the following form (the subscript of x is introduced to indicate a state component):

$$x_s[k+1] \approx s[k+1] = s[k]+c_h \Delta i[k] \quad (168)$$

where $i[k]$ is in Amps, $$c_h = \eta/3600 C_{batt} \quad (169)$$

is the Coulomb counting coefficient in $\text{Amp}^{-1} \text{sec}^{-1}$, $C_{batt}$ is the capacity of the battery in Ampere hours (Ah), $\Delta$ is the sampling interval in seconds and $\eta$ is a constant that depends on whether the battery is being charged or discharged, for example, $$\eta = \begin{cases} \eta_c & i[k] > 0 \\ \eta_d & i[k] < 0 \end{cases} \quad (170)$$

It should be noted that (168) yields the instantaneous SOC of the battery. This technique of computing the SOC is referred to as Coulomb counting and/or as the "predicted SOC". Coulomb counting, assumes knowledge of the initial state of charge and perfect knowledge of battery capacity to compute the remaining state of charge after accounting for the amount of Coulombs transferred from/into the battery. Coulomb counting error includes (1) uncertainty in the knowledge of initial SOC; (2) uncertainty in the knowledge of battery capacity; and (3) errors in measured Coulombs as a result of errors in the measured current and errors in time differences due to timing oscillator inaccuracies/drifts.

The current $i[k]$ is measured and the current measurement is subject to errors. The measured current $z_i[k]$ is written as:

$$z_i[k]=i[k]+n_i[k] \quad (171)$$

where $n_i[k]$ is the current measurement noise, which is considered white, zero-mean and with known standard deviation (s.d.)$\sigma_i$. The state equation (168) can be rewritten by substituting $z_i[k]$ for $i[k]$ as follows:

$$x_s[k+1]=x_s[k]+c_h \Delta z_i[k]-c_h \Delta n_i[k] \quad (172)$$

The currents through the resistors $R_1$ and $R_2$ can be written in the following form $$x_{i_1}[k+1] \approx i_1[k+1]=\alpha_1 i_1[k]+(1-\alpha_1)i[k] \quad (172)$$

$$x_{i_2}[k+1] \approx i_2[k+1]=\alpha_2 i_2[k]+(1-\alpha_2)i[k] \quad (173)$$

where $$\alpha_1 = e^{-\frac{\Delta}{R_1 C_1}} \quad (174)$$

$$\alpha_2 = e^{-\frac{\Delta}{R_2 C_2}} \quad (175)$$

By substituting the measured current $z_i[k]$ for $i[k]$, the currents in (172) and (173) can be rewritten as follows:

$$x_{i_1}[k+1]=\alpha_1 x_{i_1}[k]+(1-\alpha_1)z_i[k]-(1-\alpha_1)n_i[k] \quad (176)$$

$$x_{i_2}[k+1]=\alpha_2 x_{i_2}[k]+(1-\alpha_2)z_i[k]-(1-\alpha_2)n_i[k] \quad (177)$$

The hysteresis voltage $h[k]$ is a nonlinear function of the load current and SOC of the battery. The hysteresis process can be written as:

$$x_h[k] \approx h[k]=f_h(x_s[k],i[k])x_h[k]+n_h[k] \quad (178)$$

where $n_h[k]$ is the process noise of the hysteresis model which is assumed white, zero-mean Gaussian and with s.d. $\sigma_h$. The voltage in (166) is a measured quantity and the measured voltage $z_v[k]$ is subject to errors. The measured voltage is written as:

$$z_v[k] = v[k] + n_v[k] \quad (179)$$
$$= V_0(s[k]) + i[k]R_0 + i_1[k]R_1 + i_2[k]R_2 + h[k] + n_v[k]$$

where $n_v[k]$ is assumed to be white Gaussian noise with zero mean and s.d. $\sigma_v$. Now, by substituting (171), (172), (173) and (178), in (179), the following measurement model is derived:

$$z[k]=V_0(x_s[k])+z_i[k]R_0+x_{i_1}[k]R_1+x_{i_2}[k]R_2+x_h[k]+n_{z_v}[k] \quad (180)$$

where, $$n_{z_v}[k]=n_v[k]-R_0 n_i[k] \quad (181)$$

Now, given the instantaneous voltage and current measurements, $z_v[k]$ and $z_i[k]$, the objective of BFG is to track the instantaneous SOC of the battery $x_s[k]$. The presence of "nuisance" variables $x_{i_1}[k]$, $x_{i_2}[k]$, and $x_h[k]$ in the observation model (180) makes it a joint estimation problem, i.e., SOC and these variables have to be jointly estimated. This can be achieved by forming a multidimensional process and measurement model in vector from as shown in (183)-(189) and/or by applying Bayesian nonlinear filtering techniques in order to recursively estimate:

$$[k] \cong \begin{bmatrix} x_s[k] \\ x_h[k] \\ x_{i_1}[k] \\ x_{i_2}[k] \end{bmatrix} \quad (182)$$

given all the measurements up to time k, $\{[0][1][2],\ldots,[k]\}$ where consists of (171) and (180). This can be efficiently performed by applying well known nonlinear filtering techniques such as the extended Kalman filter (EKF), unscented Kalman filter (UKF) or the particle filter. The process equations (172), (176), (177) and (178) can be written in vector form as:

$$\begin{bmatrix} x_s[k+1] \\ x_h[k+1] \\ x_{i_1}[k+1] \\ x_{i_2}[k+1] \end{bmatrix} = \begin{bmatrix} 1 & 0 & 0 & 0 \\ 0 & f_h(s[k],i[k]) & 0 & 0 \\ 0 & 0 & \alpha_1 & 0 \\ 0 & 0 & 0 & \alpha_2 \end{bmatrix} \begin{bmatrix} x_s[k] \\ x_h[k] \\ x_{i_1}[k] \\ x_{i_2}[k] \end{bmatrix} \begin{bmatrix} c_h \Delta \\ 0 \\ 1-\alpha_1 \\ 1-\alpha_2 \end{bmatrix} z_i[k] + \begin{bmatrix} -c_h\Delta & 0 \\ 0 & 1 \\ \alpha_1 - 1 & 0 \\ \alpha_2 - 1 & 0 \end{bmatrix} \begin{bmatrix} n_i[k] \\ n_h[k] \end{bmatrix} \quad (183)$$

or, written compactly as:

$$x[k+1] = F_k x[k] + u[k] + F_k w[k] \quad (184)$$

where, $$w[k] = \begin{bmatrix} n_i[k] \\ n_h[k] \end{bmatrix} \quad (185)$$

is a white noise vector with zero mean and covariance:

$$\Sigma_w = \begin{bmatrix} \sigma_i^2 & 0 \\ 0 & \sigma_h^2 \end{bmatrix} \quad (186)$$

Correspondingly, the measurement equation (180) can be written as:

$$z_v[k] = g([k]) + z_i[k]R_0 + n_{z_v}[k] \quad (187)$$

where, $$g([k]) = V_0(x[k]) + x_h[k] + x_{i_1}[k]R_1 + x_{i_2}[k]R_2 \quad (188)$$

and $n_z[k]$ noise vector with zero mean and s.d.

$$\sigma_z = \sqrt{\sigma_v^2 + R_0^2 \sigma_i^2} \quad (189)$$

In addition, it should be noted that the state-space representation (183)-(189) involves the following model parameters which need to be estimated through system identification techniques including battery capacity: $C_{batt}$, open circuit voltage model parameters: $K_0$, $K_1$, $K_2$, $K_3$, $K_4$, $K_5$, $K_6$, $K_7$, dynamic equivalent circuit model parameters: $R_0$, $R_1$, $C_1$, $R_2$, $C_2$, charging and discharging efficiencies: $\eta_c$, $\eta_d$, process noise variances: $\sigma_i^2$, $\sigma_h^2$, and measurement noise variances $\sigma_v^2$, $\sigma_i^2$.

The requirement to estimate all the model parameters makes the SOC tracking problem more challenging. Further, the chemical properties of the battery change as a result of temperature changes, aging, and usage patterns and as a result these model parameters are subject to change over time. Hence the model parameters have to be re-estimated over time.

In example implementations, it is assumed that the OCV parameters $K_0, K_1, \ldots, K_7$ of the battery are estimated offline. A procedure to estimate these parameters is described above. The voltage and current measurement error standard deviations, $\sigma_v$ and $\sigma_i$, respectively, are assumed to be available from the measurement circuitry design. The charging and discharging efficiencies, $\eta_c$, and $\eta_d$, respectively, are assumed to be known through calibration. Hence, the objective is to develop an online SOC tracking algorithm by assuming the knowledge of battery capacity $C_{batt}$ and the electrical equivalent model parameters $R_0$, $R_1$, $R_2$, $C_1$ and $C_2$ of the battery.

The following discussion relates to SOC tracking. The objective of reduced order filtering is to track x[k] while avoiding the need to track the redundant variables $x_{i_1}[k]$, $x_{i_2}[k]$ and $x_h[k]$. First, rewriting (172) in the following form:

$$x[k+1] = x_s[k] + c_h \Delta z_i[k] + w_s[k] \quad (190)$$

where, $$w_s[k] = -c_h \Delta n_i[k] \quad (191)$$

is the process noise which is white with s.d.

$$\sigma_s = c_h \Delta \sigma_i \quad (192)$$

Now, rewriting the voltage measurement (180) as:

$$z_v[k] = V_0(x_s[k]) + a[k]^T b + n_D[k] \quad (193)[4]$$

where, $$a[k]^T b = [v_D[k-1] \, v_D[k-2] \, z_i[k] \, z_i[k-1] \, -z[k-2] \, 1] \quad (194)$$

and the voltage drop is given by:

$$v_D[k] = z_v[k] - V_0(x_s[k]) \quad (195)$$

where b is a parameter vector to be estimated and $n_D[k]$ is the measurement noise. It should be noted that [k] in (194) is defined in terms of the voltage drops $v_D[k-1]$ and $v_D[k-2]$. Estimating parameter b based on a voltage drop observation model is described above. The estimated parameters are derived in terms of the parameters of the battery equivalent model in FIG. 13A as:

$$b(1) \cong \alpha(k) = \alpha_1 + \alpha_2 \quad (196)$$

$$b(2) \cong \beta(k) = \alpha_1 \alpha_2 \quad (197)$$

$$b(3) = R_0 \quad (198)$$

$$b(4) \cong \check{R}_1 = (\alpha_1 + \alpha_2)R_0 - (1-\alpha)R_1 - (1-\alpha_2)R_2 \quad (199)$$

$$b(5) \cong \check{R}_2 = \alpha_1 \alpha_2 R_0 - \alpha_2(1-\alpha_1)R_1 - \alpha_1(1-\alpha_2)R_2 \quad (200)$$

$$b(6) \cong \hat{h}[k] = x_h[k] - \alpha(k)x_h[k-1] + \beta(k)x_h[k-2] \quad (201)$$

The measurement noise $n_D[k]$ is zero mean and with autocorrelation $\Re_{n_D}(l)$ given by:

$$\Re_{n_D}(l) \cong E\{n_D[k]n_D[k-l]\} = \begin{cases} (1+\alpha^2+\beta^2)\sigma_v^2 + (R_0^2+\overline{R}_1^2+\overline{R}_2^2)\sigma_i^2 & |l|=0 \\ -\alpha\sigma_v^2 - R_0\overline{R}_1\sigma_i^2 & |l|=1 \\ \beta\sigma_v^2 + R_0\overline{R}_2\sigma_i^2 & |l|=2 \\ 0 & |l|>2 \end{cases} \quad (202)$$

Next, the significance of the voltage drop in estimating the parameters b in (193) is described. Using (193), the voltage drop (195) can be written as:

$$v_D[k]=a[k]^T b+n_D[k] \quad (203)$$

Given the voltage drop observations, the above model (203) can be used to linearly estimate b. However, in order to get the voltage drop as an observation, the knowledge of the SOC $x_s[k]$ for which a predicted value of SOC, $\hat{x}_s[k|k-1]$ or the updated SOC estimate $\hat{x}_s[k|k]$ can be used, for example, $$V_D[k|k]=z_v[k]-V_0(\hat{x}_s[k|k]) \quad (204)$$

Below, how the predicted SOC $\hat{x}_s[k|k-1]$ and updated SOC $\hat{x}_s[k|k]$ are obtained (see (209) and (215), respectively) is described. The existing approaches for BFG use the voltage and current observations, $z_v[k]$ and $z_i[k]$, for model identification and SOC tracking. Consider the conventional voltage observation model (180). The terms in $x_h[k]$ denote the hysteresis voltage which, as shown in (178), is a function of current i[k], SOC $x_s[k]$ and time k. For example, when a battery experiences a load of 1 A (which is heavy in mobile applications) for a few seconds, the magnitude of the resulting hysteresis is small compared to when the load was 1 A continuously for 30 min. In addition, the magnitude of the hysteresis is a function of the SOC at that time as well.

Using the voltage observation (180) across battery terminals for model identification, the hysteresis $x_h[k]$ also needs to be modeled and the model parameters have to be estimated. A model for hysteresis in terms of SOC, current and time is nonlinear and not yet fully understood. Another disadvantage of trying to model and estimate hysteresis is that it makes online model identification almost impossible. Because hysteresis is a function of SOC, model identification requires the data spanning the entire range of SOC. This might be impossible at times since some applications might never use the battery from full to empty. Since hysteresis is also a function of current, model identification requires usage data spanning the possible load currents applied for various durations. Hence, complete modeling and model identification of hysteresis becomes impractical.

It is also important to note that estimating model parameters offline using sample batteries and then using those parameters in fuel gauging may not be satisfactory; some of the battery parameters are known to change based on usage patterns. Example embodiments avoid hysteresis modeling by introducing the voltage drop model described above. The voltage drop $v_D[k]$ represents the voltage across the internal battery model components $R_0, R_1, R_2$ and $x_h[k]$. The term $x_h[k]$ is purposely introduced in order to account for the errors in predicted SOC $z[k|k-1]$ that is used to derive the voltage drop "measurement" $v_D[k]$. The $x_h[k]$ can be referred to as an "instantaneous hysteresis" which, according to example embodiments, should be corrected to zero by adjusting SOC estimate $\hat{x}_s[k|k]$. As described above with regard to FIG. 7, the use of the voltage drop model can be used to eliminate the effect of hysteresis. The current knowledge of SOC is used to compute the voltage drop. A batch of past voltage drops are collected in a buffer and used for estimation of the parameter b. A nonzero value of $b(6)=\hat{h}[k]$(as determined in the model estimation module or block 710) indicates the presence of instantaneous hysteresis, which implies SOC estimation error. The SOC tracking algorithm is devised to correct the SOC (in the SOC tracking block 715) whenever the estimated $\hat{h}[k]$ is nonzero.

The OCV-SOC model (167) represents the OCV-SOC relationship. Assuming that $\hat{x}_s[k|k]=x_s[k|k]$ in the voltage drop (195), the estimated value of $\hat{h}[k]$ in (201) will be $\hat{h}[k]\neq 0$. However, $\hat{h}[k]\neq 0$ implies errors in SOC estimates that is used in computing the voltage drop observation $v_D[k]$. Hence, the SOC tracking algorithm needs to adjust $\hat{x}_s[k|k]$ accordingly. this accomplished by employing the following modified observation model in place of (193):

$$z_v[k]=V_0(x_s[k])+\tilde{a}[k]^T\tilde{b}+n_D[k] \quad (205)[5]$$

where, $$\tilde{a}[k]^T=[v_D[k-1]v_D[k-2]z_i[k-1]z_i[k-1]-z_i[k-2]] \quad (206)$$

$$\tilde{b}=[\alpha\beta R_0 \check{R}_1 \check{R}_2]^T \quad (207)$$

are obtained by removing the last element in $a[k]^T$ and b, respectively. In other words, the hysteresis term is removed. Below, the significance of this modified observation model is described. Further, the following covariance is found between the process noise $w_s[k]$ in (190) and the measurement noise $n_D[k]$ in (205):

$$E\{w_s[k]n_D[k]\}\cong U[k]=R_0 c_h \Delta \sigma^2 \quad (208)$$

Given the estimate of state of charge, $\hat{x}_s[k|k]$, and the associated variance $P_s[k|k]$, the following EKF recursion (see FIG. 8) uses the voltage and current measurements $z_v[k+1]$, $z_i[k], z_i[k+1]$ to yield the updated SOC estimate of is $\hat{x}_s[k+1|k+1]$, and its associated variance $P_s[k+11\ k+1]$. These steps also make sure that the SOC estimates are best adjusted to account for the covariance of (208). The filtering recursions consist of the following:

$$\hat{x}_s[k+1|k] = \hat{x}_s[k|k] + c_h[k]\Delta z_i[k] \quad (209)$$

$$P_s[k+1|k] = P_s[k|k] + \sigma_s^2 \quad (210)$$

$$H[k+1] = \frac{dz_v[k]}{dx_s[k]}\bigg|_{\hat{x}_s[k+1|k]} \quad (211)$$

$$\hat{z}_v[k+1] = V_0(\hat{x}_s[k+1|k]) + [k]^T[k] \quad (212)$$

$$S[k+1] = H[k+1]P[k|k]H[k+1]^T + R_{n_D}(0) + 2H[k+1]U[k] \quad (213)$$

$$G[k+1] = \frac{P[k+1|k]H[k+1]^T U[k]}{S[k+1]} \quad (214)$$

$$\hat{x}_s[k+1|k+1] = \hat{x}_s[k+1|k] + G[k+1](z_v[k+1] - \hat{z}_v[k+1]) \quad (215)$$

$$P_s[k+1|k+1] = \\ (1-G[k+1]H[k+1])P_s[k+1|k](1-G[k+1]H[k+1])^T + \\ G[k+1]^2 R_{n_D}(0) \quad (216)[2]$$

where $c_h[k]$ and $\hat{b}[k]$ are the most recent estimates of the Coulomb counting coefficient and the model parameter vector, respectively. The importance of using $\tilde{a}[k]^T$ and $\tilde{b}$ in the state-space model (190)-(205) for SOC tracking should be described. Hysteresis can be thought of as an error in the OCV-SOC characteristic curve. It can be difficult to model and accurately estimate the hysteresis because it varies with the previous current and SOC (see (178)). However, the true OCV-SOC relationship can be estimated. Indeed, the $V_0(x_s[k])$ in (205) is based on the true OCV-SOC model. For example, assume that the estimated hysteresis is $\hat{h}[k]=10$ mV. This means the "perceived OCV" by the filter is 10 mV away from the actual OCV of the battery. For the BFG algorithm, the perceived OCV, $V_0(x[k])$, is directly (and monotonically) related to the SOC estimate $\hat{x}_s[k|k]$. In other words, if the perceived OCV of the filter is different from the actual OCV, so is the filter estimate $\hat{x}_s[k|k]$ from the true SOC of the battery. Hence, when the filter sees a drop of 10 mV in its predicted terminal voltage $\hat{z}_v[k+1|1]$ in (212), it adjusts its SOC estimate $\hat{x}_s[k+1|k+1]$ in (215) such that the "perceived OCV error" (or estimated hysteresis H) is (gradually) adjusted to zero. Hence, a good indication of proper functioning of the proposed approach is the estimated $\hat{h}[k]$ being always close to zero.

Reliable apparatus and methods to validate a fuel gauging algorithm in a desirable fashion do not exist. Using simulations to evaluate a fuel gauge is not feasible because of the lack of, for example, reliable mathematical models that can allow simulation of the dynamics of a battery. For example, an enhanced self-correcting model may not consider the effect of aging on a battery. Validation of a fuel gauge using a single metric or validation approach can be difficult due uncertainty in the true values of state of charge, battery capacity and internal impedance, all of which can be constantly drifting quantities. Several validation metrics need to be computed in order to understand the complete picture of a fuel gauge accuracy.

The disclosure continues with benchmarking, which begins with metrics. In this example implementation, several benchmarking approaches for the validation of fuel gauging algorithms of electrochemical storage devices (batteries) are described. Relatively accurate fuel gauging (FG) can extend the cycle life of batteries. This detailed description also describes a rigorous and objective fuel gauge evaluation scheme. The metrics described herein can be used to measure the FG accuracy in several aspects and return at least one number that can be indicative of the overall performance of a fuel gauge. The benchmarking described herein can be applied to a variety of fuel gauging algorithms. For example, the details included in this description can be combined with any of the concepts described in the description entitled "Methods and Apparatus Related to Tracking Battery State of Charge: A Reduced Order Filtering Approach".

The benchmarking described in this detailed description can be performed by, for example, computing one or more of the three metrics defined below:

A first exemplary metric is coulomb counting error. With the knowledge of battery capacity and the starting state of charge (SOC) point of an experiment, Coulomb counting methods and/or apparatus can provide an accurate estimate of the state of charge of the battery. The error (e.g., root-mean square (RMS)) between Coulomb counting based SOC estimate and the SOC estimate of the fuel gauge over a period of time can function as the first metric of the benchmark. An error between the FG based SOC and the Coulomb counting based SOC could imply one or more of the following issues with the FG under validation:

The model employed in an open circuit voltage state of charge (OCV-SOC) characterization could be insufficiently accurate (assuming that the FG employs an OCV-SOC characterization)

A battery capacity estimate by the FG might be inaccurate

There might be issues with a dynamic equivalent circuit model: model selection and parameter estimation scheme used in the FG.

A second exemplary metric is OCV-SOC error. OCV-SOC characterization of the battery (which can be performed using one or more methods and/or apparatus) can provide a look-up procedure for finding the SOC. Hence, the SOC estimate of a fuel gauge at a given time can be compared for errors with the OCV-SOC characterization by bringing a battery to a fully (or at least a partial) rested state and by measuring its voltage. An OCV-SOC error can be an indicator of one or more of the following issues of a fuel gauge:

A dynamic model employed in the battery equivalent model may not be effective

Minimal OCV-SOC error can indicate that the dynamic model employed matches very well the actual dynamic nature of the battery.

A third exemplary metric is predicted time-to-voltage (TTV) error. A fuel gauge can predict (using one or more methods and/or apparatus) the time it takes to reach a certain voltage (TTV) given a constant load/charge current. Time to shut down (TTS) and time to full (TTF) can be special cases of the TTV estimates. Error in the TTV estimate can be computed after the actual voltage in question is reached. This TTV error can indicate one or more of the following about the fuel gauge under evaluation:

Accuracy of the battery impedance estimation,

Battery capacity estimation accuracy of a fuel gauge,

The fuel gauge's knowledge (e.g., information) of the battery SOC,

Accuracy of the OCV-SOC characterization.

A battery can exhibit different qualities in response to changes in temperatures. For example, a battery's impedance can be higher (and hence the available power can be lower) at cold temperatures. The rate of change of OCV can be greater and heavily non-linear in response to load and at lower SOC compared to the same at higher SOC levels. A good fuel gauge can have the ability to perform well over a wide range of temperatures and SOC levels. The benchmark described herein can be configured to ensure at least some of these elements are factored in during the performance evaluation.

Figure 14:
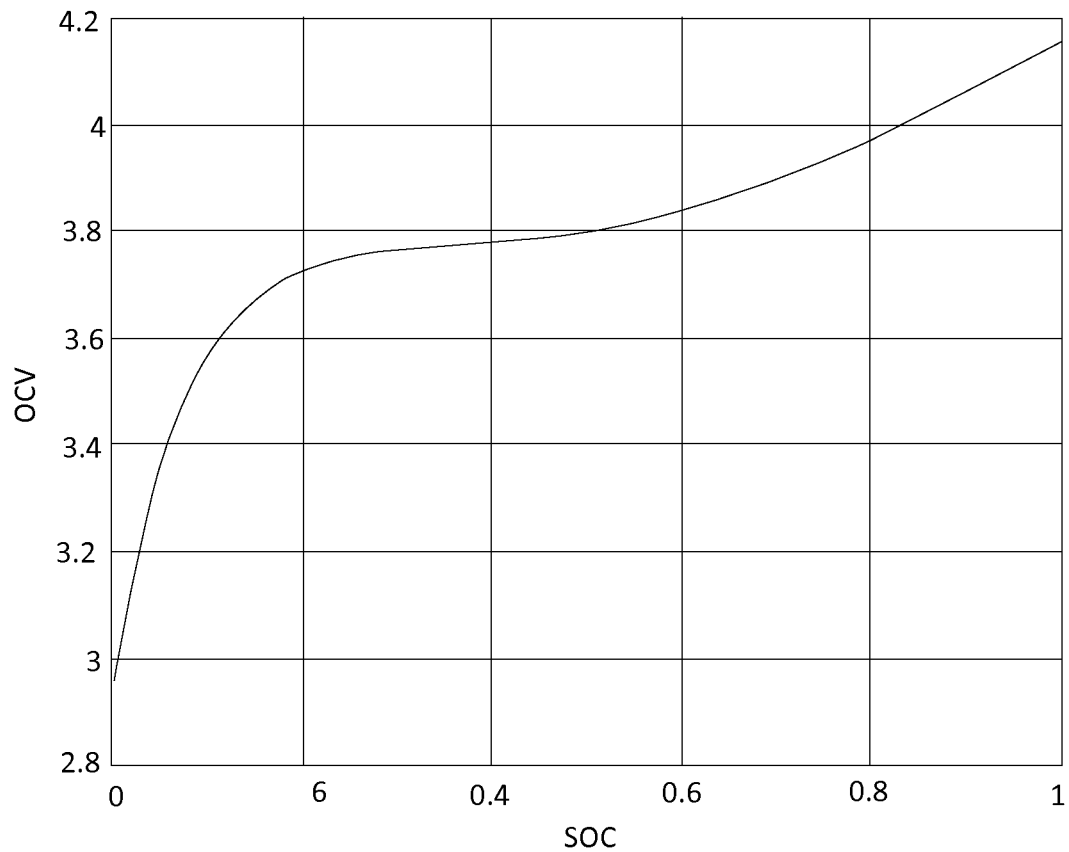
FIG. 14 is a diagram that illustrates OCV-SOC characterization curve of a portable Li-ion battery cell.

The discussion below relates to OCV-SOC characterization based metrics. The state of charge of a battery can be uniquely related to its open circuit voltage (OCV). An example of such relationship is shown as a plot in FIG. 14.

Several approaches can be used to obtain OCV characterization data. An example approach is summarized below:
1) Start with a fully charged, fully rested battery
2) Record its open circuit voltage $V_{BAT}=Vf_{full}$
3) Set i=1
4) Record OCV(i)=$V_{BAT}$
   Record SOC(i)=1
5) Set i=i+1
6) Discharge the battery using constant current I for a duration of $\Delta T$
7) Leave the battery to sufficiently rest (e.g., at least for 2 hours)
8) Measure the battery terminal voltage, $V_{BAT}$
9) Record OCV(i)=$V_{BAT}$
   Compute SOC(i)=SOC(i−1)+$c_h$I(i) $\Delta T$ where $c_h$I=$\eta$/(3600 $C_{batt}$), $\eta$ is a constant indicating the charging/discharging efficiency, $C_{batt}$ is the battery capacity in Ampere hours (Ah) and I(i) is the current into the battery.

10) Repeat steps 5 to 9 until OCV(i) reaches the shut down voltage VSD of the battery.

Now, using the {OCV(i); SOC(i)} pairs, an OCV characterization can be obtained for SOC∈[0; 1].

Remarks:

1) OCV-SOC characterization can vary from one temperature to another. (several approaches can be used to compute OCV characterization at any temperature within a certain usage range).

2) In some implementations, battery capacity $C_{batt}$ can be obtained from manufacturer data sheets or it can be estimated.

3) OCV-SOC characterization can be unchanged regardless of the age of the battery.

5) Using the above OCV-SOC characterization, the OCV of a battery for a given SOC s, written as v=OCV(s), can be computed.

5) Using the above OCV-SOC characterization, the SOC of a battery for a given rested terminal voltage $v_r$, written as s=OCV$^{-1}$($v_r$), can be computed. Given that the SOC estimate of a certain fuel gauging algorithm at time k is reported as sFG[k], the corresponding error can be computed as $$\epsilon OCV = sFG[k] - OCV^{-1}(v_r[k]) \qquad (217)$$

where $v_r$[k] is the terminal voltage (after resting the battery) at time k.

OCV-SOC characterization based validation can be used to compute the OCV errors (217) across temperatures and/or SOC regions.

Validation in a relatively high SOC region can be performed by starting with a fully charged battery and applying a time-varying load for a time sufficient to consume (approximately) less than ½ the capacity of the battery under test. Similarly, validation in the low SOC region can be performed by starting with either a fully charged battery or the battery after the high SOC validation and by applying dynamic load sufficient to bring the battery to the lower SOC region.

The average OCV-SOC error (in %) can be computed as $$\bar{\epsilon}_{OCV} = \left[\frac{1}{8}\sum_{i=1}^{4}\epsilon_{OCV}(s_L, T_i) + \epsilon_{OCV}(s_H, T_i)\right]100 \qquad (218)$$

where $\epsilon OCV(s_L, T_i)$ indicates the error computed at the low SOC region and at temperature $T_i$. In some implementations, the lower $\bar{\epsilon}OCV$ the better the FG algorithm.

The following discussion relates to relative coulomb counting error based metrics. Battery SOC can be computed by the Coulomb counting (CC) as follows $$\hat{s}_{CC}[k] = \hat{s}_{CC}[k-1] + c_b\int_{tk-1}^{tk} I[t]dt \qquad (219)$$

under the assumption that the battery capacity $C_{batt}$ and an accurate enough starting SOC, $\hat{s}_{CC}[0]$, are known. Hence, the FG error (in %) related to Coulomb counting can be defined as:

$$\bar{\epsilon}_{CC} = \frac{\sqrt{\sum_{k=1}^{T}(\hat{s}_{CC}[k] - \hat{s}_{FG}[k])^2}}{T}100 \qquad (220)$$

where T is the duration (in seconds) in which the validation test is performed.

1) In some implementations, some of fuel gauging apparatus and/or methods can include Coulomb counting as a component. However, the above metric can still be considered a validation tool due to the assumption that the knowledge of the battery capacity as well as the starting SOC of the validation $\hat{s}_{CC}[0]$ whereas the FG approach, may not assume this knowledge.

2) The battery capacity for the validation $\hat{s}_{CC}[k]$ can be pre-estimated by completely discharging the battery from full (or substantially full) to empty (or substantially empty). Alternatively, the validation test can be performed from full (or substantially full) to empty (substantially empty) and $\hat{s}_{CC}[k]$ can be updated with the newly estimated battery capacity, $C_{batt}$. In some implementations, hysteresis and relaxation factors can be considered in accurate battery capacity estimation this way. In some implementations, the FG algorithm can be barred from doing so.

3) In some implementations, the temperature of the battery being evaluated can remain constant during the entire (e.g., substantially the entire) validation process.

The following discussion relates to time-to-voltage (TTV) based metrics. Given an SOC estimate of a fuel gauge algorithm at time k as $S_{FG}[k]$, the time it takes to reach voltage v can be written as follows $$T_{FG,v} = \frac{[OCV^{-1}(v) - s_{FG}[k]]}{I} \qquad (221)$$

where the current I (I>0 during charging and I<0 during discharging) is kept constant (or substantially constant) until the voltage v is reached.

The actual time at which the terminal voltage v is reached can be noted once that voltage is reached during operation. When the voltage v is reached at time, the following TTV validation metric can be computed $$\epsilon_{TTV} = \frac{1}{T-k}\sqrt{\sum_{i=k}^{T}\left(\frac{T_{FG,v}[i] - T_v[i]}{T_v[i]}\right)^2} \qquad (222)$$

where $T_v[i] = T - i$ is the actual time it took from time i to reach the voltage v. The $\epsilon$TTV value can be in minutes. In some implementations, the following metric (in %) can be calculated:

$$\bar{\epsilon}_{TTV} = \frac{\epsilon_{TTV}}{T}100 \qquad (223)$$

A combined metric can be defined as:

$$\bar{\epsilon}_{FG} = \frac{\bar{\epsilon}_{OCV} + \bar{\epsilon}_{CC} + \bar{\epsilon}_{TTV}}{3} \qquad (224)$$

where $\bar{\epsilon}_{FG}$ is in %. In some implementations, the lower, the better the fuel gauge.

In some implementations, a benchmarking procedure can include loading a battery under evaluation with one or more different current loads that reflect a usage (e.g., a typical usage) of the battery and recording the fuel gauge reported SOC and TTV readings. This process can include repeating these steps at different temperatures until, for example, tables I, II and III are populated.

In some implementations, simulated as well as actual load profiles can be used during the validation. An advantage of the simulated load profiles is that an amount (e.g., exact amount) of Coulombs taken from the battery can be computed, hence, one or more errors due to sampling and current sensing can be avoided. This can be based on the assumption that the load simulation device may not introduce one or more significant errors. Various actual and simulated load profiles can be created.

Actual load profile: An actual load profile (e.g., shown in FIGS. 15A and 15B) can be created using, for example, a smartphone as a load. The following activities can be performed while the load is connected to a battery under validation: phone call (15 min), web surfing, reading email, game playing, etc. (20 min), texting (10 messages), listening to music or watching video using speaker phone (30 min video), standby—cell radio enabled pinging tower (1 hours).

Figure 15A:
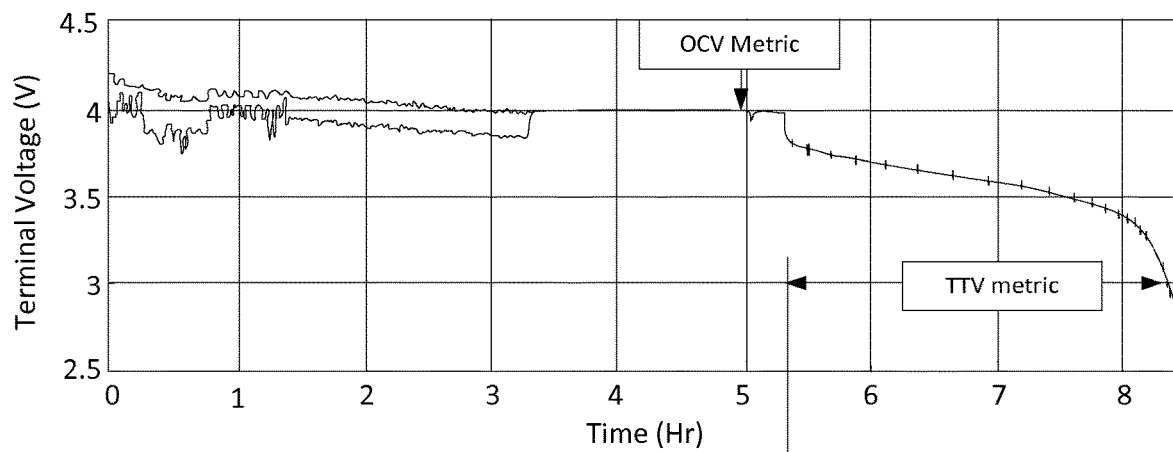
FIGS. 15A and 15B are graphs that illustrate a load profile.
Figure 15B:
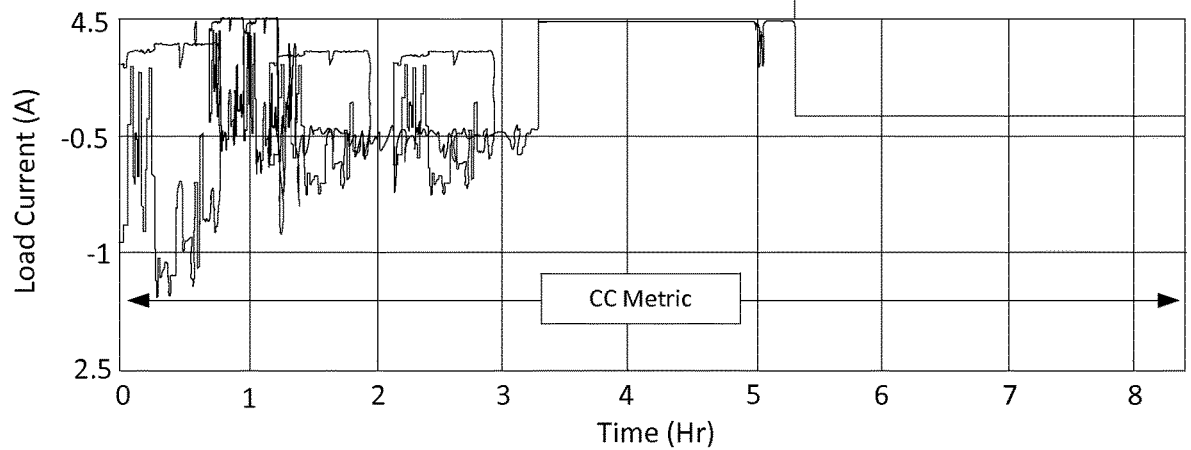

The load profile shown in FIGS. 15A and 15B illustrates a scenario where one entry for each of the three types of metrics can be computed in a single experiment. The experiment starts with a fully charged battery and the dynamic usage load is applied for about three hours and 15 minutes. After that the battery is relaxed for two hours. The five hour mark provides an opportunity to compute an OCV-SOC error metric $\epsilon_{OCV}(S_H, T_i)$. The constant current load towards the end of the experiment allows to compute $\epsilon_{TTV}(S_L, T_i)$. The Coulomb counting metric $\epsilon_{CC}(T_i)$ can be computed from the entire data.

The load profile shown in FIGS. 15A and 15B can be used to compute the following metrics at temperature $T_i$:

The OCV-OSC error metric at the high SOC region, $\epsilon_{OCV}(S_H, T_i)$

The TTC metric at the low SOC region, $\epsilon_{TTV}(S_L, T_i)$

The Coulomb counting metric $\epsilon_{CC}(T_i)$

Simulated load profile: A simulated load profile can be created using piecewise constant current loads of varying magnitudes I, for small duration Δs. These piecewise loads can be mixed and stitched together to obtain a simulated load profile shown in FIGS. 16A and 16B. Note that the simulated load can appear between approximately 3.5 hours to 6.5 hours of the test. This load profile can be simulated using, for example, a Kikusui programmable load device with Δs=2 sec, and $I_m=\{40, 120, 130, 160, 300, 400, 440, 520, 600, 640, 800, 880\}$ in mA.

Figure 16A:
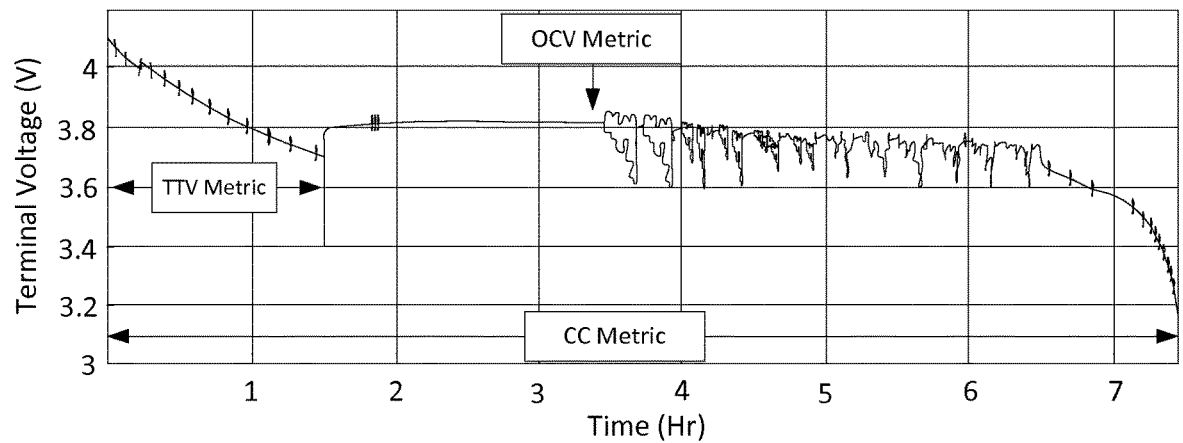
FIGS. 16A and 16B are graphs that illustrate a simulated load profile.
Figure 16B:
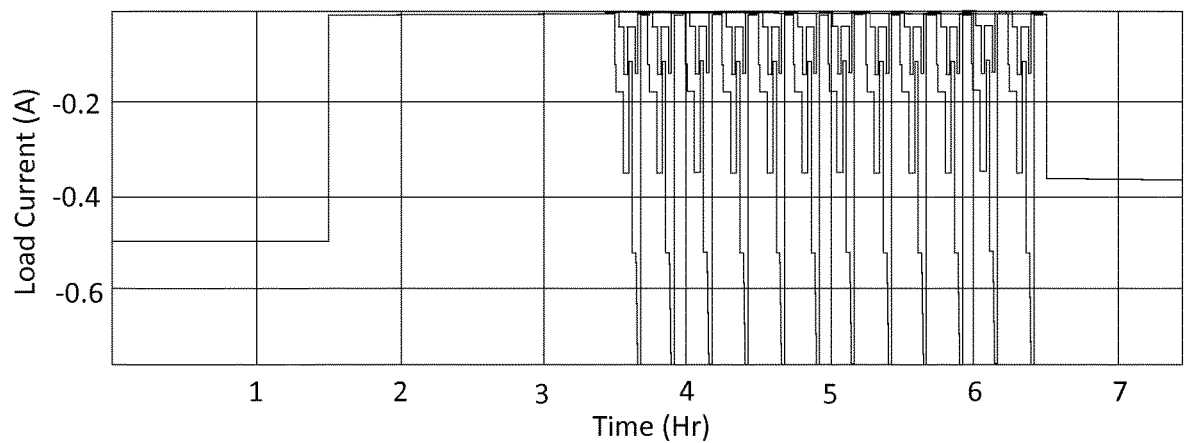

The simulated load profile shown in FIGS. 16A and 16B illustrates a scenario where one entry for each of the three types of metrics can be computed in a single experiment. The experiment starts with a fully charged battery and a constant 500 mA load is applied for about 1.5 hours. After that the battery is relaxed for two hours and then the dynamic load profile is applied for three hours. The three hour and 15 minute mark provides an opportunity to compute an OCV-SOC error metric $\epsilon_{OCV}(S_H, T_j)$. The constant current load towards the end of the experiment allows to compute $\epsilon_{TTV}(S_L, T_j)$. The Coulomb counting metric $E_{CC}(T_j)$ can be computed from the entire data.

In some implementations, the simulated load profile shown in FIG. 16 can be used to compute the following metrics at temperature $T_j$:

The OCV-OSC error metric at die high SOC region, $\epsilon_{OCV}(S_H, T_j)$

The TTC metric at the low SOC region, compute $\epsilon_{TTV}(S_L, T_j)$

The Coulomb counting metric $E_{CC}(T_j)$

The example implementations described above describe SOC tracking as applicable to battery powered devices (e.g., portable mobile devices). The described example embodiments enable linear methods that are computationally inexpensive and performance wise superior to existing approaches for online model identification. Weighted least squares methods are described for parameter estimation. Weights (based on variances) in the LS method of parameter estimation and demonstrated significant improvement in parameter estimation are described. The applicability to different modes of operation of the battery including identifying four different equivalent models of the battery that represent typical battery operation modes and developed the framework for seamless SOC tracking. The described approach models hysteresis as an error in the open circuit voltage (OCV), thereby obviating the need for modeling hysteresis as a function of SOC and load current. This method also helps in the fast recovery from wrong SOC initialization.

The example implementations described above describe features for battery capacity estimation towards the advancement of battery fuel gauging. A weighted recursive least squares (RLS) estimate of capacity with the derivation of exact weights. Formulation of the weights may be computed based on the SOC tracking error covariance and current measurement error standard deviation. A TLS approach is described for real time tracking of battery capacity. The TLS estimate is derived in closed form and can be used for adaptive estimation by updating the covariance matrix with a fading memory. A technique for adaptive capacity estimation based on OCV lookup of a rested battery. The source of OCV lookup error (hysteresis) in the derivations is considered and an approach for adaptive estimation of capacity through OCV lookup is described. An approach for optimal fusion of capacity estimates obtained through different approaches is described based on the capacity estimates and the estimation error covariance's, the proposed approach uses a Kalman filter for adaptive, optimal fusion.

The example implementations described above describe SOC tracking as applicable to battery powered devices (e.g., portable mobile devices). The conventional techniques for estimating additional, redundant parameters by stacking them on the state vector along with SOC is computationally expensive and performance wise inferior. In order to avoid these issues, example embodiments describe a reduced order filtering model for SOC tracking through a new state space model. A state-space model with de-correlated noise models is described. The SOC tracking problem involves two measured quantities, voltage and current, and that this results in correlation between the state and measurement noise models of the SOC tracking problem. A modified state-space representation that has uncorrelated state and measurement noise processes is described. Example embodiments describe different modes of operation of the battery and identify, at least, four different equivalent models of the battery that represent typical battery operation modes and developed the framework for seamless SOC tracking. Example embodiments describe an approach that models hysteresis as an error in the open circuit voltage (OCV), hence obviating the need for modeling hysteresis as a function of SOC and load current. This method also helps in the fast recovery from wrong SOC initialization.

The example implementations described above describe SOC tracking as being achieved through several strategies. First, via minimal battery modeling. The proposed approach requires offline modeling of only the open circuit voltage (OCV) characteristics of the battery. All the other required parameters are estimated through robust means. Equipped with a single set of OCV parameters, the proposed approach is able to perform SOC tracking at any temperature without requiring any additional parameters. Second, the voltage drop observation model. The voltage drop model of observations allows online SOC tracking without the need to worry about modeling the hysteresis component of the battery. This results in better accuracy and robustness from the proposed approach. Third, through robust parameter estimation. The effect of correlated noise structure in the least squares model for parameter estimation is identified. This resulted in significantly better accuracy and enhanced robustness for the parameter estimation algorithm. Fourth, through battery capacity estimation. The proposed total least square (TLS) method for capacity estimation ensures superior accuracy for capacity estimation. And finally using filtering, the reduced order EKF method is accounting for the correlation of the noise process in the state-space model (derived for SOC tracking) and applies appropriate de-correlating filter in order to minimize errors in SOC tracking.

In the detailed description, a benchmarking approach for battery fuel gauging algorithms based on at least three evaluation metrics has been described. The first evaluation metric can be based on the open circuit voltage (OCV) characterization of the battery. The second evaluation metric can be based on relative Coulomb counting error of the fuel gauge and the third benchmark can be based on the computation of time it takes the battery to reach a certain voltage. Each validation metric can include computing several metrics at various SOC levels, different temperature, voltage regions, and/or so forth.

Some SOC tracking approaches include at least the following shortcomings: (1) some models consider resistance-only and are unsuitable for dynamic loads; (2) they employ nonlinear approaches for system identification; (3) require initial parameter estimates for model identification methods; (4) a single dynamic equivalent model is assumed to represent all battery modes of operation; (5) the importance of online capacity estimation is not addressed; (6) existing online battery capacity estimation techniques are affected by SOC and parameter estimation errors, i.e., they are not robust; (7) they employ online tracking of many redundant quantities in addition to SOC (which results in increased computational complexity and reduced SOC tracking accuracy); (8) they require separate modeling of battery hysteresis, which is a function of SOC and load current (hence infinite models.) It is only possible to model hysteresis approximately; (9) none of the existing approaches recognized the existence of correlation in the process and measurement noise processes; and (10) none of the existing approaches recognize the change in battery characteristics due to temperature, aging, SOC and load variations and the fact that a single equivalent model may not fit all these conditions.

Accordingly, the implementations described herein can have a short design time (within days), can have a relatively fast algorithm convergence, and can have an accuracy of approximately 1% SOC and battery capacity reporting accuracy in "Real World" use conditions. In some implementations, no (or few) custom battery models or data may be required, and can include an adaptive learning algorithm with relatively quick SOC tracking convergence. Some implementations can include automatic temperature, age, and load compensation.

Some implementations can be based on, for example, a reduced order extended Kalman filter, a correlated measurement noise decoupling, an online electrical model parameter estimation, and a real-time capacity estimation.

The reduced order Kalman filter can include an accurate SOC estimation (tracking) that involves jointly estimating four different parameters: SOC, currents through two different resistors in the dynamic equivalent model and hysteresis, all of which change when the battery is under load/charge. This involves complex matrix operations generally known as recursive filtering. The reduced filtering approach simplifies this in a way that only the SOC is estimated through the recursive filtering procedure. The three other parameters are marginalized through mathematical operation. The resulting SOC tracking algorithm(s) is now computationally feasible in a fuel gauge SOC.

The correlated measurement noise decoupling can include Kalman filters that operate on the assumption that process noise and measurement noise are uncorrelated. In the fuel gauge application, the measurement noise inherent in the current measurement can be coupled into both the measurement noise and the process noise of the SOC and Voltage variables in the reduced EKF. A unique approach has been employed which decouples the current sense noise from the process noise of the Kalman filter.

The online electrical model parameter estimation can include dynamic estimation of the model parameters (coefficients). The dynamic estimation of the model parameters (coefficients) can include estimation as they change with SOC, time-varying current load profiles, temperature, charge-discharge cycles, and/or so forth. The EKF filter is applicable provided that the model parameters of the dynamic equivalent circuit of the battery is known, however, the equivalent circuit represents the internal components of the battery; these model parameters can be estimated as well using the measurements available from the battery: voltage and current. The solutions described herein estimate the model parameters in real time which enables use of a Kalman filter approach.

The real-time or on-line capacity estimation can include one or more algorithms updating (e.g., constantly updating) usable capacity based on actual use conditions, load, temp, age. Some implementations can include a coulomb counting method which compares FG reported to SOC to calculated SOC based on coulomb counting (book keeping method). Some implementations can include a TTE (Time to Empty) Method, which can use FG to predict TTE and compared to actual. Some implementations can include a SOC/OCV Curve Look-up Method, which can compare FG reported SOC to SOC/OCV curve.

In some implementations, a variation of batteries can be supported that have a variety of specific battery models and chemistries, battery manufacturer aging data for each battery, and/or so forth. In some implementations, the fuel gauge evaluation procedure can vary. For example, a state of charge accuracy evaluation method and test procedure, a dynamic load detailed test requirements, and/or so forth can vary. In some implementations, feedback on requirement specification such as key system parameter and accuracy requirements, system integration requirements, and/or so forth can be varied. In some implementations, operating system driver requirements can be varied.

Figure 17:
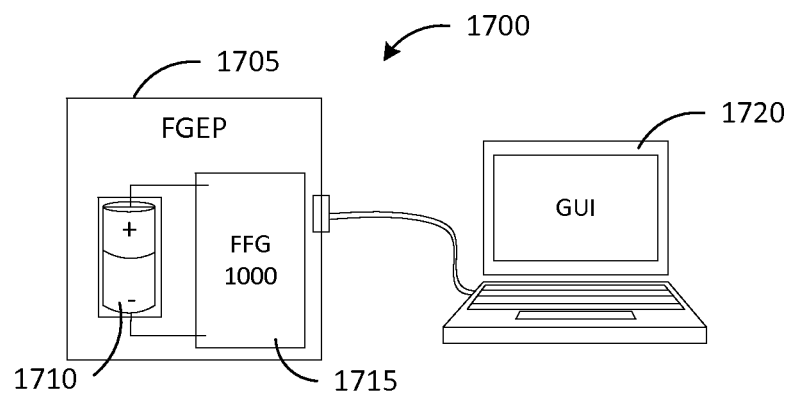
FIG. 17 is a diagram that illustrates an example system implementation.

FIG. 17 is a diagram that illustrates an example system implementation. The system 1700 includes a fuel gauge evaluation module 1705, a battery 1710, a battery fuel gauge 1715 and a computing device 1715. The fuel gauge evaluation module 1705 may be implemented as a software module or an ASIC within the BMS 110. In other words, fuel gauge evaluation module 1705 could be code stored in memory 230 and executed by processor 235 and/or another module associated with BMS 110. The computing device 1715 may receive information from the fuel gauge evaluation module 1705 and display the information on a graphical user interface (e.g., as shown in FIG. 18).

Figure 18:
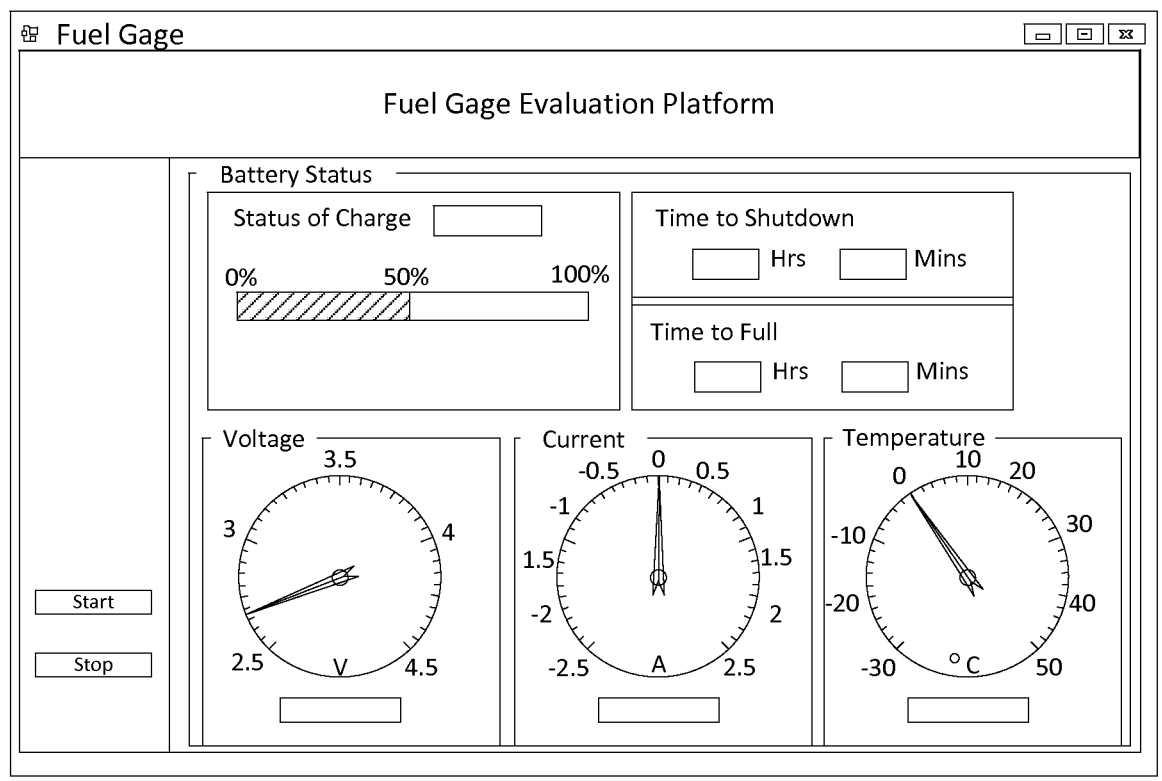
FIG. 18 is a diagram that illustrates a user interface that can be used in conjunction with a system implementation.
Figure 19A:
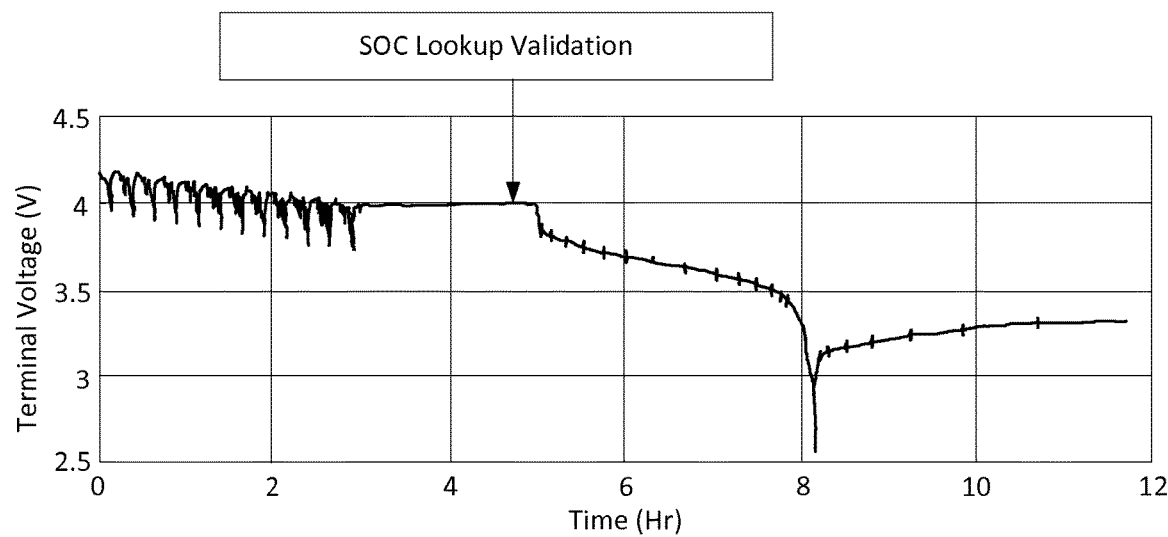
FIGS. 19A and 19B include graphs that illustrate an example discharge voltage/current profile.
Figure 19B:
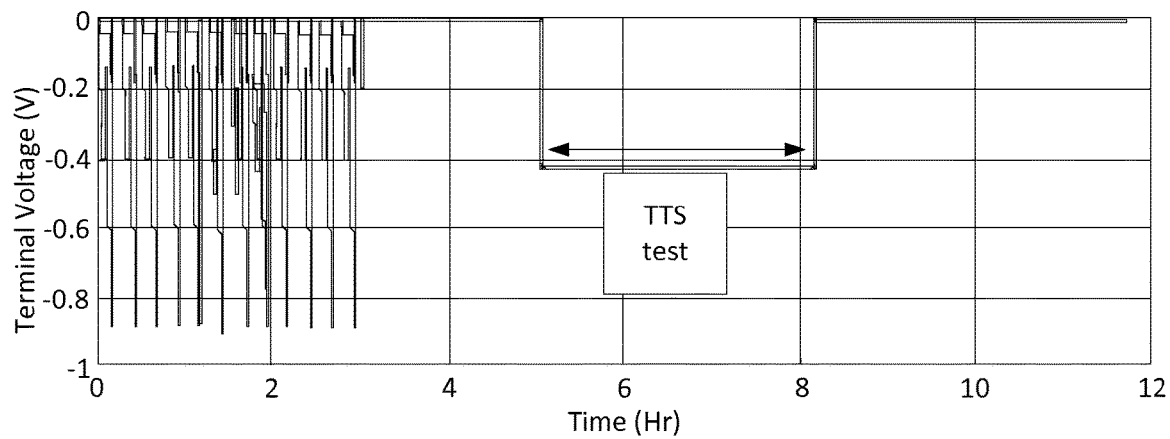
Figure 20A:
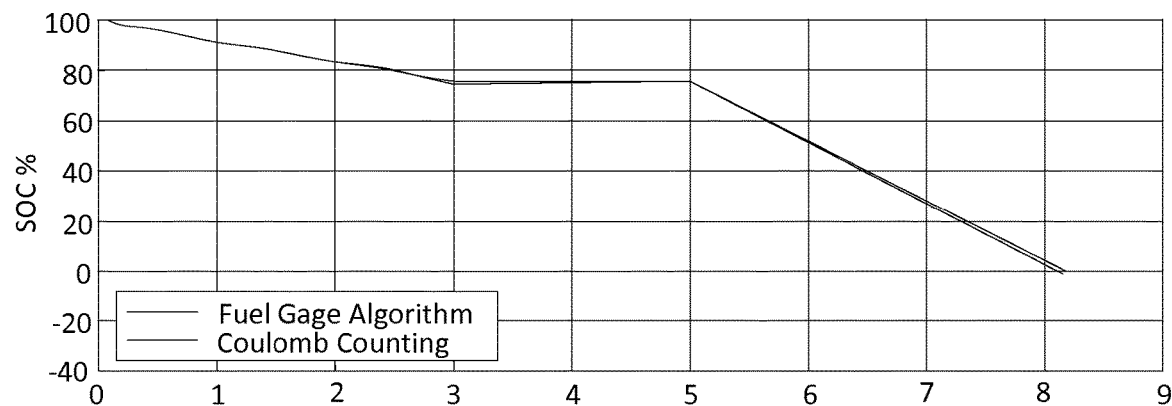
FIGS. 20A and 20B are graphs that illustrate an example Coulomb Counting evaluation method.
Figure 20B:
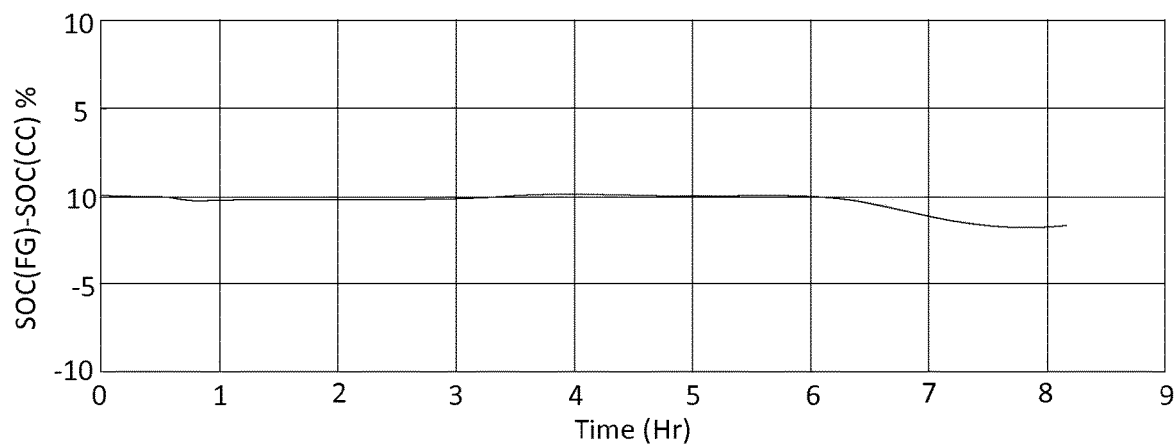
Figure 21A:
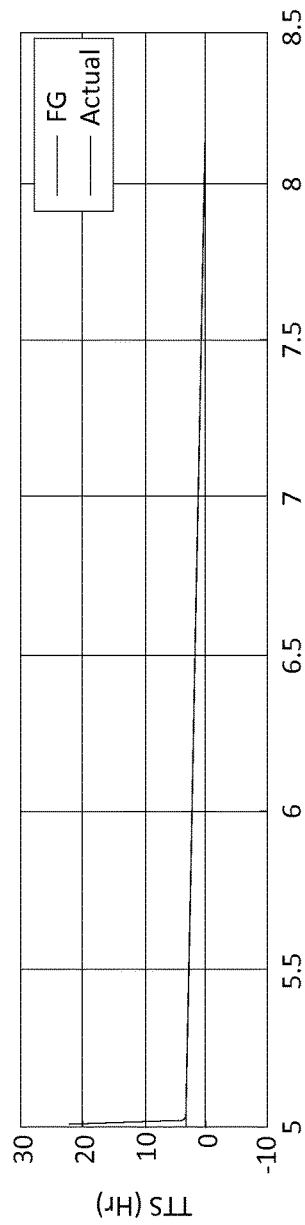
FIGS. 21A and 21B are diagrams that illustrate a time to shutdown (TTS) evaluation method.
Figure 21B:
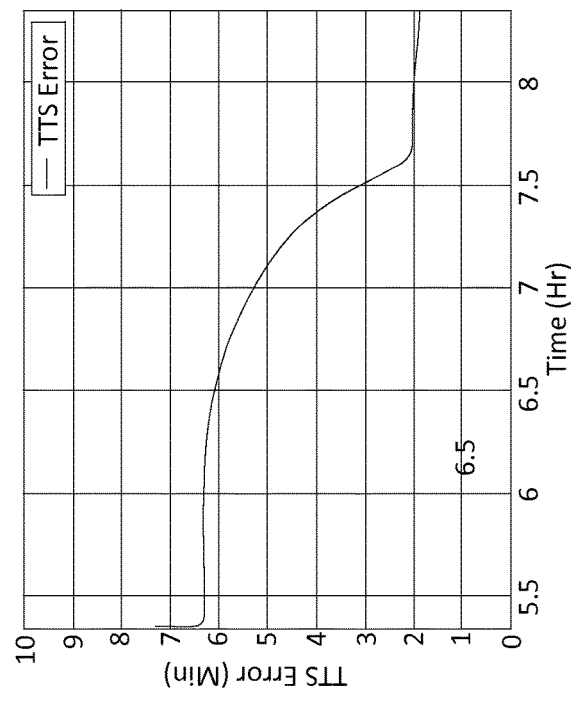

FIG. 18 is a diagram that illustrates a user interface that can be used in conjunction with a system implementation. FIGS. 19A and 19B include graphs that illustrate an example discharge voltage/current profile to illustrate an SOC Lookup Validation and a TTS test. FIGS. 20A and 20B are graphs that illustrate an example CC evaluation method to illustrate the closeness of the Fuel Gage Algorithm to Coulomb Counting. FIGS. 21A and 21B are diagrams that illustrate a TTS evaluation method which illustrates a significant overlap of the Fuel Gauge and actual SOC as well as a TTS error.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods described above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device (computer-readable medium, a non-transitory computer-readable storage medium, a tangible computer-readable storage medium) or in a propagated signal, for processing by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment.

Portions of the above example embodiments and corresponding detailed description are presented in terms of software, or algorithms and symbolic representations of operation on data bits within a computer memory. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of non-transitory program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium. The example embodiments not limited by these aspects of any given implementation.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method of improving calculation efficiency for a battery fuel gauge, the method comprising:
   storing, by controlling circuitry of the battery fuel gauge in a memory of the battery fuel gauge, a library of equivalent circuit models representing a battery;
   determining a first operational mode of the battery based on a voltage across the battery at a first time;
   determining a second operational mode of the battery based on the voltage at a second time;
   defining, by the controlling circuitry, a first equivalent circuit model of the library of equivalent circuit models based on the first operational mode;
   defining a second equivalent circuit model of the library of equivalent circuit models based on the second operational mode; and
   calculating a state of charge of charge (SOC) of the battery using the first equivalent circuit model and the SOC using the second equivalent circuit model,
   the determining the first operational mode of the battery including determining an operational mode identifier, and
   the defining the first equivalent circuit model based on the first operational mode including searching the library of equivalent circuit models using the operational mode identifier.

2. The method of claim 1, wherein the first operational mode is based on a high voltage load drawing variable current, the first operational mode includes a corresponding equivalent circuit model including a first resistance-current (RC) circuit and a second RC circuit.

3. The method of claim 1, wherein
   the first operational mode is based on a variable voltage load,
   the first operational mode includes a corresponding equivalent circuit model including a resistance-current (RC) circuit.

4. The method of claim 1, wherein
   the first operational mode is based on a variable voltage load,
   the first operational mode includes a corresponding equivalent circuit model including a resistor and a bias component.

5. The method of claim 1, wherein
   the first operational mode is based on a low voltage load,
   the first operational mode includes a corresponding equivalent circuit including a resistor.

6. The method of claim 1, wherein
   at least one of the equivalent circuit models includes a hysteresis component, and
   the hysteresis component is modeled as a open circuit voltage (OCV) calculation error.

7. The method of claim 1, further comprising:
   measuring a terminal voltage of an equivalent battery during a discharge of the equivalent battery;
   determining a linear equation based on the measured terminal voltage; and
   calculating at least one parameter using a weighted least squared algorithm based on the linear equation, the calculating of the SOC of the battery is based on the at least one parameter.

8. The method of claim 1, further comprising:
   benchmarking the SOC based on at least one of a coulomb counting error metric, an OCV-SOC error metric and a predicted time-to-voltage (TTV) error metric.

9. A system configured to improve calculation efficiency for a battery fuel gauge, the system comprising:
   a data store of the battery fuel gauge configured to store a library of equivalent circuit models representing a battery;
   a model selection module of the battery fuel gauge configured to produce a first equivalent circuit model based on a first operational mode of the battery and a second equivalent circuit model based on a second operational mode of the battery,
   the first operational mode being determined based on a voltage across the battery at a first time, the second operational mode being determined based on the voltage across the battery at a second time; and
   a filter module of the battery fuel gauge configured to calculate an estimated state of charge (SOC) of the battery based on the first equivalent circuit model and the SOC using the second equivalent circuit model,
   wherein, in the first operational mode of the battery, the battery receives a variable current and, in the second operational mode of the battery, the battery receives a constant current.

10. The system of claim 9, further comprising:
    an operational mode module configured to determine at least the first operational mode of the battery based on at least one of a current associated with the battery and a voltage associated with the battery.

11. The system of claim 9, wherein
    the first operational mode is based on a high voltage load drawing variable current,
    the first operational mode includes a corresponding equivalent circuit model including a first resistance-current (RC) circuit and a second RC circuit.

12. The system of claim 9, wherein
    the first operational mode is based on a variable voltage load, the first operational mode includes a corresponding equivalent circuit model including a resistance-current (RC) circuit.

13. The system of claim 9, wherein
    the first operational mode is based on a variable voltage load,
    the first operational mode includes a corresponding equivalent circuit model including a resistor and a bias component.

14. The system of claim 9, wherein
the first operational mode is based on a low voltage load,
the first operational mode includes a corresponding equivalent circuit including a resistor.

15. The system of claim 9, wherein
at least one of the equivalent circuit models includes a hysteresis component, and
the hysteresis component is modeled as an open circuit voltage (OCV) calculation error.

16. The system of claim 9, further comprising:
a model estimation module configured to calculate at least one voltage drop model parameter based on the selected equivalent model representing the battery, wherein the estimated SOC is calculated based on the at least one voltage drop model parameter.

17. The system of claim 9, further comprising a display configured to display the estimated SOC.

18. A non-transitory computer readable medium including code segments for improving calculation efficiency for a battery fuel gauge that, when executed by a processor of the battery fuel gauge, cause the processor to:
produce a first equivalent circuit model and a second equivalent circuit model from a library of equivalent circuit models stored in a memory of the battery fuel gauge, the first equivalent circuit model representing a battery based on a first operational mode of the battery and the second equivalent model representing the battery based on a second operational mode of the battery,
the first operational mode being determined based on a voltage across the battery at a first time and the second operational mode being determined based on the voltage across the battery at a second time; and
calculate a state of charge of charge (SOC) of the battery using the first equivalent circuit model and the SOC of the battery using the second equivalent circuit model,
the producing the first equivalent model includes searching the library of equivalent circuit models using an operational mode name.

19. The computer readable medium of claim 18, further including code segments that cause the processor to:
calculate at least one voltage drop model parameter based on the first equivalent model, wherein the SOC is calculated based on the at least one voltage drop model parameter.

20. The computer readable medium of claim 18, wherein at least one of the equivalent circuit models includes a hysteresis component, the code segments further cause the processor to:
calculate at least one voltage drop model parameter based on the first equivalent model; and
vary the at least one voltage drop model parameter to reduce an open circuit voltage (OCV) error indicating hysteresis.

21. A method of improving calculation efficiency for a battery fuel gauge, the method comprising:
storing, in a memory of the battery fuel gauge, a library of equivalent circuit models representing a battery;
determining an operational mode of the battery based on a load associated with the battery;
selecting one of the equivalent circuit models based on the determined operational mode; and
calculating a state of charge of charge (SOC) of the battery using the selected equivalent circuit model,
the determining the operational mode of the battery including determining an operational mode identification number, and
the selecting one of the equivalent circuit models based on the determined operational mode including searching the library of equivalent circuit models using the operational mode identification number.

22. The system of claim 9, wherein the battery fuel gauge is included in a battery management system, the battery management system being configured to disconnect a load on the battery based on the calculated estimated SOC.

* * * * *